(12) United States Patent
Verhaverbeke et al.

(10) Patent No.: US 7,159,599 B2
(45) Date of Patent: Jan. 9, 2007

(54) METHOD AND APPARATUS FOR PROCESSING A WAFER

(75) Inventors: Steven Verhaverbeke, San Francisco, CA (US); J Kelly Truman, Morgan Hill, CA (US); Christopher T Lane, San Jose, CA (US); Sasson R Somekh, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 429 days.

(21) Appl. No.: 10/229,446

(22) Filed: Aug. 27, 2002

(65) Prior Publication Data

US 2003/0045131 A1 Mar. 6, 2003

Related U.S. Application Data

(63) Continuation-in-part of application No. 09/945,454, filed on Aug. 31, 2001.

(51) Int. Cl.
*B08B 3/00* (2006.01)

(52) U.S. Cl. ..................................................... 134/109

(58) Field of Classification Search ................ 438/795, 438/758, 689, 782, 745, 710, 48, 3; 134/153, 134/1.3, 148, 109; 118/733; 73/865.9; 430/328; 356/237.5
See application file for complete search history.

(56) References Cited

U.S. PATENT DOCUMENTS

| | | | |
|---|---|---|---|
| 4,669,875 A * | 6/1987 | Shiba et al. ............. 356/237.3 |
| 5,368,054 A * | 11/1994 | Koretsky et al. ........... 134/153 |
| 5,672,239 A | 9/1997 | DeOrnellas |
| 5,766,360 A | 6/1998 | Sato et al. |
| 5,769,952 A * | 6/1998 | Komino ....................... 118/733 |
| 5,849,582 A * | 12/1998 | Chen et al. ................. 430/328 |
| 6,267,122 B1 * | 7/2001 | Guldi et al. .................. 134/1.3 |
| 6,460,552 B1 * | 10/2002 | Lorimer ....................... 134/148 |
| 6,467,491 B1 | 10/2002 | Sugiura |
| 6,633,132 B1 * | 10/2003 | Yoo ....................... 315/111.21 |
| 6,745,637 B1 * | 6/2004 | Tegeder et al. ............ 73/865.9 |
| 2001/0024691 A1 * | 9/2001 | Kimura et al. .............. 427/346 |

FOREIGN PATENT DOCUMENTS

| | | |
|---|---|---|
| EP | 0998170 A1 | 5/2000 |
| WO | WO 0070666 A | 11/2000 |

OTHER PUBLICATIONS

International Search Report PCT/US 02/25773.

* cited by examiner

*Primary Examiner*—Carl Whitehead, Jr.
*Assistant Examiner*—Monica D. Harrison
(74) *Attorney, Agent, or Firm*—Blakely Sokoloff Taylor & Zafman

(57) ABSTRACT

A method of a single wafer wet/dry cleaning apparatus comprising:
 a transfer chamber having a wafer handler contained therein;
 a first single wafer wet cleaning chamber directly coupled to the transfer chamber; and
 a first single wafer ashing chamber directly coupled to the transfer chamber.

41 Claims, 28 Drawing Sheets

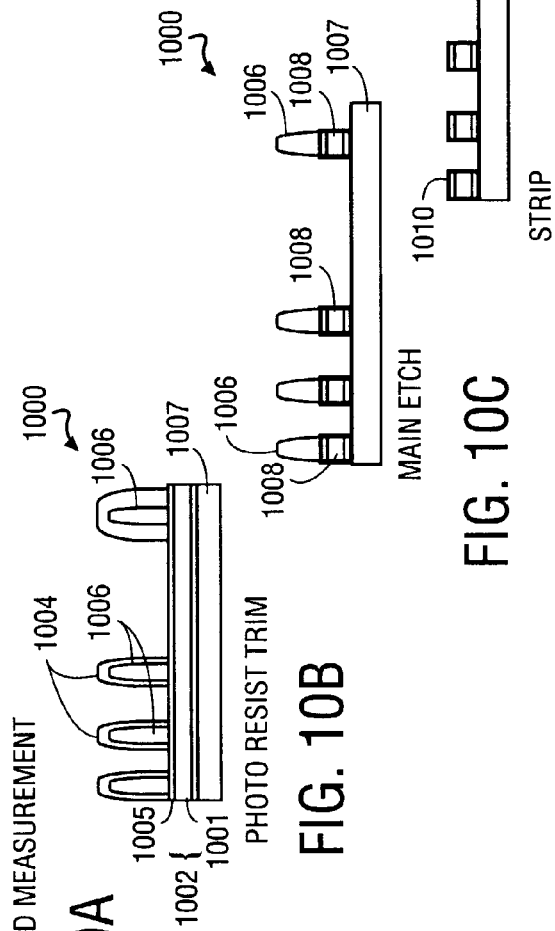

REMOTE MICROWAVE PLASMA APPARATUS 1706

METHOD AND APPARATUS FOR PROCESSING A WAFER

This is a Continuation-in-Part of prior application Ser. No. 09/945,454 having a filing date of Aug. 31, 2001.

BACKGROUND OF THE INVENTION

1. Field of the Invention

The present invention relates to the field of semiconductor processing and more specifically to a method and apparatus for atmospheric and sub-atmospheric processing of a single wafer.

2. Discussion of Related Art

In silicon wafer processing, a wafer undergoes a predetermined sequence and steps to make an electronic circuit. Some steps are carried out at an atmospheric pressure while other steps are carried out at a sub-atmospheric pressure. Typically, a wafer undergoes a process step in a process chamber. Process chambers are loaded by a robot. Either a single robot, or more than one robot, for loading a single process chamber or more than one process chambers together with process chambers is called a tool or platform. Different tools or platforms can contain different of similar process chambers. All tools together contain the necessary process chambers to complete an entire process sequence that is necessary to fabricate an electronic circuit. Wafers are transported from one tool to another tool in cassettes. In each tool a robot takes the wafers out of the cassette and loads them separately or in a batch into a process chamber or multiple process chambers of that particular tool. After processing, the robot returns the wafers to the same cassette or to a different cassette and the entire cassette is then transported to the next tool in the fab to perform the next process step.

In a number of instances, it is advantageous to combine several different process chambers in one tool. In such a tool the robot takes the wafers out of the wafer cassette and loads them into the first process chamber. After the process is finished in that process chamber, instead of returning the wafer to the cassette the robot then loads the wafer into the next process chamber to perform the next process step. After the next process step, there can be another process step and so on until the wafer has undergone all process steps that are available in that tool. After the last process step of that tool, the wafers are then finally returned to their wafer cassette and the cassette transported to the next tool in the fab. Such a tool with one or more different process chambers are presently referred to as "cluster tools".

The advantages of a cluster tool include: reduced wafer traveling distance, reduced footprint, reduced cycle time, and improved yield. The reduced wafer traveling distance, reduced footprint, and reduced cycle time are a result of the reduced handling of the wafers. The improved yield is a result of the reduced exposure of the wafer surface to the fab atmosphere. The detrimental affect of the fab atmosphere exposure during transport from one tool to another is dependent on the particular sequence of process steps. Fab atmosphere exposure can be very detrimental to electronic circuit yield between certain steps while it may not affect whatsoever the yield between certain other steps.

The clustering of different process steps in one tool also has some disadvantages. For example, if one process chamber is inoperable due to a technical failure, the entire tool may not be available and therefore technical failure in one process chamber can have detrimental affect on the availability of the other process chambers. Nevertheless, in certain occasions, the advantages outlined above of clustering different sequential process tools in one tool might be higher than the disadvantage of lower availability or reliability. Therefore, there are a number of instances where clustering of different process steps and different process chambers around one or more robots in the single tool is desirable. There are a number of examples where this has been done and where commercial success is achieved proving the benefits of such clustering. Most of the existing clustering tools have some process benefit (i.e., reduced exposure to the fab environment increases the yield).

One example of a cluster tool is a sub-atmospheric cluster tool. In such a tool different sub-atmospheric process chambers are provided around a sub-atmospheric wafer handler or robot. In this case, the clustering provides a benefit that the process chambers do not get exposed to the atmosphere and the wafers do not get exposed to the atmosphere while being transferred from one chamber to another chamber. This is especially useful in the sequence, such as titanium nitride sputtering, aluminum sputtering, titanium nitride sputtering which is generally used to form metal interconnects of an integrated circuit. Another example of a cluster tool is an atmospheric process cluster tool. For example, a chemical mechanical polishing process chamber can be clustered with a cleaning step such that the wafers are transported from the chemical polishing process to the cleaning process while the wafers are still in a wet condition. This avoids having to dry the wafers between the two steps. Drying wafers between the two steps makes it much more difficult to clean the wafers.

Thus, what is desired are novel cluster tool combinations as well as cluster tools which utilizes both atmospheric and sub-atmospheric process chambers.

SUMMARY OF THE INVENTION

A method of a single wafer wet/dry cleaning apparatus comprising:

a transfer chamber having a wafer handler contained therein;

a first single wafer wet cleaning chamber directly coupled to the transfer chamber; and a first single wafer ashing chamber directly coupled to the transfer chamber.

BRIEF DESCRIPTION OF THE DRAWINGS

FIGS. 10A–10E illustrate a method of etching conductive features, and then stripping and cleaning a wafer in accordance with an embodiment of the present invention.

DETAILED DESCRIPTION

I) Dry/Wet Processing Tool

Figure 1:
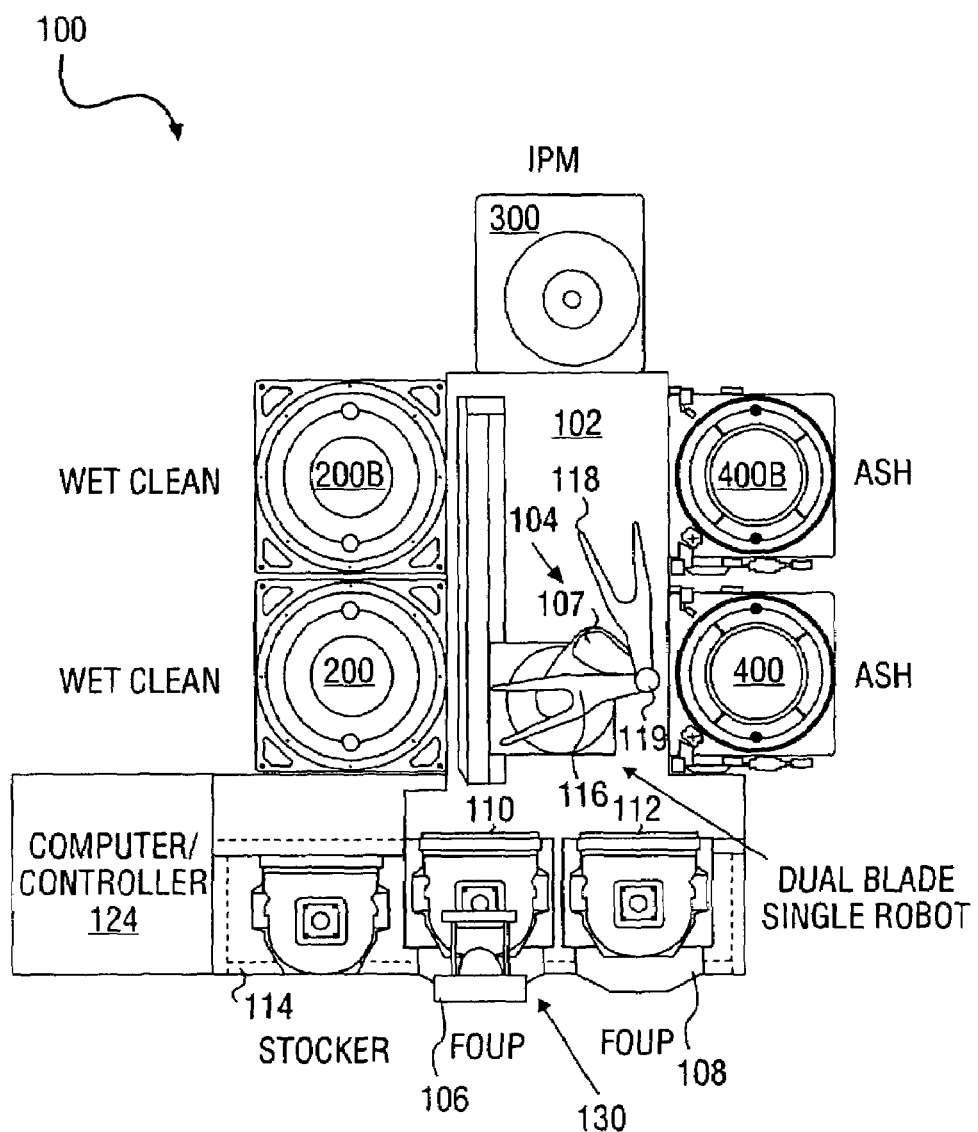
FIG. 1 is an overhead illustration of a atmospheric cluster tool having a single wafer wet cleaning module, a single wafer strip module, and a integrated process metrology tool each coupled around an atmospheric transfer chamber having a robot contained therein.

FIG. 1 illustrates an apparatus or system 100 for the stripping (ashing), wet cleaning and particle monitoring of a wafer during the manufacture of a semiconductor integrated circuit. The cleaning apparatus 100 includes a central transfer chamber 102 having a wafer handling device 104 contained therein. Directly attached to transfer chamber 102 is a single wafer wet cleaning module 200, a strip module 400, and an integrated process monitoring tool 300, such as an integrated particle monitor. Wet cleaning module 200, strip module 400, and integrated particle monitor 300 are each connected to transfer chamber 102 through a separately closable opening. In an embodiment of the present invention, a second wet cleaning module 200B and/or a second strip module 400B are also coupled to transfer chamber 102. In an embodiment of the present invention, transfer chamber 102 is maintained at substantially atmospheric pressure (i.e., atmospheric transfer chamber) during operation. In an embodiment of the present invention, the atmospheric transfer chamber 102 can be opened or exposed to the atmosphere of a semiconductor fabrication "clean room" in which it is located. In such a case, the transfer chamber 102 may contain an overhead filter, such as a hepafilter to provide a high velocity flow of clean air or an inert ambient such as $N_2$, to prevent contaminants from finding their way into the atmospheric transfer chamber. In other embodiments, the atmospheric transfer chamber 102 is a closed system and may contain its own ambient, of clean air or an inert ambient, such as nitrogen gas ($N_2$).

Transfer chamber 102 includes a wafer handling robot which can transfer a wafer from one module to another. In an embodiment of the present invention, the wafer handler is a single robot with two wafer handling blades 114 and 116 which both rotate about a single axis 119 coupled to the end of a single arm 120. Robot 104 can be said to be a dual blade single arm, single wrist robot. Robot 104 moves on a track 122 along a single axis in transfer chamber 102.

A system computer 124 is coupled to and controls each wet clean module 200, strip module 400 and integrated particle monitoring module 300 as well as the operation of transfer chamber 102 and robot 104. Computer 124 enables the feedback from one module, such as the integrated particle monitoring module, to be used to control the flow of a wafer through system 100 and/or to control the process within a different module.

Also coupled to transfer chamber 102 is at least one wafer input/output module 130 or pod for providing wafers to system 100 and for taking wafers away from system 100. In an embodiment of the present invention, the wafer input/output module 106 is a front opening unified pod (FOUP) which is a container having a slideable and sealable door and which contains a cassette of between 13–25 horizontally spaced wafers. Transfer chamber 102 contains a sealable access door 110 which slides vertically up and down to enable access into and out of transfer chamber 102. In an embodiment of the present invention, apparatus 100 includes two FOUP's, 106 and 108 one for providing wafers into system 100 and one for removing completed or processed wafers from system 100. However, a wafer can be inputted and outputted from the same FOUP, if desired. A second access door 112 is provided to accommodate a second FOUP 108. Each access door can be attached to the counter part door on each FOUP so that when the transfer chamber access door 110 and 112 slides open, it opens the door of the FOUP to provide access for the robot into the FOUP. The FOUP's can be manually inserted onto apparatus 100 or a wafer stocking system 114, such as a Stocker, having multiple FOUP's in a rail system can be used to load and remove FOUP's from apparatus 100.

A) Single Wafer Wet Cleaning Module

Figure 2A:
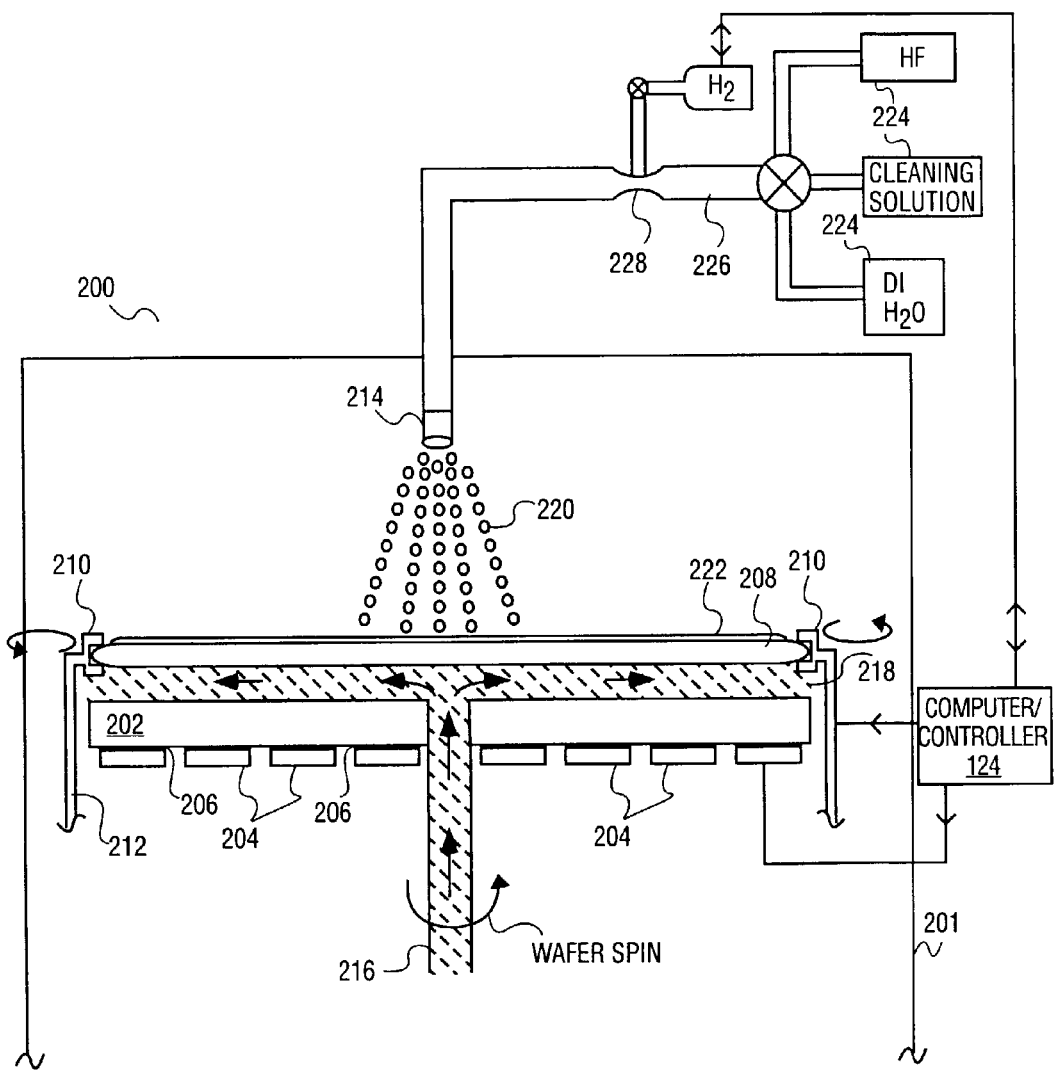
FIGS. 2A–2C is an illustration of a single wafer wet clean module in accordance with an embodiment of the present invention.
Figure 2B:
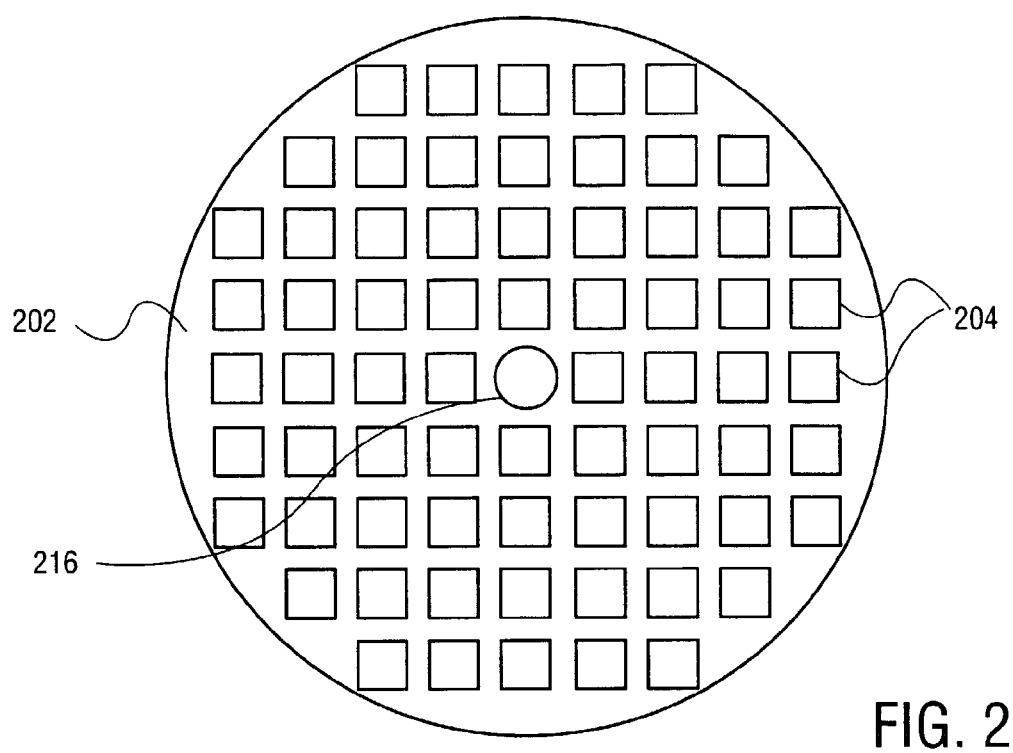
Figure 2C:
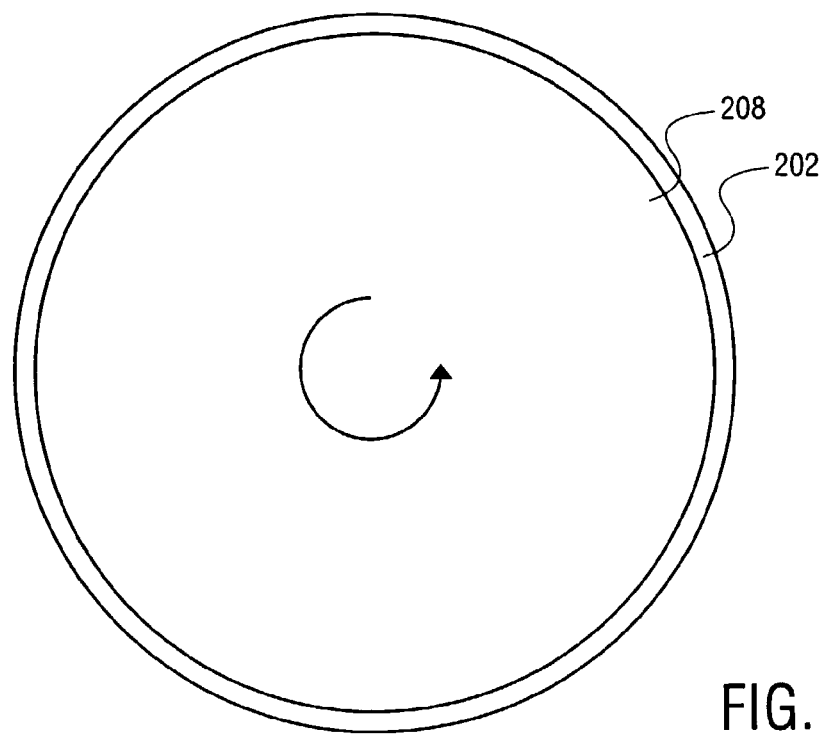

An example of a single wafer cleaning module 200 which can be used as wet cleaning module 200 and 200B (if used) is illustrated in FIGS. 2A–2C. FIGS. 2A–2C illustrate a single wafer cleaning apparatus 200 which utilizes acoustic or sonic waves to enhance a cleaning. Single wafer cleaning apparatus 200 shown in FIG. 2A includes a plate 202 with a plurality of acoustic or sonic transducers 204 located thereon. Plate 202 maybe made of aluminum but can be formed of other materials such as but not limited to stainless steel and sapphire. The plate is maybe coated with a corrosion resistant fluoropolymer such as Halar or PFA. The transducers 204 are attached to the bottom surface of plate 202 by an epoxy 206. In an embodiment of the present invention the transducers 204 cover substantially the entire bottom surface of plate 202 as shown in FIG. 2b and cover at least 80% of plate 202. The transducers 204 generate sonic waves in the frequency range e.g. between 400 kHz and 8 MHz. In an embodiment of the present invention the transducers 204 are piezoelectric devices. The transducers 204 create acoustic or sonic waves in a direction perpendicular to the surface of wafer 208.

A substrate or wafer 208 is held at distance of about 3 mm above the top surface of plate 202. The wafer 208 is clamped by a plurality of clamps 210 face up to a wafer support 212 which can rotate wafer 208 about its central axis. The wafer support can rotate or spin wafer 208 about its central axis at a rate between 0–6000 rpm. In apparatus 200 only wafer support 212 and wafer 208 are rotated during use whereas plate 202 remains in a fixed position. Additionally, in apparatus 200 wafer 208 is placed face up wherein the side of the wafer with patterns or features such as transistors faces towards a nozzle 214 for spraying cleaning chemicals or water thereon and the backside of the wafer faces plate 202. Additionally, as shown in FIG. 2C the transducer covered plate 202 has a substantially same shape as wafer 208 and covers the entire surface area of wafer 208. Apparatus 200 can include a sealable chamber 201 in which nozzle 214, wafer 208, and plate 202 are located as shown in FIG. 2A.

In an embodiment of the present invention, during use, DI water (DI-$H_2O$) is fed through a feed through channel 216 of plate 202 and fills the gap between the backside of wafer 208 and plate 202 to provide a water filled gap 218 through which acoustic waves generated by transducers 204 can travel to substrate 208. In an embodiment of the present invention DI water fed between wafer 208 and plate 202 is degassed so that cavitation is reduced in the DI water filled gap 218 where the acoustic waves are strongest thereby reducing potential damage to wafer 208. In an alternative embodiment of the present invention, instead of flowing DI-$H_2O$ through channel 216 during use, cleaning chemicals, such as the cleaning solution of the present invention can be fed through channel 216 to fill gap 218 to provide chemical cleaning of the backside of wafer 208, if desired.

Additionally during use, cleaning chemicals and rinsing water such as DI-$H_2O$ are fed through a nozzle 214 to generate a spray 220 of droplets which form a liquid coating 222 on the top surface of wafer 208 while wafer 208 is spun. In the present embodiment the liquid coating 222 can be as thin as 100 micron. In the present embodiment tanks 224 containing cleaning chemicals such as diluted HF, de-ionized water (DI-$H_2O$), and the cleaning solution of the present embodiment are coupled to conduit 226 which feeds nozzle 214. In an embodiment of the present invention the diameter of conduit 226 has a reduced cross-sectional area or a "Venturi" 228 in a line before spray nozzle 214 at which point a gas such as $H_2$ is dissolved in the cleaning solution as it travels to nozzle 214. "Venturi" 228 enables a gas to be dissolved into a fluid flow at gas pressure less than the pressure of the liquid flowing through conduit 226. The Venturi 228 creates under pressure locally because of the increase in flow rate at the Venturi.

B) Integrated Particle Monitor

Figure 3:
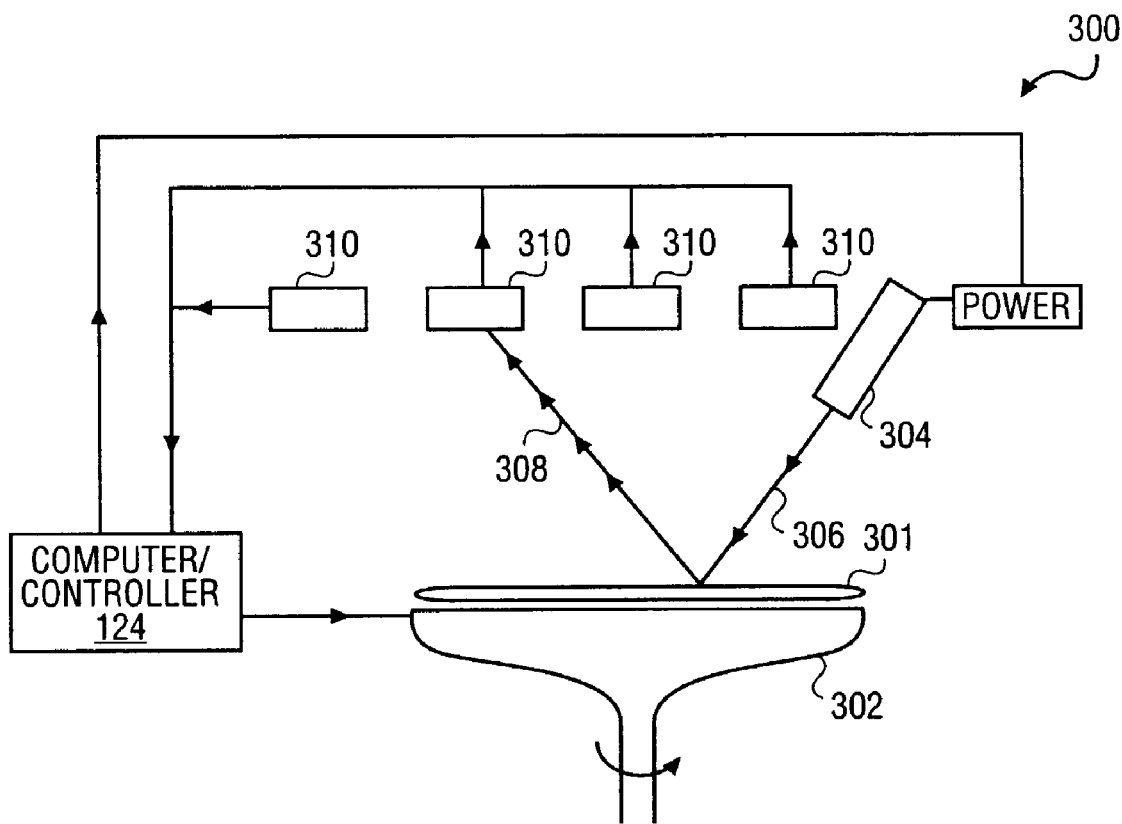
FIG. 3 is an illustration of a cross-sectional view of an integrated particle monitoring tool in accordance with an embodiment of the present invention.

In an embodiment of the present invention, the integrated process monitoring tool 110 is an integrated particle monitor (IPM) 300 such as shown in FIG. 3. An example of a suitable integrated particle monitor (IPM) 300 is the IPM tool manufactured by Applied Materials of Santa Clara, Calif. According to one embodiment of the present invention, the integrated particle monitor 300 includes a rotatable wafer support 302 for holding a wafer 301 and for rotating a wafer on its central axis. A laser source 304 shines a laser beam 306 on wafer 301 and the location of the reflected beam 308 is detected by one or more of a plurality of detectors 310. Detection of the reflected beam 308 by one or more a detector 310 can be used as an indication of the presence of the particle at the location. The detectors can take the form of "bright field" detectors, "dark field" detectors or combination of "bright field" and "dark field" detectors. The laser beam 306 can be scanned across the radius of the wafer while the wafer is rotated in order to monitor the entire wafer surface for particles. Computer 124 along with data processing software can be used to generate a defect map of the entire wafer surface. Software can be used to analyze the particle map, by for example, comparing to a blank wafer or by comparing the particle map of one die on the wafer to other dies on the same or different wafer. The software can be used to classify defects as particles or microscratches. The data from the integrated particle monitoring tool 300 can be used to determine when downstream chambers have excurted from their process base lines (i.e., chamber excursions). Similarly, the particle maps can be sent to upstream chambers or modules in order to alter or optimize or change the upstream process in view of the defect map.

C) Strip or Dry Cleaning Module

Figure 4:
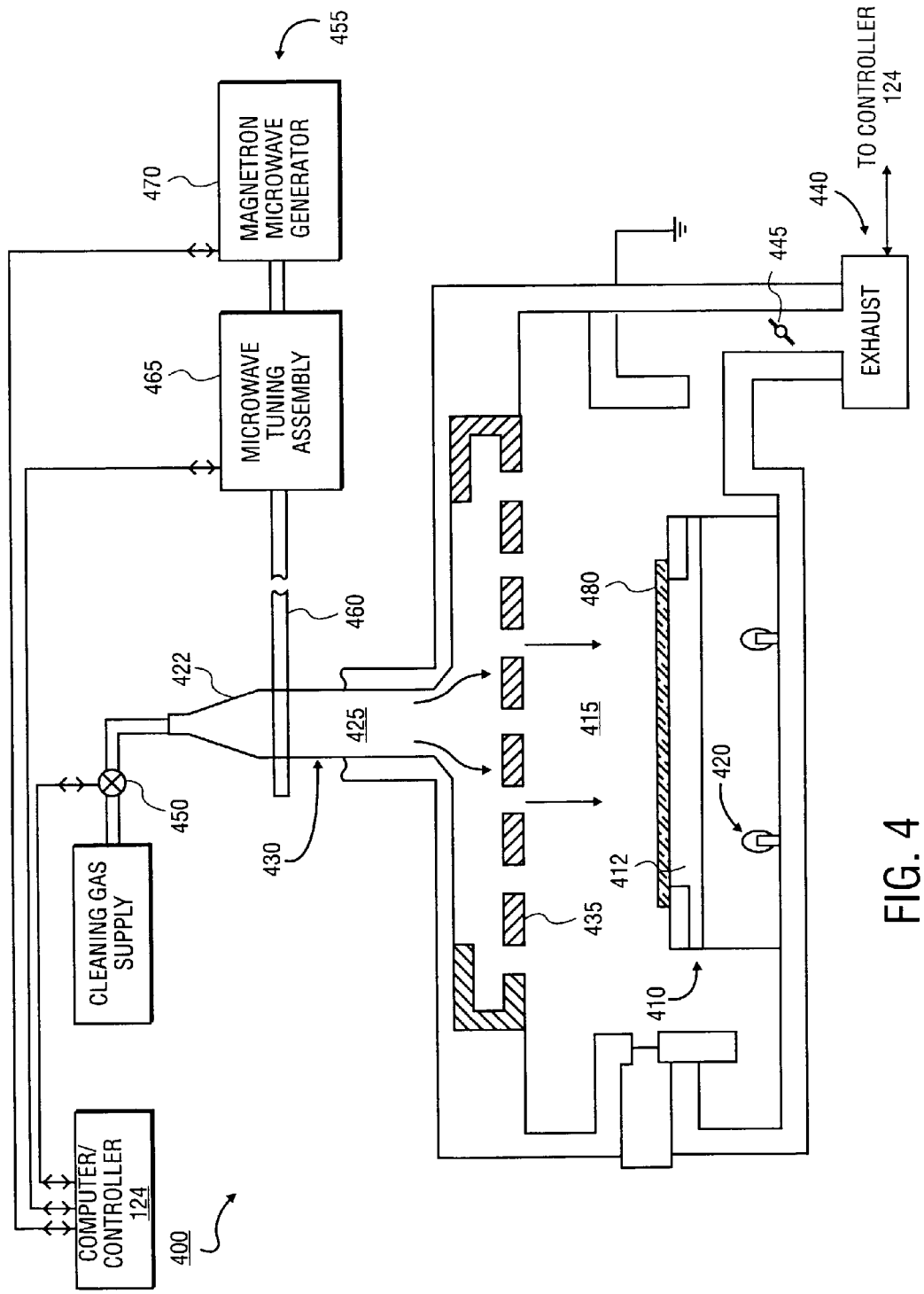
FIG. 4 is an illustration of a cross-sectional view of a single wafer stripping module in accordance with an embodiment of the present invention.

A strip or dry cleaning module 400 in accordance with an embodiment is illustrated in FIG. 4. In the cleaning chamber 400 of the type illustrated in FIG. 4, an energized process gas comprising cleaning gas is provided to clean the substrate 480 held on the support 410 in a process zone 415. The support 410 supports the substrate 480 in the process zone 415 and may optionally comprise an electrostatic chuck 412. Within or below the support 410, a heat source, such as infrared lamps 420, can be used to heat the substrate 430. The process gas comprising cleaning gas may be introduced through a gas distributor 422 into a remote plasma generation zone 425 in a remote chamber 430. By "remote" it is meant that the center of the remote chamber 430 is at a fixed upstream distance from the center of a process zone 415 in the cleaning chamber 108. In the remote chamber 430, the cleaning gas is activated by coupling microwave or RF energy into the remote chamber 430, to energize the cleaning gas and cause ionization or dissociation of the cleaning gas components, prior to its introduction through a diffuser 435, such as a showerhead diffuser, into the process zone 415. Alternatively, the process gas may be energized in the process zone 415. Spent cleaning gas and residue may be exhausted from the cleaning chamber 108 through an exhaust system 440 capable of achieving a low pressure in the cleaning chamber. A throttle valve 425 in the exhaust 440 is used for maintaining a chamber pressure from about 150 mTorr to about 3000 mTorr.

In the version illustrated in FIG. 4, the remote chamber 430 comprises a tube shaped cavity containing at least a portion of the remote plasma zone 425. Flow of cleaning gas into the remote chamber 430 is adjusted by a mass flow controller or gas valve 450. The remote chamber 430 may comprise wall made of a dielectric material such as quartz, aluminum oxide, or monocrystalline sapphire that is substantially transparent to microwave and is non-reactive to the cleaning gas. A microwave generator 455 is used to couple microwave radiation to the remote plasma zone 425 of the remote chamber 430. A suitable microwave generation 455 is an "ASTEX" Microwave Plasma Generator commercially available from Applied Science & Technology, Inc., Woburn, Mass. The microwave generator assembly 455 may comprise a microwave applicator 460, a microwave tuning assembly 465, and a magnetron microwave generator 470. The microwave generator may be operated at a power level of about 200 to about 3000 Watts, and at a frequency of about 800 MHz to about 3000 MHz. In one version, the remote plasma zone 425 is sufficiently distant from the process zone 415 to allow recombination of some of the dissociated or ionized gaseous chemical species. The resultant reduced concentration of free electrons and charged species in the activated cleaning gas minimizes charge-up damage to the active devices on the substrate 480, and provides better control of the chemical reactivity of the activated gas formed in the remote plasma zone 425. In one version, the center of the remote plasma zone 425 is maintained at a distance of at least about 50 cm from the center of the process zone 415.

A cleaning process may be performed in the cleaning chamber 400 by exposing the substrate 480 to energized process gas comprising cleaning gas to, for example, remove remnant resist and/or to remove or inactivate etchant residue remaining on the substrate after the substrate is etched. Remnant resist may be removed from the substrate 480 in a stripping (or ashing) process by exposing the substrate 480 to energized process gas comprising stripping gas. Stripping gas may comprise, for example, one or more of $O_2$, $N_2$, $H_2$, $H_2O$, $NH_3$, $CF_4$, $C_2F_6$, $CHF_3$, $C_3H_2F_6$, $C_2H_4F_2$, or $CH_3F$.

Method of Operating Wet/Dry Cleaning Tool 100

Figure 5A:
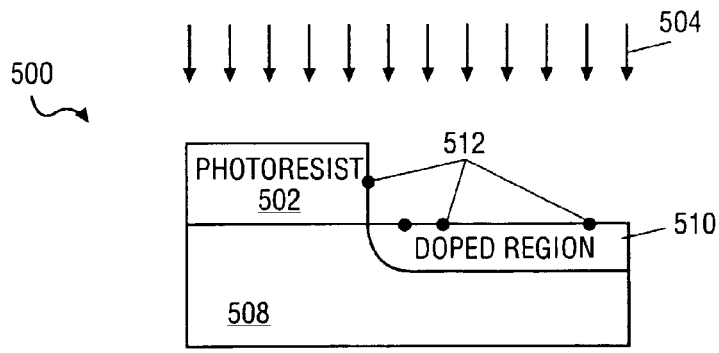
FIG. 5A-5D illustrate a dry stripping and wet cleaning process in accordance with an embodiment of the present invention.

Wet/dry cleaning tool 100 is ideal for use in removing a photoresist layer from a wafer as shown in FIGS. 5A–5D. In an embodiment of the present invention, a patterned photoresist layer 502 is removed from a wafer 500 after an ion-implantation step 504. The patterned photoresist layer as shown in FIG. 5a, forms a mask which is used to mask an ion-implantation step which can be used to form doped regions in a monocrystalline silicon substrate 508, such as wells, source/drain regions, channel doping, and other well known doped regions used to fabricate a semiconductor integrated circuit. According to an embodiment of the present invention, a cassette or FOUP of wafers 500 having a photoresist mask 502 thereon, are placed in a docking station in apparatus 100. An access door 110 in docking station 131 slides down and pulls down the door to FOUP 130. Robot 104 removes a wafer 500 from FOUP 130 and places the wafer into dry clean chamber 400. Clean chamber 108 is then sealed and pumped down to a pressure of between 150 mTorr to 3000 mTorr.

Figure 5B:
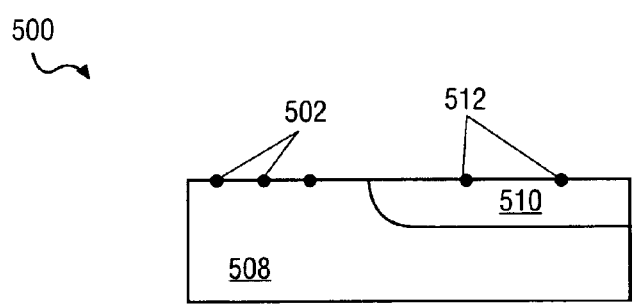

A cleaning process is then performed in the cleaning chamber 400 by exposing the wafer 500 to energized process gas comprising cleaning gas to, for example, remove photoresist mask 502 and/or to remove or inactivate implant residue 512 remaining on the substrate after the substrate is etched. Remnant resist 502 may be removed from the substrate in a stripping (or ashing) process by exposing the substrate to energized process gas comprising stripping gas. Stripping gas may comprise, for example, one or more of $O_2$, $N_2$, $H_2$, $H_2O$, $NH_3$, $CF_4$, $C_2F_6$, $CHF_3$, $C_3H_2F_6$, $C_2H_4F_2$, or $CH_3F$. In one version, a suitable stripping gas for stripping polymeric resist material comprises (i) oxygen, and optionally (ii) an oxygen activating gas or vapor, such as water vapor, nitrogen gas, or fluorocarbon gas, the fluorocarbon gases including any of those listed above. The oxygen activating gas increases the concentration of oxygen radicals in the stripping gas. The stripping gas composition may comprise oxygen and nitrogen in a volumetric flow ratio of about 6:1 to about 200:1, and more likely from about 10:1 to about 12:1. For a 5-liter process chamber 108, a suitable gas flow rate comprises 3000 to 3500 sccm of $O_2$ and 300 sccm of $N_2$. In one version, a stripping gas comprises about 35000 sccm $O_2$, about 200 sccm $N_2$ and optionally about 300 sccm $H_2O$, that is energized at a power level of about 1400 watts and introduced into the cleaning chamber 108 at a pressure of about 2 Torr for about 15 seconds. In one version, the water vapor content in the stripping gas should be less than about 20% by volume of the combined oxygen and nitrogen gas content to provide adequate stripping rates. A suitable ratio of the volumetric water vapor flow $V_{H2O}$ to the combined volumetric flow of oxygen and nitrogen ($V_{O2}+V_{N2}$) is from about 1:4 to about 1:40, and more likely about 1:10. When the remnant resist comprises oxide hard mask, suitable stripping gases are gases capable of stripping oxide, such as halogen containing gases, including $CF_4$, $C_2F_6$, $CHF_3$, $C_3H_2F_6$, $C_2H_4F_2$, and HF. The substrate 500 may be exposed to the stripping gas for a period of time of from about 10 seconds to about 1000 seconds, and more likely for about 45 seconds. A single stripping step may be performed or multiple stripping steps may be performed, as discussed in U.S. Pat. No. 5,545,289, which is incorporated herein by reference in its entirety. After stripping or ashing in chamber 400, wafer 500 may still contain photoresist mask residue and/or implant residue 512 as shown in FIG. 5B.

In one version, the substrate may be heated during the stripping and/or the passivation processes. For example, when cleaning the substrate 500 in a cleaning chamber 400, such as the cleaning chamber of FIG. 4, the lamps 420 may be used to heat the substrate to a temperature of at least about 150° C., and more specifically to a temperature of at least about 250° C. Heating the substrate 500 improves the remnant resist removal rate and may also improve the removal rate of some etchant residue, such as Cl in the sidewall deposits 80, because the Cl can more readily diffuse out of the sidewall deposits. The elevated temperature also enhances the surface oxidation, when $O_2$ containing strip density is used, of the etched metal, making them less susceptible to corrosion.

In one embodiment of the present invention, the wafer is then transferred to the wet cleaning chamber 200 and is exposed to a light clean consisting of only a Di water rinse. In another embodiment of the present invention, the wafer is exposed to a Di water rinse which has been ozonated. The ozonated water oxidizes carbon left over from the ashing and insures its removal. In yet another embodiment of the present invention, the wafer is exposed to an ozonated water rinse and to cleaning chemicals comprising $NH_4OH$, $H_2O_2$, a surfactant and a chelating agent. In yet another embodiment of the present invention, the wafer is exposed to an ozonated Di water then HF then cleaning solutions comprising $NH_4OH$, $H_2O_2$, a surfactant and a chelating agent. In yet another embodiment of the present invention, the wafers are exposed to a mixture comprising sulfuric acid ($H_2SO_4$) and hydrogen peroxide ($H_2O_2$) and then exposed to a water rinse and dry. In yet another embodiment of the present invention, the wafers are exposed to standard RCA cleaning solutions of SC1 and SC2 and then exposed to a water rinse and dry. While the wafers are being cleaned megasonic energy can be applied to the wafer to enhance the cleaning. In an embodiment of the present invention, megasonics is applied to the entire backside of the wafer while cleaning. Not only can the cleaning solution being applied to the device side of the wafer (frontside of the wafer) but can also be applied to the backside of the wafer, if desired.

Figure 5C:
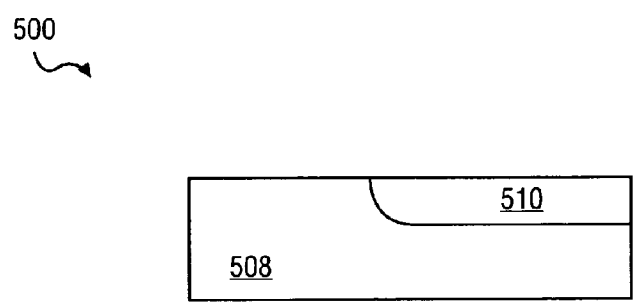
Figure 5D:
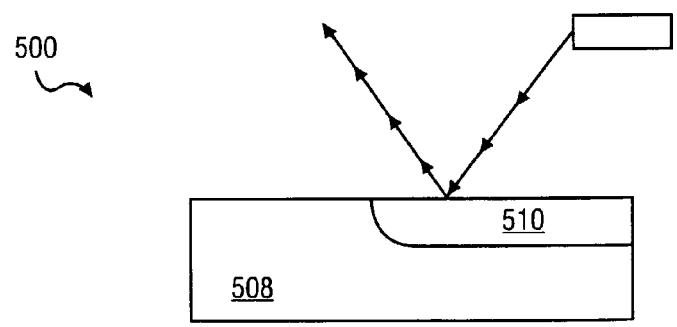

After the wafer 500 has been sufficiently cleaned, as shown in FIG. 5C, the door to the wet cleaning module 200 opens and the robot 104 removes the wafer from the wet module 200. If process metrology of the wafer 500 is desired, the door to the metrology tool 300 is opened and the robot 104 transfers the wafer into the process metrology tool 300. The door to the integrated particle monitor 300 is then closed and the wafer 500 scanned, as shown in FIG. 5D, to check for defects, such as scratches and particles. Computer/controller 124 can generate a defect map of the defects across the surface of wafer 500. Computer/controller 124 and data process software can determine whether or not the wafer has been sufficiently cleaned by the stripping chamber 400 and the wet cleaning chambers 200 and can be used to determine which type of defects have occurred. Depending upon the results of the metrology scan, the wafer can be removed from the integrated particle monitor tool 110 and can be either: (i) transferred back to the wet cleaning module 200 for further wet cleaning, (ii) transferred back to the dry clean module 400 for more stripping, (iii) can be transferred back to both the dry clean module 400 and the wet cleaning module 200 for further stripping and cleaning or (iv) can be transferred back to the FOUP. The amount of and/or type of clean or stripping necessary can be determined by the information received from the integrated particle monitor tool 300. If the wafer has been sufficiently stripped and cleaned, the wafer can be removed from the integrated particle monitor by robot 104 and moved through the transfer chamber 102 whereby the access door as well as the door to the wafer cassette or FOUP which is to receive the wafer is opened and the wafer placed therein. The wafer can be placed into the same FOUP 130 in which the wafer started or can be placed in a different FOUP 132, if desired.

In an embodiment of the present invention, the process time in each module and the number of each module are chosen so that the wafer flow is balanced for optimum use of each module. For example, in an embodiment of the present invention, the process time used to strip a wafer in cleaning module 400 is chosen to be substantially similar to the process time used to wet clean a wafer in wet clean module 200 and is about twice as long as the time necessary to check a wafer for defects in module 300. Accordingly, apparatus 100 includes two wet clean modules 200 and 200B, and two strip modules 400 and 400B, and a single metrology tool 300. By providing two wet cleaning tools 200 and 200B and two ashing tools 400 and 400B and a single metrology tool 300, no module is left idle. For example, if the wet cleaning time is chosen to be two minutes then the stripping time is chosen to be two minutes, and the metrology tool takes one minute then the wafer throughput of the modules is balanced. By providing more modules for the processes which take longer (e.g., to clean and strip) faster processing modules (e.g., metrology) do not sit idle while waiting for a wafer to complete cleaning or stripping. In such a process, a wafer completes processing (strips, cleans, and metrology) every 60 seconds (apparatus 100 has a wafer through put of 60 seconds) as opposed to every 120 seconds if the tool was unbalanced and only had one wet clean or one strip module in apparatus 100. Preventing idle time of the modules contained in apparatus 100 directly increases wafer through put and reduces a cost of ownership of the apparatus.

II) Atmospheric and Sub-Atmospheric Process Tool

According to another embodiment of the present invention, a process tool or apparatus having both atmospheric and sub-atmospheric process chambers or modules is provided. According to this embodiment of the present invention, the process tool includes an atmospheric platform coupled via a load lock to a sub-atmospheric platform. (A platform is a transfer chamber having a robot contained therein and process modules attached thereto). Attached to the sub-atmospheric transfer chamber are sub-atmospheric process modules, such as but not limited to etch modules, deposition chambers such as CVD chambers and sputter chambers, oxidation chambers, and anneal chambers. Attached to the atmospheric transfer chamber are atmospheric process modules, such as wet cleaning tools, ashing (stripping) tools, and metrology tools. The ashing (stripping) chambers can be connected to either the atmospheric platform or the sub-atmospheric platform or both. The atmospheric/sub-atmospheric tool utilizes a single wafer load lock and generally two single wafer load locks coupled between the atmospheric and sub-atmospheric platforms to enable transfer of wafer between the atmospheric and sub-atmospheric transfer chambers. In an embodiment of the present invention, wafers enter the tool through the atmospheric transfer chamber and also exit the tool through the atmospheric transfer chamber. Some of the benefits of the atmospheric and sub-atmospheric process tool include the fact that Queue time between two process steps can be reduced and made consistent and independent of Queing or material logistic issues. Additionally, the growth of silicon dioxide on silicon is reduced due to reduced exposure (in time) to air. Particle and contamination control can be improved through reduced exposure to the fab environment. An atmospheric/sub-atmospheric process tool can provide processing of a wafer in reduced cycle times and also provides a reduced footprint of the tool. Additionally, an atmospheric/sub-atmospheric process tool can reduce corrosion of, for example metal lines, through reduced exposure to air. Additionally, the amount of distance a wafer must travel is also reduced thereby improving wafer throughput and contamination control.

Etch/Strip Clean Process Tool

Figure 6:
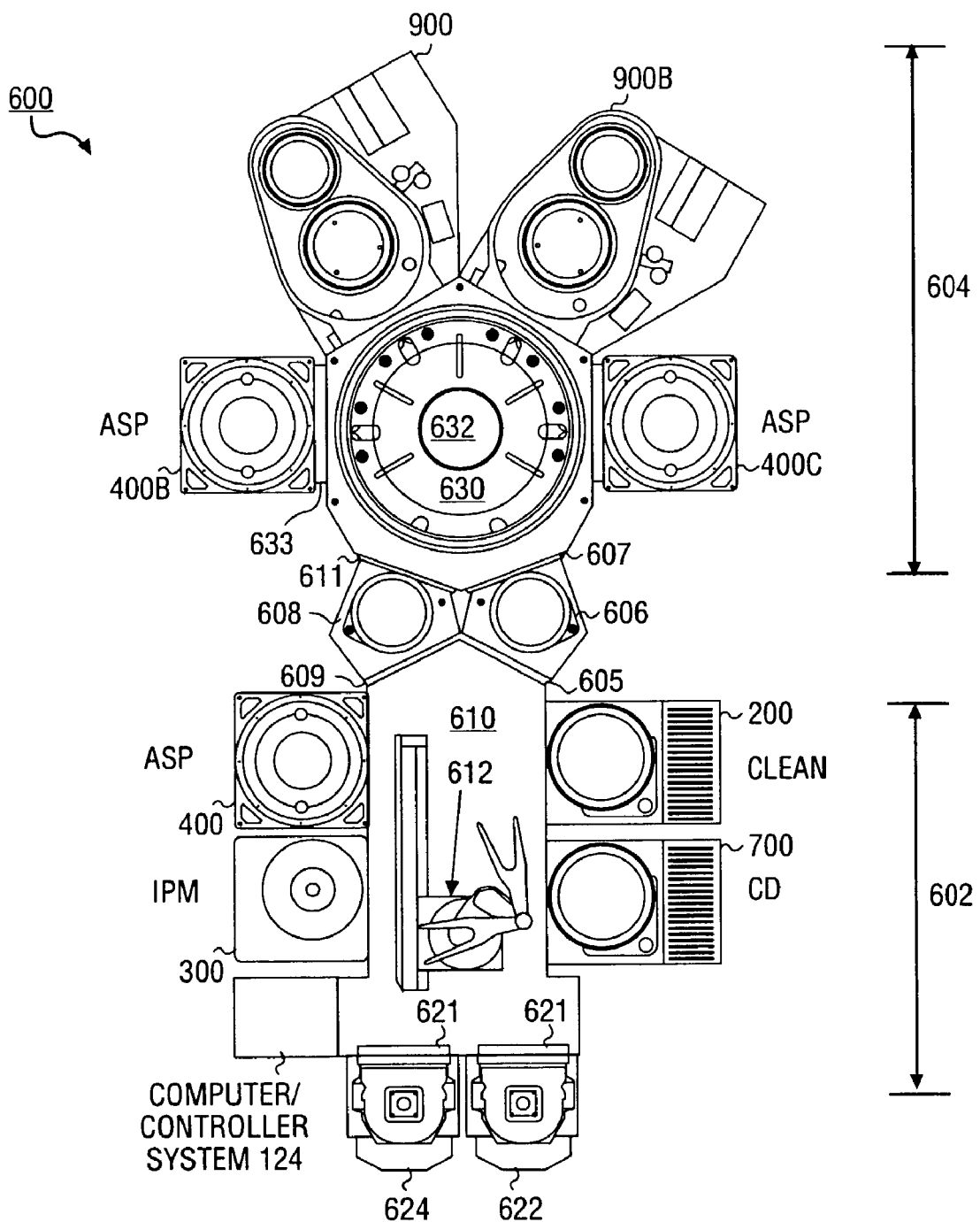
FIG. 6 is an illustration of a atmospheric/sub-atmospheric process tool for the etching, stripping, cleaning and monitoring of a wafer in accordance with an embodiment of the present invention.

An example of an atmospheric/sub-atmospheric process apparatus 600 in accordance with the present invention is illustrated in FIG. 6. Shown in FIG. 6 is a process tool or system 600 which can be used to etch features, such as metal or polysilicon lines, or opening in dielectric layers or silicon substrates and can be used to strip or clean the photoresist layer used to pattern the features. Etch/strip process tool 600 includes an atmospheric platform 602 and a sub-atmospheric platform 604. The sub-atmospheric platform 604 and the atmospheric platform 602 are coupled together by a single wafer load lock 606 and generally by two single wafer load locks 606 and 608. Atmospheric platform 602 includes a central atmospheric transfer chamber 610 having a wafer handling device 612, such as a robot contained therein. Directly attached to atmospheric transfer chamber 610 is a single wafer wet cleaning module 200 and an integrated particle monitor 300 and a critical dimension (CD) measuring tool 700. A strip or dry clean module 400 can also be attached to atmospheric transfer chamber 610, if desired. Wet cleaning module 200, strip module 400, integrated particle monitor 300, and critical dimension measuring tool 700 are each connected to transfer chamber 610 through a separately closable and sealable opening, such as a slit valve. Transfer chamber 610 is maintained at substantially atmospheric pressure during operation. In an embodiment of the present invention, the atmospheric transfer chamber 610 can be opened or exposed to the atmosphere of a semiconductor fabrication "clean room" in which it is located. In such a case, the transfer chamber 610 may contain an overhead filter, such as a hepafilter to provide a high velocity flow of clean air or an inert ambient such as $N_2$, to prevent contaminants from finding their way into the atmospheric transfer chamber. In other embodiments, the atmospheric transfer chamber 610 is a closed system and may contain its own ambient, of clean air or an inert ambient, such as nitrogen gas ($N_2$).

Atmospheric transfer chamber 610 includes a wafer handling robot 612 which can transfer a wafer from one module to another module in atmospheric process tool 602. In an embodiment of the present invention, the wafer handler 612 is a dual blade, single arm, single wrist robot. The handling blades both rotate about a single axis coupled to the end of a single arm as described above.

Also coupled to atmospheric transfer chamber 610 is at least one wafer input/output module 620 or pod for providing and taking wafer to and from system 600. In an embodiment of the present invention, the wafer input/output module is a front opening unified pod (FOUP) which is a container having a sealable door and which contains a cassette for between 13–25 horizontally spaced wafers. In an embodiment of the present invention, apparatus 600 includes two FOUPs 622 and 624, one for providing wafers into system 600 and one for removing completed or processed wafers from system 600. Atmospheric transfer chamber 610 contains a sealable access door 621 for allowing wafers to be transferred into and out of atmospheric transfer chamber 610. There is an access door 621 for each FOUP, and each assess door is attached to a counter part door on each FOUP so that when transfer chamber access door 621 slides open, it opens the door to the associated FOUP to provide access for the robot 612 into the FOUP.

Coupled to the opposite sides of atmospheric transfer chamber 610 then FOUP 622 and 624 is a single wafer load lock 606 and optionally second single wafer load lock 608. Single wafer load locks 606 and 608 enable a wafer to be transferred from the atmospheric conditions in transfer chamber 610 to the sub-atmospheric transfer chamber 630 of platform 604 and allows wafers to be transferred from the sub-atmospheric transfer chamber 630 to the atmospheric transfer chamber 610. A sealable door 605 is located between atmospheric transfer chamber 610 and load lock 606 and a sealable door 607 is located between sub-atmospheric transfer chamber 630 and load lock 606. Similarly, a sealable door 609 is located between atmospheric transfer chamber 610 and load lock 608 and a sealable door 611 is located between sub-atmospheric transfer chamber 630 and load lock 608. Coupled to each load locks 606 and 608 is a vacuum source which enables the pressure inside load locks 606 and 608 to be independently lowered. Additionally, also coupled to each load lock 606 and 608 is a gas inlet for providing, for example, air or an inert gas, such as $N_2$, into a load lock to enable the pressure within the load lock to be raised. In this way, the pressure within the load locks 606 and 608 can be matched to either the pressure within atmospheric transfer chamber 610 or the pressure within sub-atmospheric transfer chamber 630.

Attached to the opposite ends of the single wafer load locks 606 and 608 is sub-atmospheric transfer 630 having a wafer handling device 632, such as a robot contained therein. Sub-atmospheric transfer chamber 630 is said to be a sub-atmospheric transfer chamber because transfer chamber 630 is held at a pressure less than atmospheric pressure and generally between $10^6$–10 Torr while in operation and passing wafers to the various sub-atmospheric process modules coupled thereto. Directly attached to sub-atmospheric transfer chamber 630 is a single wafer strip module 400B and an etch module 900 optionally. Strip module 400B and etch module 900 are connected to sub-atmospheric transfer chamber 630 through separately closable openings. In an embodiment of the present invention, a second strip module 400C and a second etch 900B are also coupled to sub-atmospheric transfer chamber 630. Although, load locks 606 and 608 are ideally low volume single wafer load locks to enable fast wafer transfers between the atmospheric transfer chamber and the sub-atmospheric transfer chamber, load locks 606 and 608, however, can be larger multiple wafer load locks which can hold multiple wafers at a single time, if desired.

It is to be noted that the ashing or stripping processes which occur in strip module 400 (as well as modules 400B and 400C) typically occur at sub-atmospheric pressures. Accordingly, it is advisable to place the stripping modules necessary for the process onto sub-atmospheric transfer chamber because it simplifies and reduces the pumping requirements in the stripping module. There are, however, times when it maybe beneficial or necessary to include a stripping module 400 on atmospheric transfer chamber 610. For example, if all module location on the sub-atmospheric transfer chamber are occupied by other modules one can place the stripping module on the atmospheric transfer chamber 610. Additionally, some integrated processes may require excessive wafer transfers between sub-atmospheric chamber 630 and atmospheric transfer chamber 610 resulting in the over use of load lock 608 and 606 and possible bottle neck at these locations. For example, in the case when a wafer is given a quick wet clean to remove sidewall residue prior to ashing or stripping, it may be desirable to provide a strip module 400 on the atmospheric transfer chamber 610 so that the wafer does not need to travel back through the load locks and into the sub-atmospheric transfer chamber to the stripping module after wet cleaning in a wet module 200 coupled to the atmospheric transfer chamber. As such, although stripping module(s) 400 is ideally coupled to sub-atmospheric transfer chamber 630, a strip module 400 can be included on atmospheric transfer chamber 610 or on both atmospheric transfer chamber 610 and on sub-atmospheric transfer chamber 630, if desired.

Apparatus 600 also includes a system computer 124 which is coupled to and controls each module coupled to the atmospheric transfer chamber 610, controls each sub-atmospheric module coupled to sub-atmospheric transfer chamber 630, controls load locks 606 and 608 as well as the operation of robots 612 and 632. Computer 124 enables the feedback from one module to be used to control the flow of a wafer through system 600 and/or to control the processes or operation of the other modules.

Critical Dimension (CD) Monitor

Figure 7:
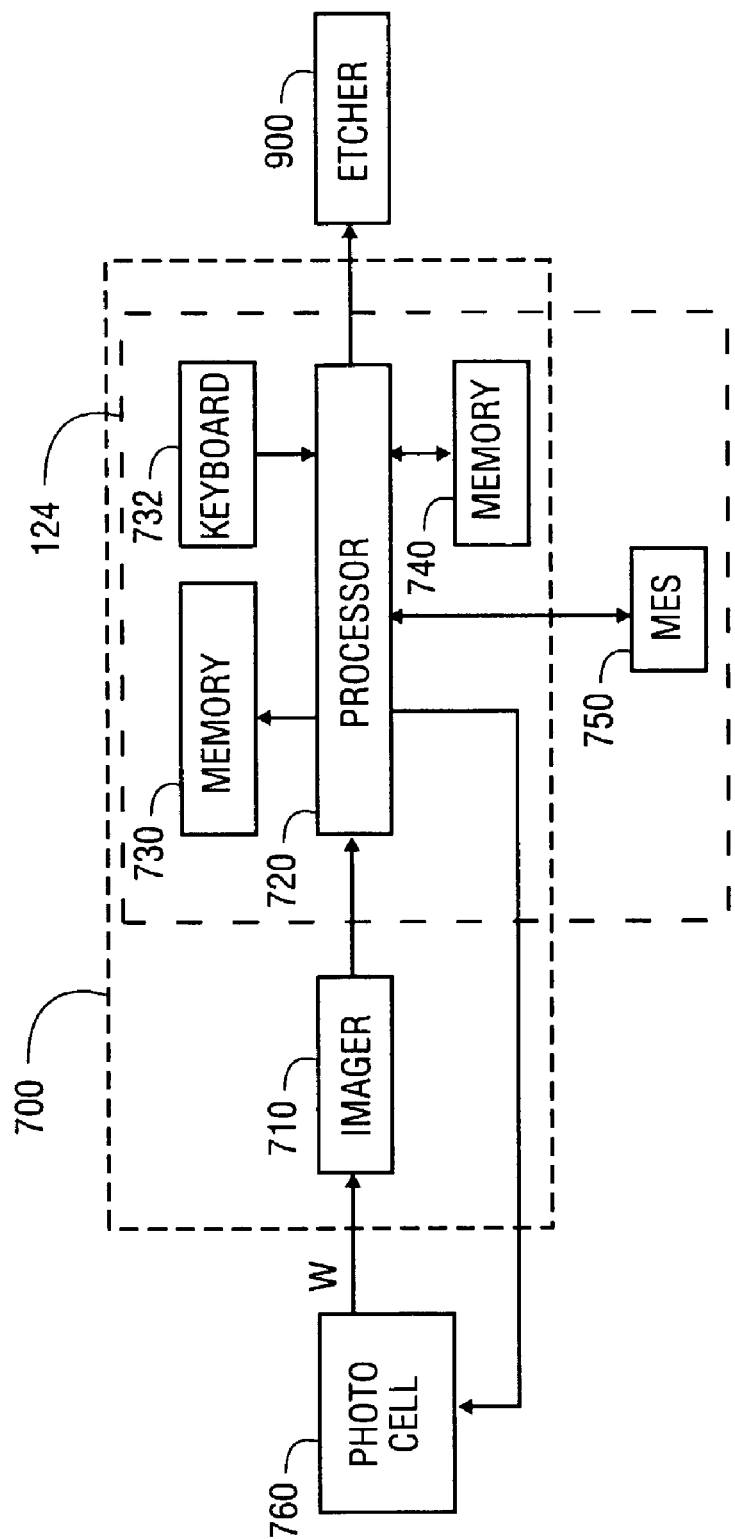
FIG. 7 is a block diagram of a review or monitoring tool according to an embodiment of the present invention.

FIG. 7 illustrates a critical dimension monitoring tool or a "metrology" tool 700 which can be used to measure, for example, the width of photoresist feature formed on an incoming wafer.

The present invention can be implemented with a metrology tool 700, such as shown in FIG. 7. Metrology tool 700 includes an imager 710 and a computer/controller 124 to perform the analysis disclosed herein electronically. Computer/Controller 124 typically includes a process monitor 730 for displaying results of the analyses of processor 720. Processor 720 can be in communication with a memory device 740, such as a semiconductor memory, and a computer software-implemented database system 750 known as a "manufacturing execution system" (MES) conventionally used for storage of process information. Processor 720 is also in communication with a photo cell 760 and etcher 900. In an embodiment of the present invention, the imager 710 can be an optical CD tool (OCD), such as the Nano OCD 9000 available from Nanometrics of Milpitas, Calif., or an optical imager as disclosed in U.S. Pat. No. 5,963,329. Optical imager 710 can utilize scatterometry or reflectometry techniques. The use of scatterometry for inspection tools is disclosed in Raymond "Angle-resolved scattermetry for semiconductor manufacturing", *Microlithography World*, Winter 2000. The use of reflectometry for inspection is taught in Lee, "Analysis of Reflectometry and Ellipsometry Data from Patterned Structures", *Characterization and Metrology for ULSI Technology:* 1998 International Conference, The American Institute of Physics 1998.

Optical imager 710 can directly measure CD and profile of certain patterns on photoresist layer, such as trenches and the like using convention optical inspection techniques. For example, a rigorous coupled wave analysis (RCWA) can be performed, wherein a CD corresponding to a given waveform is derived by calculation, such as by a processor in the optical inspection tool. RCWA is discussed in Chateau, "Algorithm for the rigorous couple-wave analysis of grating diffraction", *Journal of the Optical Society of America*, Vol. 11, No. 4 (April 1994) and Moharam, "Stable implementation of the rigorous couple-wave analysi for surface-relief gratings: enhanced transmittance matrix approach", *Journal of the Optical Society of America*, Vol. 12, No. 3 (May 1995).

In an embodiment imager 710 can be a CD SEM, such as the Versa SEM™ available from Applied Materials of Santa Clara, Calif.

Figure 8A:
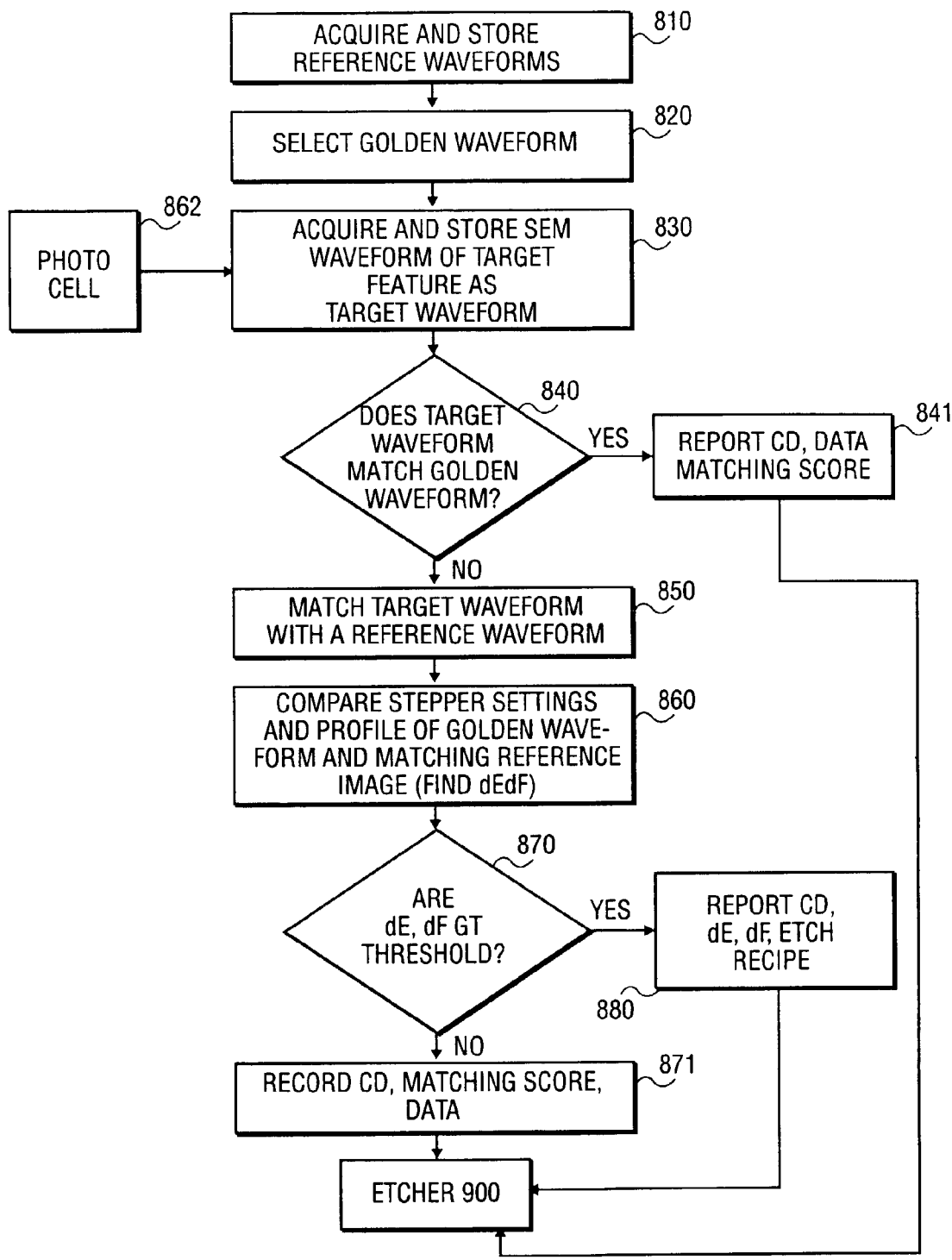
FIGS. 8A and 8B are flowcharts illustrating sequential steps in monitoring methods according to embodiments of the present invention.

FIG. 8A is a flow chart illustrating the major steps of process control according to an embodiment of the present invention, implemented in conjunction with inspecting a feature (hereinafter called a "target feature") such as an etch mask formed on a semiconductor wafer W at photo cell 760. At step 810, the reference library is created, including reference CDs and waveforms in the form of SEM or OCD waveforms, and stored locally in inspection tool 700 or in MES 750. The stepper settings associated with each of the reference waveforms and the appropriate etch recipes are stored along with the waveforms. Profile images can also be stored, if desired by the user. The reference library is created only once for each layer to be inspected, such as when a series of process steps, such as photo cell 760, creates a "critical layer" that the user determines must be inspected. The golden waveform; i.e., the waveform associated with the reference feature exhibiting optimal CD and/or other characteristics, is selected at step 820.

Computer/Controller 124 typically includes a processor 720, such as a microprocessor, for processing information, and a monitor 730 for displaying or outputting information, and a input device 732, such as a keyboard or touch screen, and a memory, such as a DRAM for steady information.

Wafer W, having features with unknown CD and other characteristics, is brought to imager 710 from photo cell 760, the target feature is imaged by imager 710 at step 830, and its waveform is stored as a target waveform. At step 840, the target waveform is compared to the stored golden waveform. If the target waveform and golden waveform match within predetermined limits, the CD of the target feature is reported to the user, as by a display on monitor 730, along with a "matching score" indicating the amount of deviation of the target waveform from the golden waveform (see step 841). The results (i.e., the data) from the inspection are then sent to MES 750, and the wafer W is sent to etcher 900 for further processing.

If the target waveform does not match the golden waveform, the target waveform is compared to each of the reference waveforms in the library to identify the reference waveform most closely matching the target waveform (see step 850). The reported stepper settings are compared with those associated with the golden waveform at step 860 to determine the different dEdF between the settings which produced the golden waveform and those which produce the target waveform; e.g., determine the difference between the focus setting associated with the golden waveform and the focus setting associated with the target waveform, and determine the difference between the exposure setting associated with the golden waveform and the exposure setting associated with the target waveform. This information is then sent to photo cell 760, where it is used to correct the stepper settings to minimize "drift" in the stepper, which would cause CD variations in subsequently processed wafers, by indicating the amount of adjustment to the stepper that is required, as well as which particular adjustments (i.e., focus, exposure, or both) should be made.

Next, dE and dF are compared to predetermined threshold values at step 870. If dE and dF are not greater than the predetermined threshold values, the CD and matching score of the target feature are reported at step 871, the data from the inspection is then sent to MES 750, and wafer W is sent to etcher 900. On the other hand, if dE and dF are greater than the predetermined threshold values, the CD and matching score of the target feature is reported at step 880, along with dE and dF and the associated etch recipe, which is sent to etcher 900 to adjust (or "update") the etch recipe to correct the CD deviation of the finished features on wafer W. The etch recipes can typically adjust the CD within a range of about 100% or less.

The feedback and feed-forward of steps 860 and 880 can be done manually or automatically. In "manual mode", the user takes the reported process correction information and implements it manually at photo cell 760 and/or etcher 900. This allows expert input from the user to decide the need for process adjustment. In "automatic mode", the process correction information is automatically fed to the stepper in photo cell 760 or to etcher 900 to effect the correction through recipe updating. This mode can be implemented by a software interface allowing communication between processor 720 and etcher 900, and between processor 720 and photo cell 760. The predetermined threshold test of step 870 can be used as a sensitivity filter to determine if updating is necessary. The automatic mode is advantageous because it enables quick feedback and consistency.

The above embodiment of the present invention has been described relative to a "golden waveform" technique. However, it should be realized by any SEM CD measurement technique capable of correlating an FEM cell (or dF) to an etch recipe and to feature profile and/or cross-section can be used to implement the present invention. An example of such a technique is discussed in "An Inverse Scattering Approach to SEM Line Width Measurements", Mark P. Davidson and Andras E. Vladar, Proceedings of SPIE, Vol. 3677 (1999). In this technique, SEM waveforms are matched to a library of Monte Carlo simulations to predict the sidewall shape and dimensions of a feature (i.e., the feature profile).

Typically, the present methodology is carried out after a lot of wafers, such as about 25 wafer, is processed by photo cell 760. A number of wafers W from the lot are selected to be inspected, according to the user's preference. For example, when manufacturing microprocessors, 1–3 wafers are typically selected for inspection; however, when manufacturing memory devices such as DRAMs, only one wafer is typically inspected per lot. A number of sites on each selected wafer W are usually inspected by the present methodology (i.e., to be target features at step 830), such as about 9–17 sites per wafer W. If an OCD is used, each wafer maybe inspected.

To determine the etch recipe to be implemented at step 880 when a number of target features from one or more wafers W in a lot are inspected, the CDs of all the target features of the lot can be averaged, and the etch recipe associated with the average CD used to adjust the etch processing of the lot. To determine the stepper focus and exposure information (dEdF) fed back to photo cell 760 at step 860 to adjust the photolithographic processing of following lots when a number of target features in a lot are inspected, the user can employ previously gathered process information to decide which sites on selected wafers W to inspect, and then decide which inspected feature's information to use to adjust photo cell 760.

Figure 8B:
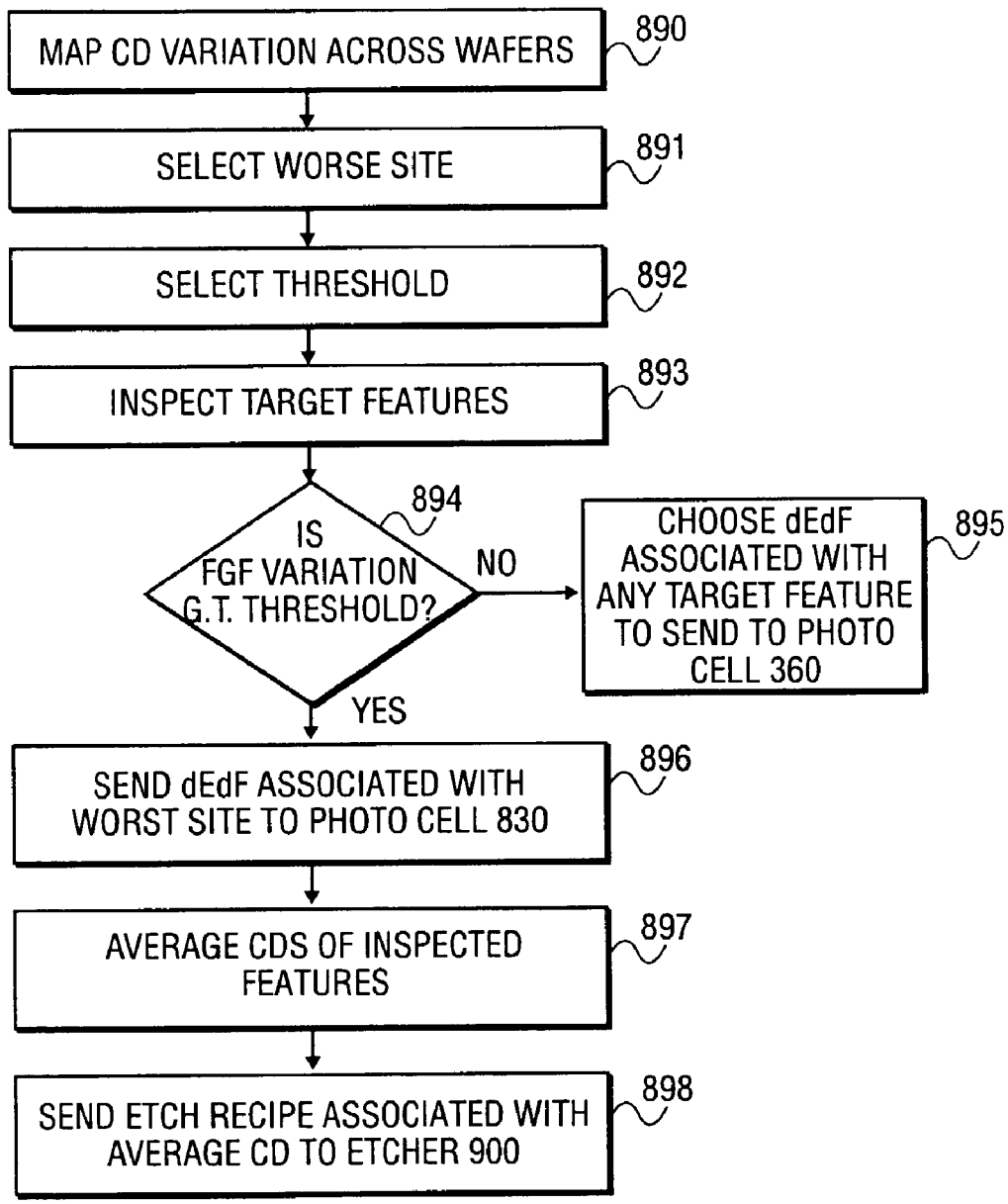

This is illustrated in FIG. 8B, which is a flow chart of an embodiment of the invention. At step 890, the user maps field to field CD variations across a number of wafers prior to inspection using the present methodology. This is a standard process control technique practiced by virtually all wafer fabricators. It indicates which areas of the wafer typically have small CD variations from the design value, and which areas of the wafer typically have a large CD variation. For example, some wafer processing equipment (e.g., photo cell 760) produces wafer having a small CD variation in the center of the wafer and larger CD variations at the periphery. Other equipment produces wafers having large CD variations near the corner of the wafer and small CD variations in a band surrounding the center. After mapping the CD variations, the user identifies, at step 891, an area or areas of the wafers that exhibit the worst CD variation.

Next, the user selects a threshold CD variation representing the smallest CD deviation the user wishes to correct (see step 892). Target features are then inspected at step 893 using the inventive methodology (e.g., steps 830 et seq. described above). Target features are selected such that fields in the worst part of the wafer, identified at step 891, are represented. If the field to field variation of the inspected features is smaller than the predetermined threshold (see step 894), dEdF associated with any one of the target features can be fed back to photo cell 760 for use in adjusting the processing of subsequent lots (step 895), since they are relatively close to each other. On the other hand, if the field to field variation of the inspected features is larger than the threshold value selected in step 892, dEdF associated with an inspected feature from the predetermined worst site from step 891 is fed back to photo cell 760 (see step 896). Thus, the worst CD variation is corrected in subsequent lots.

At step 897, the CDs of the inspected features are averaged, and at step 898, the etch recipe associated with the average CD is fed forward to etcher 900 to adjust (or "update") the etch recipe to correct the CD deviation of the features on the wafers in the inspected lot. Thus, this embodiment of the present invention allows the user to employ information, such as field to field CD variation maps, that they gather as a matter of course independently of implementing the present invention, to reduce lot to lot variation with minimal added cost and inspection time.

Etch Module

Figure 9:
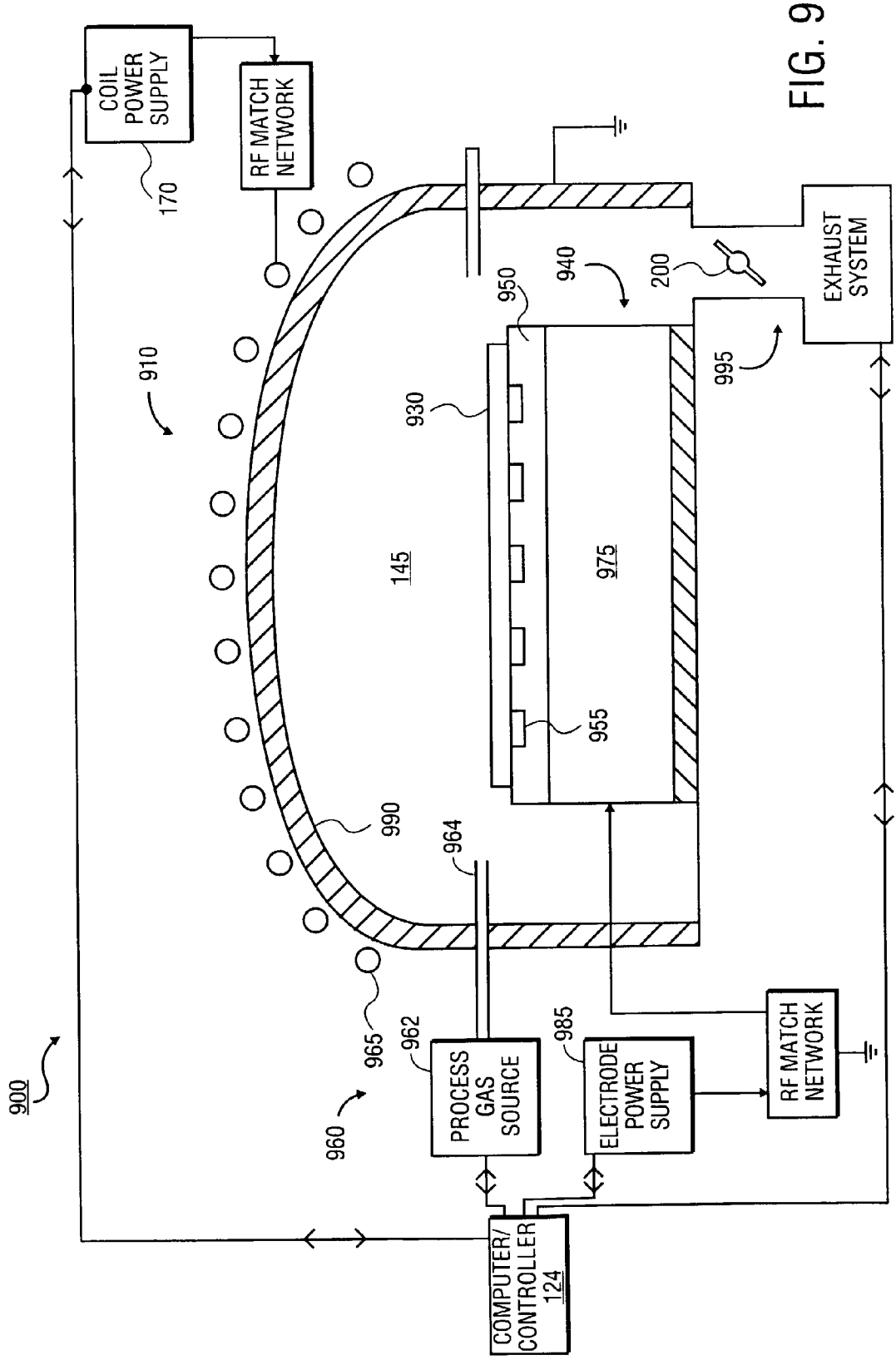
FIG. 9 is a schematic sectional sideview of an etching chamber.

An example of an etch module 900 which can be used in accordance with the present invention, is illustrated in FIG. 9. FIG. 9 illustrates an etch process module such as for example, a DPS type Metal Etch Centura chamber, schematically illustrated in FIG. 9 and from Applied Materials, Inc. in Santa Clara, Calif. The particular embodiment of the etch module 900 shown herein is provided only to illustrate the invention, and should not be used to limit the scope of the invention. Etch module 900 includes a chamber 910. A support 940 is potential within a process zone 945 in the chamber 910. A substrate 930 may be positioned on the support 940 by the robotic arm. The substrate 930 may be held in place during the etching process using a mechanical or electrostatic chuck 950 with grooves 955 in which a coolant gas, such as helium, is held to control the temperature of the substrate 930.

During processing of the substrate, the chamber 910 may be maintained at a low pressure and process gas may be introduced into the chamber 110 through a gas supply 960 having a gas source 962 and gas inlets 964 peripherally disposed about the substrate 930. Alternatively, a showerhead gas distributor (not shown) may be positioned above the substrate 930. The process gas may be energized by a gas energizer that couples an energetic electromagnetic field into the process zone 945, such as an inductive, capacitive, or microwave field. In the version shown in FIG. 9, an inductor coil 965 adjacent to the process chamber 910 forms an inductive electric field in the chamber 910 when powered by a coil power supply 970 operating using, for example, an RF voltage at a source power level that may be from about 200 Watts to about 2000 Watts. Alternatively or additionally, a capacitive electric field may be formed in the chamber 910. At least a portion of the support 940 may be electrically conductive to serve as a cathode electrode 975. The cathode electrode 975, in conjunction with sidewalls of the chamber 910 which may be electrically grounded to serve as an anode electrode 980, form process electrodes in the process zone 945 that may capacitively couple to energize the process gas. The cathode 975 may be powered by an electrode power supply 985 operated using, for example, an RF voltage at a power level of from about 10 Watts to about 1000 Watts. The capacitive electric field is substantially perpendicular to the plane of the substrate 930, and may accelerate the plasma species toward the substrate 930 to provide more vertically oriented anisotropic etching of the substrate. The frequency of the RF voltage applied to the process electrodes 975, 980, and/or the inductor coil 965 is typically from about 50 KHz to about 60 MHz, and more typically about 2.2 or 13.56

MHz. In one version, the cathode 975 is also an electrode in a dielectric in the electrostatic chuck 950.

The ceiling 990 of the process chamber 910 can be flat or rectangular shaped, arcuate, conical, dome-shaped, or multi-radius dome-shaped. In one version, the inductor coil 965 covers at least a portion of the ceiling 990 of the process chamber 910 in the form of a multi-radius dome-shaped inductor coil having a "flattened" dome shape that provides more efficient use of plasma source power and increased plasma ion flux uniformity directly over the substrate 930 center.

When capacitively generated, the plasma formed in the process zone 945 may also be enhanced using magnetically enhanced reactors (not shown), in which a magnetic field generator, such as a permanent magnet or electromagnetic coils, are used to apply a magnetic field in the process zone 945 to increase the density and uniformity of the plasma. The magnetic field may comprise a rotating magnetic field with the axis of the field rotating parallel to the plane of the substrate 930, as described in U.S. Pat. No. 4,842,683, which is incorporated herein by reference in its entirety.

Spent process gas and etchant residue are exhausted from the process chamber 910 through an exhaust system 995 capable of achieving a low pressure in the process chamber 910. A throttle valve 200 is provided in the exhaust for controlling the pressure in chamber 910. Also, an optical endpoint measurement system (not shown) may be used to determine completion of the etching process for a specific layer by measuring, for example, the change in light emission of a particular wavelength corresponding to a detectable gaseous species or by other interferometric techniques.

To perform an etching process in the process chamber 910, an energized process gas comprising etchant gas may be provided in the process zone 945. By "energized process gas" it is meant that the process gas is activated or energized to form one or more dissociated species, non-dissociated species, ionic species, and neutral species. The etchant gas composition may be selected to provide high etch rates, and highly selective etching of a particular layer or layers that are being etched.

Method of Use of Etch/Strip Tool 600

An example of the use of etch/strip tool 600 is for the patterning of a conductive film or stack of conductive films into features used in an integrated circuit. An example of such a process is illustrated in FIGS. 10A–10E. According to this embodiment of the present invention, a wafer or substrate, such as wafer 1000 as shown in FIG. 10A, is provided to apparatus 600 in a FOUP 620. Wafer 1000 includes a blanket deposited conductive film 1002 formed across the surface of the wafer. The film 1002 can be for example, but not limited to, a polysilicon film or a composite polysilicon/silicide film stack used to form gate electrodes or capacitor electrodes. In embodiments the conductive thin film 1002 can include a dielectric hard mask, such as silicon nitride or silicon oxynitride film. The film can be a metal or metal alloy film, such as aluminum, copper or tungsten or a stack of metal films which include a main conductor 1001 and a barrier layer 1003 and an antireflective coating (ARC) 1005, such as titanium nitride (TiN)/aluminum (Al)/titanium nitride (TiN) film stack used for the formation of interconnects in an integrated circuit. Formed on conductive film 1002 is a mask 1004, such as a well-known photoresist mask, which has a patterned defined therein which is to be formed in conductive film 1002. In order to process wafer 1000 in accordance with the present invention, the door to transfer chamber 610 is opened as is the connected door on FOUP 622 and wafer 1000 removed from FOUP 622 and brought into atmospheric transfer chamber 610 by robot 612. Robot 612 then transfers the wafer into CD module 700. In CD module 700 the critical dimensions (CD) of the photoresist layer 1004 is measured at various location across wafer 1000 as described with respect to CD measurement tool 700 described in FIG. 7. If the CD measurements taken of CD measurement tool 700 are out of compliance, then wafer 1000 can be removed from CD module 700 by robot 612 and removed from apparatus 600. Alternatively, if the CD measurements are out of compliance, then wafer 1000 can be prepared for rework by removing wafer 1000 from CD module 700 and inserting it into strip chamber 400 whereby the photoresist mask 904 is stripped as desired above. The stripped wafer is then removed from strip module 400 and inserted it into wet clean chamber 200 where wafer 1000 is wet cleaned as described. Wafer 1000 can then be removed from clean module 200 and removed from system 600 where it is now ready for application of a new photoresist mask and patterning.

If the CD measurements of wafer 1000 are found to be in compliance with desired results, then wafer 1000 is removed from CD module 700 and brought into transfer chamber 610 by robot 612. The pressure within load lock 606 is then brought to atmospheric pressure and the door 605 between transfer chamber 610 and load lock 606 opened and wafer placed into load lock 606 by robot 612. The door between transfer chamber 610 and load lock 606 is then closed and the pressure within load lock 606 reduced to the pressure within sub-atmospheric transfer chamber 630.

Next, the door 607 between single wafer load lock 606 and sub-atmospheric transfer chamber 630 is opened and robot 632 removes wafer 1000 from load lock 606 and brings it into transfer chamber 632. Next, if desired, a photoresist trim, as shown in FIG. 10B can be applied to photoresist mask 904 to create a smaller dimension photoresist mask 1006 then is possible by photolithography alone. The photoresist trim can occur in either the etch chambers 900 or 900B or the strip chamber 400B or 400C by exposing the photoresist mask 1004 to thin oxygen plasma. The photoresist trim step is optional.

Next, the door to etch chamber 900 is opened and wafer 1000 transferred from sub-atmospheric transfer chamber 630 into etch chamber 900 and the door closed. Next, conductive film 1002 is anisotropically etched in alignment with photoresist mask 1006 (or 1004) to pattern blanket deposited conductive film 1002 into features 1008. The results of the CD measurements taken in CD module 700 can be used to determine the etch parameters, such as etch gas, time, pressure and power for the etch step.

When etching a metal-containing material, the etchant gases may comprise one or more of halogen-containing gases, such as one or more of $Cl_2$, $BCl_3$, $CCl_4$, $SiCl_4$, $CF_4$, $NF_3$, $SF_6$, HBr, $BBr_3$, $CHF_3$, $C_2F_2$, and the like, and optionally, one or more additive gases, such as inert or non-reactive gases, such as $H_2$, $N_2$, $O_2$, He—$O_2$ and the like. In an exemplary process, the anti-reflective material 1005 is etched by exposing the substrate 1000 to an energized process gas comprising etchant gas comprising, for example, about 90 sccm $Cl_2$ and about 30 sccm $BCl_3$ at a pressure of about 8 mTorr, a source power level of about 1600 Watts, a bias power level of about 145 Watts, a backside helium pressure of about 4 Torr and a cathode temperature of about 50° C. The main metal conductor 1001 may then be etched by an energized process gas comprising etchant gas comprising, for example, about 80 sccm $Cl_2$, about 5 sccm $BCl_3$, and about 10 sccm CHF3 at a pressure of about 14 mTorr, a source power level of about 1600 Watts, a bias power level of about 150 Watts, a backside helium pressure of about 8 Torr and a cathode temperature of about 50° C. Thereafter, the diffusion barrier layer 1003, and optionally a portion of the underlying oxide layer 1007, may be etched by introducing an energized process gas comprising etchant gas comprising, for example, about 30 sccm $Cl_2$, about 5 sccm $BCl_2$, and about 30 sccm $N_2$, or Ar at a pressure of about 10 mTorr, a source power level of about 1600 Watts, a bias power level of about 125 Watts, a backside helium pressure of about 8 Torr and a cathode temperature of about 50° C.

After conductive film 1002 has been etched, the pressure in chamber 900 brought up to the pressure in sub-atmospheric transfer chamber 630 and the door 637 between etch module 900 and sub-atmospheric transfer chamber 630 is opened and wafer 1000 removed from etch module 900 and brought into sub-atmospheric transfer chamber 630 by robot 632. Next, wafer 1000 is transferred into strip module 400B and the door 633 between strip module 400B and transfer chamber 630 sealed. Photoresist mask 1006 is then stripped, as shown in FIG. 10D, in strip module 400B as described above. If the conductive film is a silicon film, wafer 1000 can first be placed into wet clean module 200 (before strip module 400) and exposed to a quick diluted HF etch (100:1) to remove sputter silicon from the sidewalls of the photoresist 1006 to enable better stripping of photoresist 1006 in strip module 400.

The dry cleaning process may also comprise post-etch passivation of the substrate 500, particularly when conductive material has been etched in the etching process, to remove or inactivate corrosive residue species on the substrate 500. To passivate the substrate 500, energized process gas comprising passivating gas may be provided in the process zone 415. The passivating gas composition is selected to remove or inactivate corrosive etchant residue, such as residue species 75 or to prevent the formation of corrosive or contaminant materials on the etched substrate. Passivating gas may comprise one or more of $H_2O$, $NH_3$, $H_2O_2$, $O_2$, $N_2$, $CF_4$, $C_2F_6$, $CHF_3$, $H_2$, $C_3H_2F_6$, $C_2H_4F_2$, or $CH_3F$. In one version, any gas or vapor containing hydrogen can serve as the passivating gas, including hydrogen, water vapor, ammonia, methanol, hydrogen sulfide, and mixtures thereof. In another version, the passivation gases include (i) ammonia and oxygen, or (ii) water vapor, with optional oxygen and nitrogen. When the passivation gas comprises ammonia and oxygen, the volumetric flow ratio of ammonia to oxygen is generally from about 1:1 to about 1:50, more typically from about 1:5 to about 1:20, and most typically about 1:10. For a 5-liter capacity chamber 108, a gas flow comprises 300 sccm $NH_3$ and 3000 sccm $O_2$. Alternatively, a passivating gas comprising at least about 80 volume % $H_2$, and typically about 100 volume % $H_2$, can be used to passivate the etchant residue 75. In one version, a passivating gas comprises about 500 sccm $H_2O$ energized at a power level of about 1400 watts and introduced into the cleaning chamber 400 at a pressure of about 2 Torr for about 15 seconds. When a bubbler is used, an inert carrier gas such as argon or helium can be passed through the bubbler to transport water vapor to the vacuum chamber. Optionally, oxygen, nitrogen or other additive can be added to the passivating gas to enhance passivating. In this version, the passivating gas comprises at least about 20 volume % $H_2O$. The effect of the oxygen and nitrogen addition depends on the ratio of the volumetric flow rate of water vapor ($V_{H2O}$) to the combined volumetric flow rates of oxygen and nitrogen ($V_{O2}+V_{N2}$). A suitable volumetric ratio of water vapor flow rate $V_{H2O}$ to combined volumetric flow rates of oxygen and nitrogen ($V_{O2}+V_{N2}$) for use as a passivating gas is at least about 1:2, more typically from about 1:2 to about 2:1, and most typically about 1:1. As with the stripping process and as discussed in U.S. Pat. No. 5,545,289, the passivating may be either a single step or multiple steps. In one version, the substrate is exposed to the passivating gas for a period of time of from about 10 seconds to about 100 seconds, and more typically for about 45 seconds. In one version, a multi-cycle passivation process, for example a three cycle process, has been discovered to be particularly effective in preventing corrosion.

Once photoresist layer 1006 has been sufficiently removed from substrate 1000 and metal feature 1008 passivated (if desired), the door 633 between strip module 400B and sub-atmospheric chamber 630 is opened and wafer 1000 is removed by robot 632. The pressure within load lock 608 is then reduced or maintained at a sub-atmospheric pressure similar to the sub-atmospheric pressure in transfer chamber 630 and door 611 opened. Wafer 1000 is then transferred into load lock 608 and door 611 sealed. The pressure within load lock 608 is then brought up to atmospheric pressure by inserting a gas, such as nitrogen into load lock 608. The door 609 is then opened and robot 612 removes wafer 1000 from load lock 608. At this point, the wafer can be transferred into CD module 700 to check the critical dimensions of the patterned features 1080 or can be transferred into wet clean module 200 to remove any residual contaminants or particles as shown in FIG. 10E. Wafer 1000 is then subjected to a wet clean process in wet clean module 200. The wet clean can vary from a light clean to an aggressive clean depending upon requirements. After sufficient wet cleaning in module 200 transfer robot 612 removes wafer 1000 from clean module 200 and can either (i) insert it into CD module 700 to check the critical dimension or (ii) can insert it into integrated particle monitor module 300 to determine the cleanliness of wafer 900. If wafer 900 is sufficiently clean then robot 612 removes wafer 900 from integrated particle monitor 300 and transfers it into FOUP 622. If however, wafer 1000 is not sufficiently cleaned of residue, then wafer 1000 can be transferred into strip module 400 coupled to atmospheric transfer chamber 610 and then into wet clean module 200 or alternatively only into wet clean module 200. Wafer 1000 can then once again be inspected in integrated particle monitor 618 and if sufficiently cleaned then removed by robot 612 into FOUP 622.

An example of another use of Etch/Strip tool 600 is in a damascene or dual damascene process such as illustrated in FIGS. 11A–11F. A damascene or dual damascene process is used to form conductive features, such as gate electrodes, capacitor electrodes, interconnects, as well as vias, contacts and plugs in a dielectric layer. In a damascene process, a wafer 1100 is provided which contains a blanket deposited dielectric film 1104, such as but not limited to silicon dioxide, silicon oxynitride, SiOF, BPSG, undoped silicon glass or organic dielectric, and organic dielectrics and can be formed by any well-known technique, such as but not limited to chemical vapor deposition (CVD), high density plasma (HDP) CVD and sputtering. Dielectric layer 1100 can be a single dielectric film or can be a combination or stack of dielectric films. A mask 1102, such as a photoresist mask, is formed on dielectric film 1104. Mask 1102 is patterned with openings 1103 formed which correspond to location where metal or conductive features are desired in dielectric film 1004.

According to this embodiment of the present invention, a wafer, such as wafer 1000, is provided to system 600 in a FOUP 620. To begin processing the access door 621 between transfer chamber 612 and FOUP 622 is opened as it is corresponding door on FOUP 622. Robot 612 removes wafer 1100 from FOUP 560 and brings it into transfer chamber 610. Robot 612 then transfers wafer 1100 to CD measurement module 700. The critical dimensions of photoresist mask 1102 is measured at various parts of the wafer to determine whether or not the critical dimensions of the mask are within spec. If the critical dimensions are outside of the specifications desired wafer 1100 is removed from CD measurement tool 700 by robot 612 and can be either removed from tool 600 or can be placed in strip chamber 400 and then wet clean chamber 200 to remove photoresist mask 1102 so that wafer 1100 is ready for rework. If the critical dimensions of photoresist mask 1102 are with specifications, then robot 612 removes wafer 1100 from CD module 700 and brings it into atmospheric transfer chamber 612. The pressure (if not already at atmospheric pressure) within load lock 606 is then brought up to atmospheric pressure and the door 605 between load lock 606 and atmospheric transfer chamber 610 opened and wafer 1100 transferred into load lock 606 and the door 605 sealed. The pressure within load lock 606 is then evacuated to a pressure substantially equal to the pressure within sub-atmospheric transfer chamber 630. The door 607 between load lock 606 and sub-atmospheric transfer chamber 630 is then opened and robot 632 removes wafer 1100 from load lock 606 and brings it into sub-atmospheric transfer chamber 630. Robot 632 then transfers wafer 1100 into etch module 636 and the door 637 between etch module 636 and sub-atmospheric transfer chamber 630 sealed.

Figure 11A:
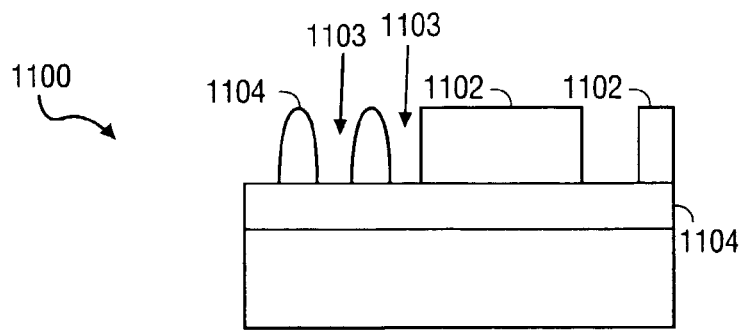
FIGS. 11A–11F illustrate a damascene process in accordance with an embodiment of the present invention.
Figure 11B:
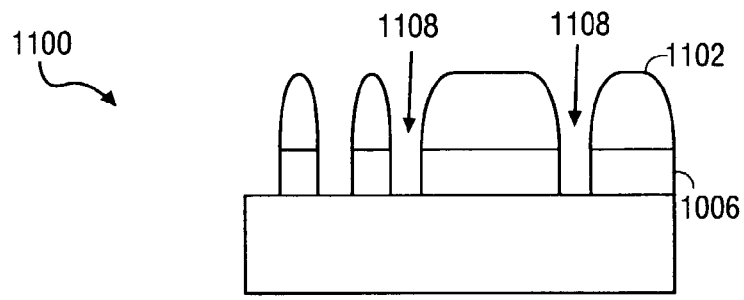
Figure 11C:
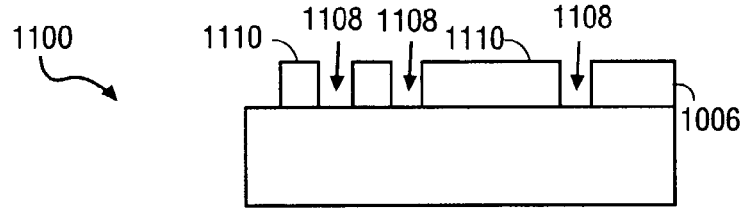

Next, as shown in FIG. 11B, the dielectric layer 1104 is etched, e.g., anisotropically etched, in alignment with mask 1102 to form a patterned dielectric layer 1106 having openings 1108 which correspond to locations where conductive features are desired. Any well-known etch chemistry can be used to etch dielectric film 1104. If dielectric film 1104 is a silicon dioxide film that can be etched with an etch chemistry, such as but not limited to $CF_4$ or $C_2F_6$. Once dielectric layer 1104 has been sufficiently etched, the door 637 between etch chamber 900 and sub-atmospheric chamber 630 is opened and wafer 1100 removed by robot 632. Robot 632 then transfers wafer 1100 into strip or dry clean module 400B and the door between strip module 400B and sub-atomospheric transfer chamber 630 sealed. The photoresist mask is then stripped in strip module 400B as shown in FIG. 11C as described above. Once the photoresist mask 1102 has been sufficiently removed, the door between strip module 400 and transfer chamber 610 opened and robot 612 removes wafer 1100 from strip module 400 and brings it into atmospheric transfer chamber 610. After the photoresist strip in module 400, the photoresist residue and/or etch residue 1110 may remain on wafer 1100.

Robot 632 then transfers wafer 1100 into load lock 608 and door 611 between load lock 608 and sub-atmospheric transfer chamber 630 sealed. The pressure within load lock 608 is then raised to atmospheric pressure by inserting a gas, such as nitrogen ($N_2$) therein. Once the chamber reaches atmospheric pressure, the door 609 between load lock 608 and atmospheric transfer chamber 610 is opened and robot 612 removes wafer 1100 from load lock 608 and brings it into atmospheric transfer chamber 610.

At this time, if desired, wafer 1100 can be inserted into critical dimension monitoring tool 700 were the critical dimensions of the patterned dielectric layer 1106 measured. To determine whether or not the etch results are with specification, the CD results can be used to optimize the etch parameters used in etch module 900 for subsequently etched wafers.

Figure 11D:
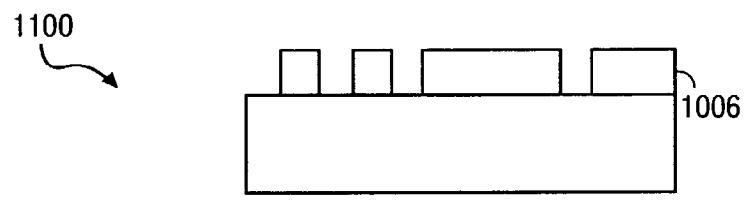

Next, the wafer 1100, as shown in FIG. 11C, is transferred into wet clean 200 and the door between wet clean module 200 and atmospheric transfer chamber 610 sealed. Wafer 1100 is then subjected to a wet clean in wet clean module 200 as described above to remove residue 1110 as shown in FIG. 11D. Once a wafer has been sufficiently wet cleaned as shown in FIG. 11D, wafer 1100 is removed from clean module 614 by robot 612 and transferred into integrated particle monitoring tool 618, wafer 1100 is then scanned in integrated particle monitoring tool 300 to check the amount of particles contained on wafer 1100 to determine if wafer 1100 has been sufficiently cleaned. If wafer 1100 has not been sufficiently cleaned, robot 612 removes wafer 1100 from integrated process module 300 and transfers it into either strip chamber 400 or wet clean 200 or to strip module 400 then wet clean module 200 depending upon the type and amount of residue detected in integrated particle monitoring module 300. If wafer 1100 has been sufficiently cleaned, wafer 1100 can then be removed from the integrated process monitoring tool 300 and transferred into atmospheric transfer chamber 610, wafer 1100 is then transferred by robot 612 out of atmospheric transfer chamber 610 and placed into a FOUP 622.

Figure 11E:
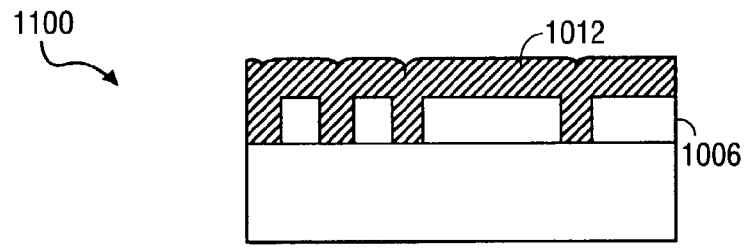
Figure 11F:
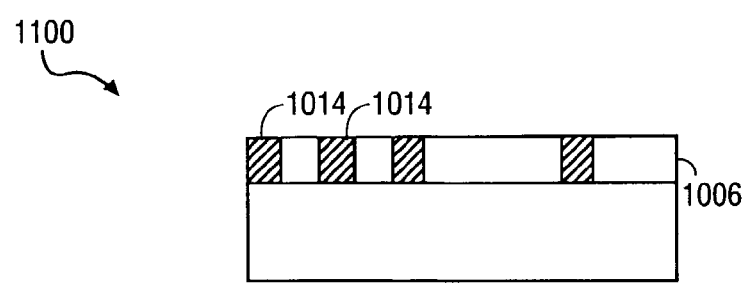

At this point, wafer 1100 can be transferred to a metal deposition module chamber whereby a metal film 1112 or stack of films is blanket deposited over wafer 1100 as shown in FIG. 11E. Conductive film 1112 fills the openings 1108 formed in dielectric layer 1106 and forms on top of dielectric layer 1106. Next, wafer 1100 is transferred to a planarization module, such as a chemical mechanical planarization machine whereby the conductive film 1012 is planarized back to remove the conductive film from the top of the dielectric film 1106 as shown in FIG. 11F. The end result of the damascene process is the formation of conductive features 1114 in dielectric layer 1106 which are planar with dielectric layer 1106. At this time, damascene process in accordance with the present invention is complete. In an alternative embodiment of the damascene or dual damascene process, system 600 can be altered whereby instead of a second etch chamber 900B, a metal chamber, such as a chemical vapor deposition chamber or a sputtering chamber is used therein. In this way, after wafer 1100 has been sufficiently wet cleaned as shown in FIG. 11D and has passed particle inspection in module 300, the wafer 1100 can be transferred through load lock 606 back into sub-atmospheric transfer chamber 630 and placed into the conductive film deposition chamber were the film 1112 is deposited as shown in FIG. 11E. After deposition of the film 1112 the wafer would be removed from the deposition chamber brought into the sub-atmospheric transfer chamber 632 transferred through load lock 608 into the atmospheric transfer chamber 510 where the wafer would be removed into a FOUP 620. If desired, the wafer could be transferred to into the integrated particle monitoring tool 618 to check for defects or particles formed during the deposition process and then the wafer removed from atmospheric transfer chamber 610. Alternatively, the wafer 1100 could be subject to a dry clean in module 400 and/or a wet clean in module 200 after film deposition, if desired.

Another use of etch strip tool 600 is for the stripping of a silicon nitride film formed over a substrate and for the subsequent cleaning of the wafer to remove nitride residues and particles. Generally, silicon nitride films are removed with hot phosphoric acid which has a slow etch rate and therefore requires a long process time. As such, silicon nitride films are generally removed in a batch type (35–50 wafers at a time) process. Etch/strip tool 600 can be used to strip silicon nitride films from a wafer in a single wafer format and can do so without attacking or etching existing oxide films and can strip silicon nitride films in a economic cost effective amount of time.

In order to use tool 1600 to remove a silicon nitride film, all that is required is at least one etch module 900 on sub-atmospheric transfer chamber 630 and at least one wet clean module 200 on atmospheric transfer chamber 610. In an embodiment of the silicon nitride strip process of the present invention, tool 600 contains multiple etch modules 9000 on sub-atmospheric transfer chamber 630 and multiple wet clean chambers 200 on atmospheric transfer chamber 610. In an embodiment of the present invention, the number of wet clean chambers 200 and etch modules 900 are balanced with the desired process times for the nitride stripping and cleaning process so the use of each module is maximized.

Figure 16A:
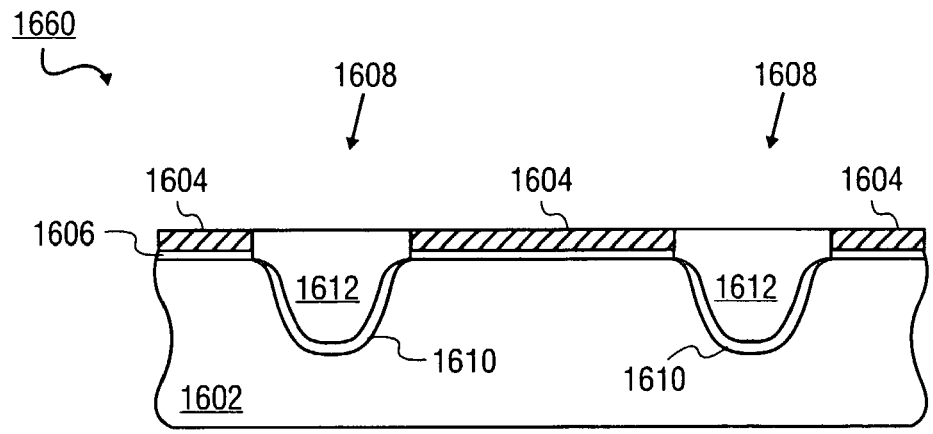
FIG. 16A-16C illustrate a method of removing a silicon nitride film in accordance with an embodiment of the present invention.
Figure 16B:
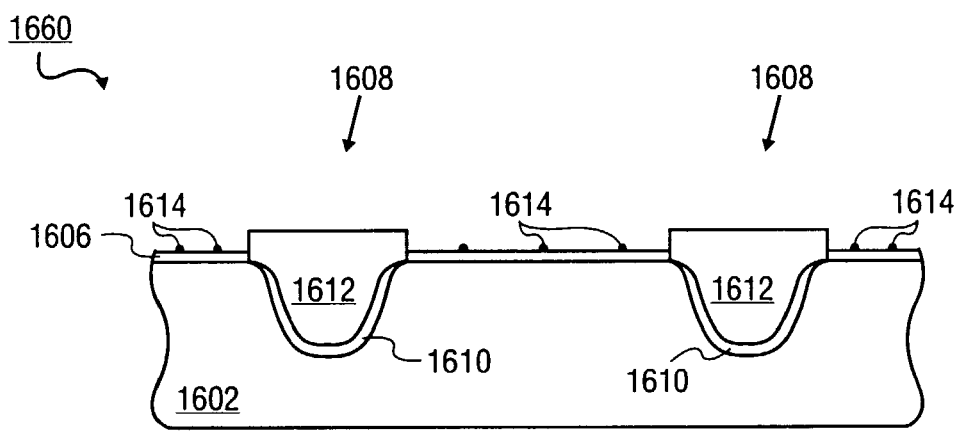
Figure 16C:
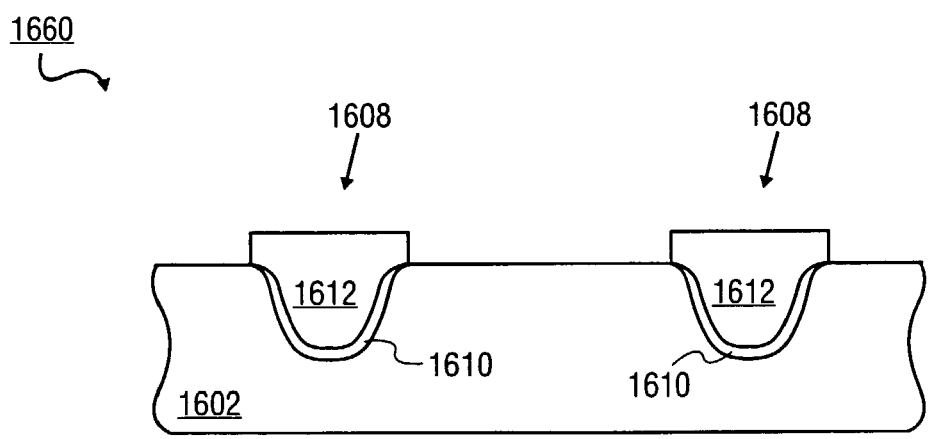

An example of the method of stripping a silicon nitride film utilizing apparatus 600 in accordance with an embodiment of the present invention is illustrated in FIG. 16A-16C. Shown in FIG. 16A, is a substrate or wafer 1600 having a silicon nitride film 1604. In a typical use, silicon nitride film 1604 forms an oxidation resistant mask for the formation of shallow trench isolation regions 1608 formed in the monocrystalline silicon substrate 1602. (Typically a thin pad oxide 1606 is formed between the silicon nitride mask 1604 and the monocrystalline silicon substrate 1602). The mask 1604 is used to define locations where trenches are etched in substrate 1602 for trench isolation regions 1608 to be formed. Additionally, silicon nitride mask 1604 provide an oxidation resistant mask preventing the oxidation of underlying silicon during the formation of a thin thermal oxide 1610 in the trench isolation region 1608. Subsequently the trench is filled with a deposited silicon dioxide film 1612 and polished back to be planar with the top surface of nitride mask 1604 as shown in FIG. 16A. Nitride masks are also used in similar manner during the formation of LOCOS (Local Oxidation of Silicon) isolation regions. In both cases, after the formation of the isolation regions, it is desirable to remove the nitride mask 1604 without etching or affecting the integrity of the oxide isolation regions 1608.

Accordingly, a substrate or wafer having a nitride film, such as substrate 1600 having a nitride film 1604 is brought to apparatus 600 in a FOUP 622. In order to process the wafer 1600 in accordance with the present invention, the door to transfer chamber 610 is opened, as is the connected door to FOUP 622 and wafer 1600 is removed from FOUP 622 and brought into atmospheric transfer chamber 610 by robot 612. The door 605 between atmospheric transfer chamber 610 and load lock 606 is then opened and robot 612 transfers wafer 1600 into load lock 606. The door 605 is sealed and load lock 606 pumped down to the pressure within sub-atmospheric transfer chamber 630. Once the pressure within sub-atmospheric transfer chamber 630 is reached, door 607 opens and robot 632 removes wafer 1600 from load lock 606 and brings it into sub-atmospheric transfer chamber 630. Wafer 1600 is then moved from sub-atmospheric transfer chamber into an etch module 900 and the door between the etch module and the sub-atmospheric transfer chamber sealed and the etch chamber pumped down to the desired process pressure.

Next, the silicon nitride film 1604 is stripped with a dry plasma using a chemistry comprising, for example $CF_4$ or $C_2F_6$. The wafer is exposed to the stripping plasma in module 900 until the silicon nitride mask 1604 has been sufficiently removed. After removing silicon nitride film 1604, silicon residue 1614 may be left on silicon monocrystalline substrate 1602 (or pad oxide 1606 if used) as shown in FIG. 16B.

After stripping silicon nitride mask 1604, the pressure within strip module 900 is brought to the pressure within sub-atmospheric transfer chamber 630 and the door between strip module 900 and sub-atmospheric transfer chamber 630 opened. Robot 632 then removes substrate 1600 from strip module 900 and places it into one of the single wafer load locks 1606 or 1608. The pressure within the load lock is then brought up to atmospheric pressure and the door between the atmospheric transfer chamber and the load lock opened and robot 612 removes the substrate 1600 from the load lock and places it into wet clean module 200. In wet module 200 wafer 1600 is exposed to a wet cleaning process as described above. The wet clean can vary from a light clean consisting of only DI water rinse to a heavy clean utilizing cleaning solutions and etchants as described above.

Once wafer 1600 has been sufficiently cleaned of particles and residue 1614 the wafer is spun dried in module 200. Next, wafer 1600 is removed from clean module 200 by robot 612 and brought into atmospheric transfer chamber 610. Robot 1612 can either i) bring the wafer into FOUP 622 or 624 whereby processing is complete, or can ii) bring wafer 1600 into integrated particle monitoring tool 300 where the surface is checked for particles and residue. If substrate 1600 is placed into integrated particle monitoring tool 300 after monitoring the surface for contaminants depending upon the results of the scan, the wafer is either moved into FOUP 622 or is sent back to either wet clean chamber 200 or back into etch module 900 or both for further processing. Additionally, information gained from the surface monitoring can be used by controller 124 to determine the process parameters for stripping the silicon nitride 1604 on subsequent wafers and can be used to determine cleaning parameters for cleaning subsequent wafer in wet cleaning module 200. For example, if significant silicon nitride is present during the scan in IPM module 300, the exposure time in etch module 900 can be increased or the process chemistry altered for subsequent wafers, or if particles are found a more aggressive cleaning process can be used on subsequent wafers. The change in process parameters would be determined by complex controller 124 from a stored look up table or formula which relates the process parameters to the particle scan of wafer 1600. It is to be appreciated that silicon nitride films used for other purposes than for the formation of isolation regions can be stripped or removed in a similar manner.

Integrated Clean/Gate Tool

Figure 12:
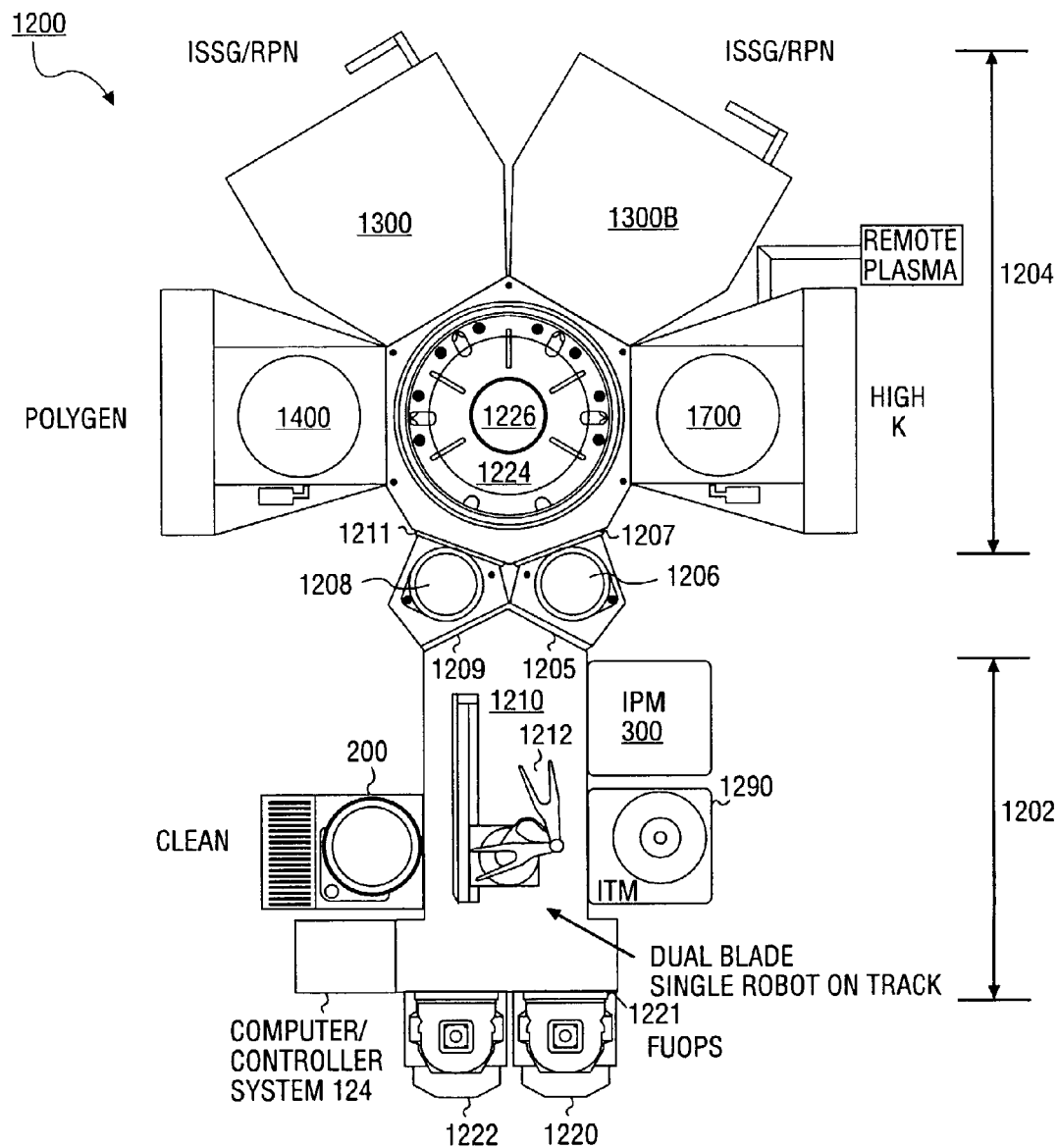
FIG. 12 is an illustration of an atmospheric/sub-atmospheric process tool which can be used to clean, grow a dielectric layer, and deposit a silicon film on a wafer in accordance with an embodiment of the present invention.

FIG. 12 illustrates another atmospheric/sub-atmospheric process tool 1200 in accordance with the present invention. Process tool 1200 is an integrated clean/gate fabrication tool which can be used to clean a wafer and then form a high quality gate dielectric and a gate electrode on a silicon monocrystalline substrate or epitaxial layer. In an embodiment of the present invention, the process tool 1200 includes a module for forming a high dielectric constant film, such as metal oxide dielectric, such as tantalum pentaoxide or titanium oxides.

Integrated clean/gate tool 1200 includes an atmospheric platform 1202 and a sub-atmospheric platform 1204. The sub-atmospheric platform 1204 and the atmospheric platform 1202 are coupled together by a single wafer load lock 1206 and preferably by two single wafer load locks 1206 and

1208. Atmospheric platform 1202 includes a central atmospheric transfer chamber 1210 having a wafer handling device 1212 contained therein. Directly attached to atmospheric transfer chamber 1210 is a single wafer wet cleaning module 200, an integrated particle monitoring tool 300 and an integrated thickness monitoring tool 1290. Wet cleaning module 200, integrated particle monitoring tool 300, and integrated thickness monitoring tool 1290 are each connected to transfer chamber 102 through a separately closable opening or slit valve. Transfer chamber 1210 is maintained at substantially atmospheric pressure during operation. In an embodiment of the present invention, the atmospheric transfer chamber 1210 can be opened or exposed to the atmosphere of a semiconductor fabrication "clean room" in which it is located. In such a case, the transfer chamber 1210 may contain an overhead filter, such as a hepafilter to provide a high velocity flow of clean air or an inert ambient such as $N_2$, to prevent contaminants from finding their way into the atmospheric transfer chamber. In other embodiments, the atmospheric transfer chamber 1210 is a closed system and may contain its own ambient, of clean air or an inert ambient, such as nitrogen gas ($N_2$).

Atmospheric transfer chamber 1210 includes a wafer handling robot 1212 which can transfer a wafer from one module to another module in atmospheric process tool 1202. In an embodiment of the present invention, the wafer handler 1212 is a dual blade, single arm, and single wrist robot. The handling blades both rotate about a single axis coupled to the end of the single arm.

Also coupled to atmospheric transfer chamber 1210 is at least one wafer input/output module 1220 or pod for providing and taking wafers to and from system 1200. In an embodiment of the present invention, the wafer input/output module is a front opening unified pod (FOUP) which contains a cassette of between 13–25 horizontally spaced wafers. In an embodiment of the present invention, apparatus 1200 includes two FOUPs 1220 and 1222, one for providing wafers into system 1200 and one for removing completed or processed wafers from system 1200. Atmospheric transfer chamber 1210 contains sealable access doors 521 for allowing wafer to be transferred into and out of atmospheric transfer chamber 1210. There is an access door 1221 for each FOUP, and each access door is attached to a counterpart door on each FOUP so that when the transfer chamber access door 1221 slides open, it opens the door to the FOUP to provide access for the robot 1212 into the FOUP.

Coupled to the opposite sides of atmospheric transfer chamber 1210 then FOUP 1220 and 1222 is a single wafer load lock 1206 and typically a second single wafer load lock 1208. Single wafer load locks 1206 and 1208 enable a wafer to be transferred from the atmospheric conditions in transfer chamber 1210 to the sub-atmospheric conditions of platform 1204 and allow wafer to be transferred from sub-atmospheric platform 1204 to atmospheric transfer chamber 1210. A sealable door 1205 is located between single wafer load lock 1206 and atmospheric transfer chamber 1210. A sealable door 1207 is located between sub-atmospheric transfer chamber 1224 and load lock 1206. Similarly, a sealable door is located between atmospheric transfer chamber 1210 and load lock 1208, and a sealable door 111 is located between load lock 1208 and sub-atmospheric transfer chamber 1224. Coupled to each of the load locks 1206 and 1108 is a vacuum source which enables the pressure inside load locks 1206 and 1208 to be independently lowered. Additionally, coupled to each load lock 1206 and 1208 is a gas inlet for providing, for example, an inert gas into the load lock to enable the pressure within the load lock to be raised to, for example, to atmospheric pressure. In this way, the pressure within the load lock 1206 and 1208 can be matched to either the pressure within atmospheric transfer chamber 1210 or the pressure within sub-atmospheric transfer chamber 1224. Although, load locks 1206 and 1208 are ideally low volume single wafer load locks to enable fast wafer transfers between the atmospheric transfer chamber and the sub-atmospheric transfer chamber, load locks 1206 and 1208, however, can be larger multiple wafer load locks which can hold multiple wafers at a single time, if desired.

Attached to the opposite ends of the single wafer load locks 1206 and 1208 is a sub-atmospheric transfer chamber 1224 having a wafer handling device 1226 contained therein. Sub-atmospheric transfer chamber 1224 is said to be sub-atmospheric transfer chamber because transfer chamber 1224 is held at a pressure less than atmospheric pressure and preferably between $10^{-3}$ to 50 Torr while in operation and while passing the wafers to the various sub-atmospheric process modules coupled thereto.

Directly attached to sub-atmospheric transfer chamber 1224 is a single wafer thermal process chamber 1300 which can be used to grow a silicon dioxide or silicon oxynitride or silicon nitride dielectric film on wafer. Additionally, also directly attached to sub-atmospheric transfer chamber 1224 is a polysilicon deposition chamber 1400 which can be used to form a polysilicon film, for example, a polysilicon gate electrode. In an embodiment of the present invention, process tool 1200 includes a high k dielectric film deposition module 1700 directly attached to sub-atmospheric transfer chamber 1224 to enable the formation of a high dielectric constant film, such as metal dielectrics, e.g. titanium oxides, tantanlum oxides, zirconium oxide, and hafnium oxides. Additionally, in an embodiment of the present invention, apparatus 1200 includes a second thermal process chamber 1300 in order to better balance the wafer throughput of wafer through process tool 1100. Thermal process tool 1300 and polysilicon deposition tool 1400 are connected to sub-atmospheric transfer chamber 1224 through separately closable and sealable openings.

Apparatus 1100 also includes a system computer or control device 124 which is coupled and controls each module coupled to atmospheric transfer chamber 1210 and controls each sub-atmospheric module coupled to sub-atmospheric transfer chamber 1224, controls load locks 1206 and 1208 as well as the operation of robots 1212 and 1226. Computer 124 enables a feedback from one module to be used to control the flow of a wafer through system 1200 and/or to control the process or operation of the other modules of system 1200.

Thermal Process Module

Figure 13A:
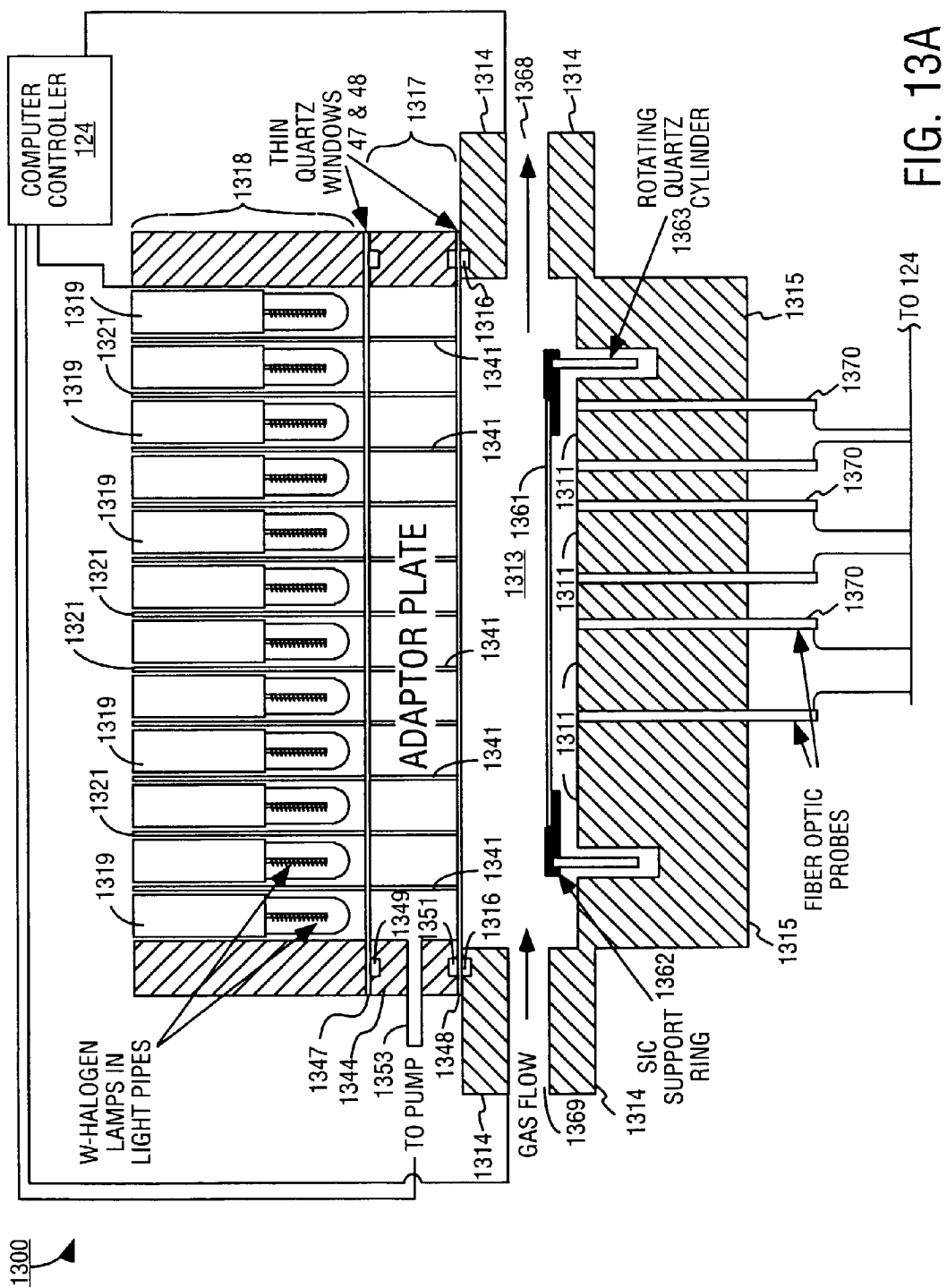
FIG. 13A illustrate a rapid thermal heating apparatus which can grow a dielectric layer in accordance with an embodiment of the present invention.
Figure 13B:
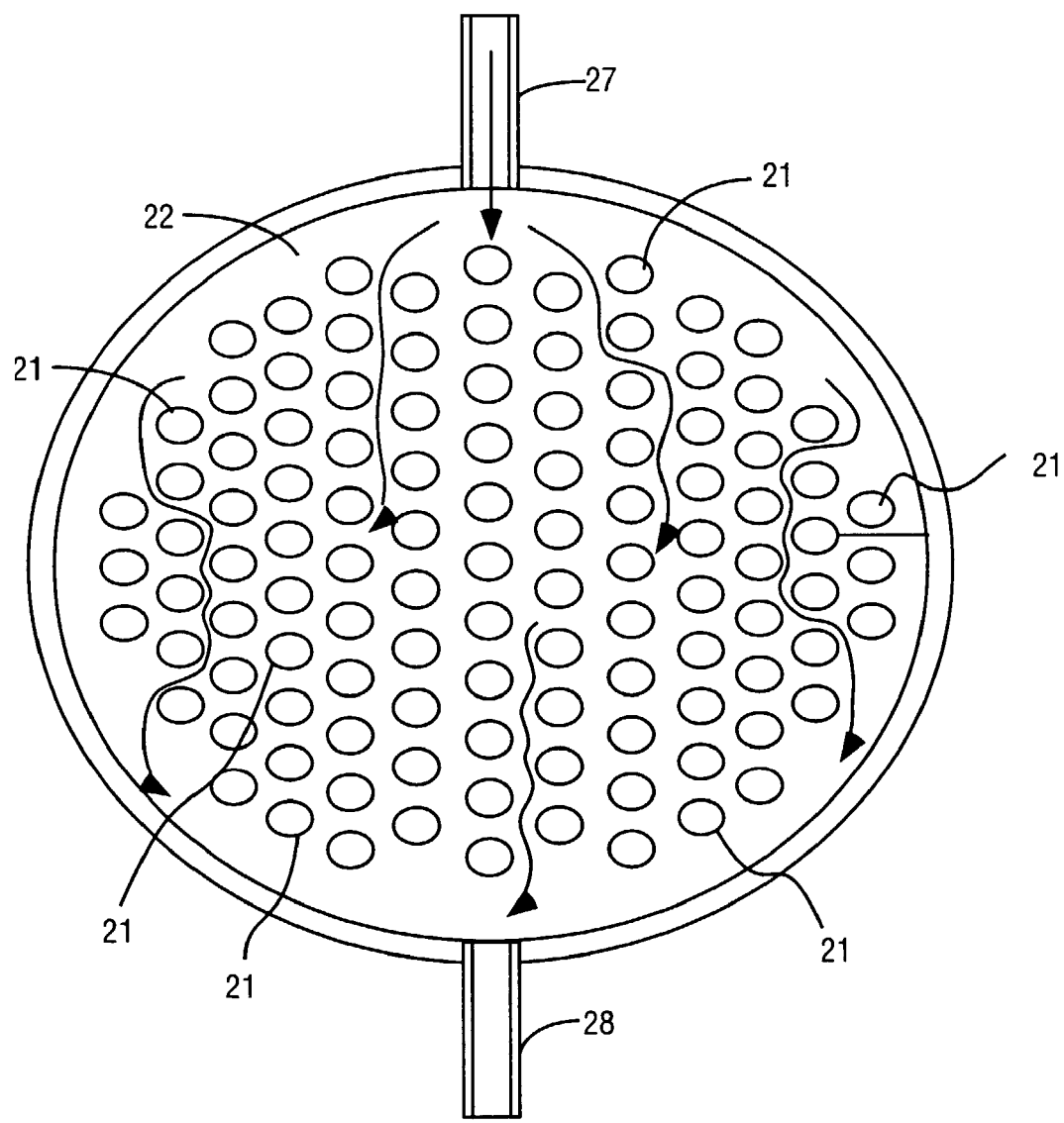
FIG. 13B illustrate the light source placement in the rapid thermal heating apparatus of FIG. 13A.

An example of a thermal process module which can be used as thermal process modules 1300 or 1300B is illustrated in FIG. 13A-B. FIG. 13A-B illustrates an insitu steam generation (ISSG) process tool 1300 which can be used to grow an oxide film, such as a high quality gate dielectric film. ISSG chamber 1300 can be adapted to include nitrogen containing gas so that silicon nitride films or silicon oxynitride films can also be formed.

Module 1300 as shown in FIG. 13A, includes an evacuated process chamber 1313 enclosed by a sidewall 1314 and a bottom wall 1315. Sidewall 1314 and bottom wall 1315 are preferably made of stainless steel. The upper portion of sidewall 1314 of chamber 1313 is sealed to window assembly 1317 by "O" rings 1316. A radiant energy light pipe assembly 1318 is positioned over and coupled to window assembly 1317. The radiant energy assembly 1318 includes a plurality of tungsten halogen lamps 1319, for example Sylvania EYT lamps, each mounted into a light pipe 1321 which can be a stainless steel, brass, aluminum or other metal.

A substrate or wafer 1361 is supported on its edge in side chamber 1313 by a support ring 1362 made up of silicon carbide. Support ring 1362 is mounted on a rotatable quartz cylinder 1363. By rotating quartz cylinder 1363 support ring 1362 and wafer 1361 can be caused to rotate. An additional silicon carbide adapter ring can be used to allow wafers of different diameters to be processed (e.g., 150 mm as well as 200 mm). The outside edge of support ring 1362 preferably extends less than two inches from the outside diameter of wafer 1361. The volume of chamber 1313 is approximately two liters.

The bottom wall 1315 of apparatus 1300 includes a gold coated top surface 1311 for reflecting energy onto the backside of wafer 1361. Additionally, rapid thermal heating apparatus 1300 includes a plurality of fiber optic probes 1370 positioned through the bottom wall 1315 of apparatus 1300 in order to detect the temperature of wafer 1361 at a plurality of locations across its bottom surface. Reflections between the backside of the silicon wafer 1361 and reflecting surface 1311 create a blackbody cavity which makes temperature measurement independent of wafer backside emissivity and thereby provides accurate temperature measurement capability.

Rapid thermal heating apparatus 1300 includes a gas inlet 1369 formed through sidewall 1314 for injecting process gas into chamber 1313 to allow various processing steps to be carried out in chamber 1313. Coupled to gas inlet 1369 is a source, such as a tank, of oxygen containing gas such as $O_2$ and a source, such as a tank, of hydrogen containing gas such as $H_2$. In an embodiment of the present invention, a nitrogen containing gas, such as $NH_3$, or $N_2O$ is produced to enable the formation of silicon oxynitride films. Positioned on the opposite side of gas inlet 1369, in sidewall 1314, is a gas outlet 1368. Gas outlet 1368 is coupled to a vacuum source, such as a pump, to exhaust process gas from chamber 1313 and to reduce the pressure in chamber 1313. The vacuum source maintains a desired pressure while process gas is continually fed into the chamber during processing.

Lamps 1319 include a filament wound as a coil with its axis parallel to that of the lamp envelope. Most of the light is emitted perpendicular to the axis towards the wall of the surrounding light pipe. The light pipe length is selected to at least be as long as the associated lamp. It may be longer provided that the power reaching the wafer is not substantially attenuated by increased reflection. Light assembly 1318 preferably includes 187 lamps positioned in a hexagonal array or in a "honeycomb shape" as illustrated in FIG. 13B. Lamps 1319 are positioned to adequately cover the entire surface area of wafer 1361 and support ring 1362. Lamps 1319 are grouped in zones which can be independently controlled to provide for extremely uniform heating of wafer 1361. Heat pipes 1321 can be cooled by flowing a coolant, such as water, between the various heat pipes. The radiant energy source 1318 comprising the plurality of light pipes 1321 and associated lamps 1319 allows the use of thin quartz windows to provide an optical port for heating a substrate within the evacuative process chamber.

Window assembly 1317 includes a plurality of short light pipes 1341 which are brazed to upper/lower flange plates which have their outer edges sealed to an outer wall 1344. A coolant, such as water, can be injected into the space between light pipes 1341 to serve to cool light pipes 1341 and flanges. Light pipes 1341 register with light pipes 1321 of the illuminator. The water cooled flange with the light pipe pattern which registers with the lamp housing is sandwiched between two quartz plates 1347 and 1348. These plates are sealed to the flange with "O" rings 1349 and 1351 near the periphery of the flange. The upper and lower flange plates include grooves which provide communication between the light pipes. A vacuum can be produced in the plurality of light pipes 1341 by pumping through a tube 1353 connected to one of the light pipes 1341 which in turn is connected to the rest of the pipes by a very small recess or groove in the face of the flange. Thus, when the sandwiched structure is placed on a vacuum chamber 1313 the metal flange, which is typically stainless steel and which has excellent mechanical strength, provides adequate structural support. The lower quartz window 1348, the one actually sealing the vacuum chamber 1313, experiences little or no pressure differential because of the vacuum on each side and thus can be made very thin. The adapter plate concept of window assembly 1317 allows quartz windows to be easily changed for cleaning or analysis. In addition, the vacuum between the quartz windows 1347 and 1348 of the window assembly provides an extra level of protection against toxic gasses escaping from the reaction chamber.

Rapid thermal heating apparatus 1300 is a single wafer reaction chamber capable of ramping the temperature of a wafer 1361 or substrate at a rate of 25–100° C./sec. Rapid thermal heating apparatus 1300 is said to be a "cold wall" reaction chamber because the temperature of the wafer during the oxidation process is at least 400° C. greater than the temperature of chamber sidewalls 1314. Heating/cooling fluid can be circulated through sidewalls 1314 and/or bottom wall 1315 to maintain walls at a desired temperature. For a steam oxidation process utilizing the insitu moisture generation of the present invention, chamber walls 1314 and 1315 are maintained at a temperature greater than room temperature (23° C.) in order to prevent condensation. Rapid thermal heating apparatus 1300 is preferably configured as part of a "cluster tool" which includes a load lock and a transfer chamber with a robotic arm.

Chemical Vapor Deposition Module

Figure 14A:
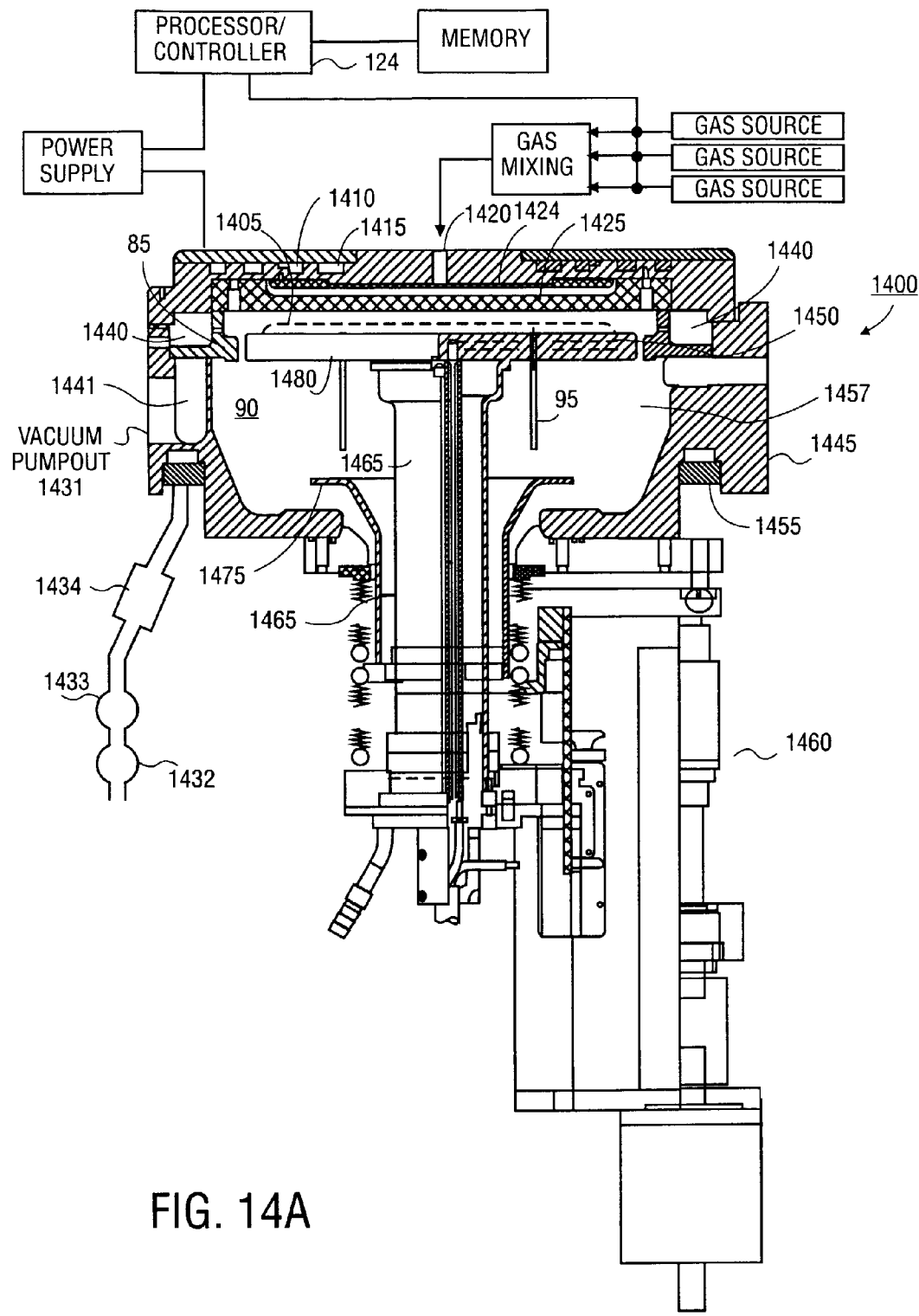
FIG. 14A shows an illustration of a cross-sectional side view a processing chamber comprising of a resistive heater in a "wafer-process" position in accordance with an embodiment of the invention through first cross-section and a second cross-section each through one-half of the chamber.
Figure 14B:
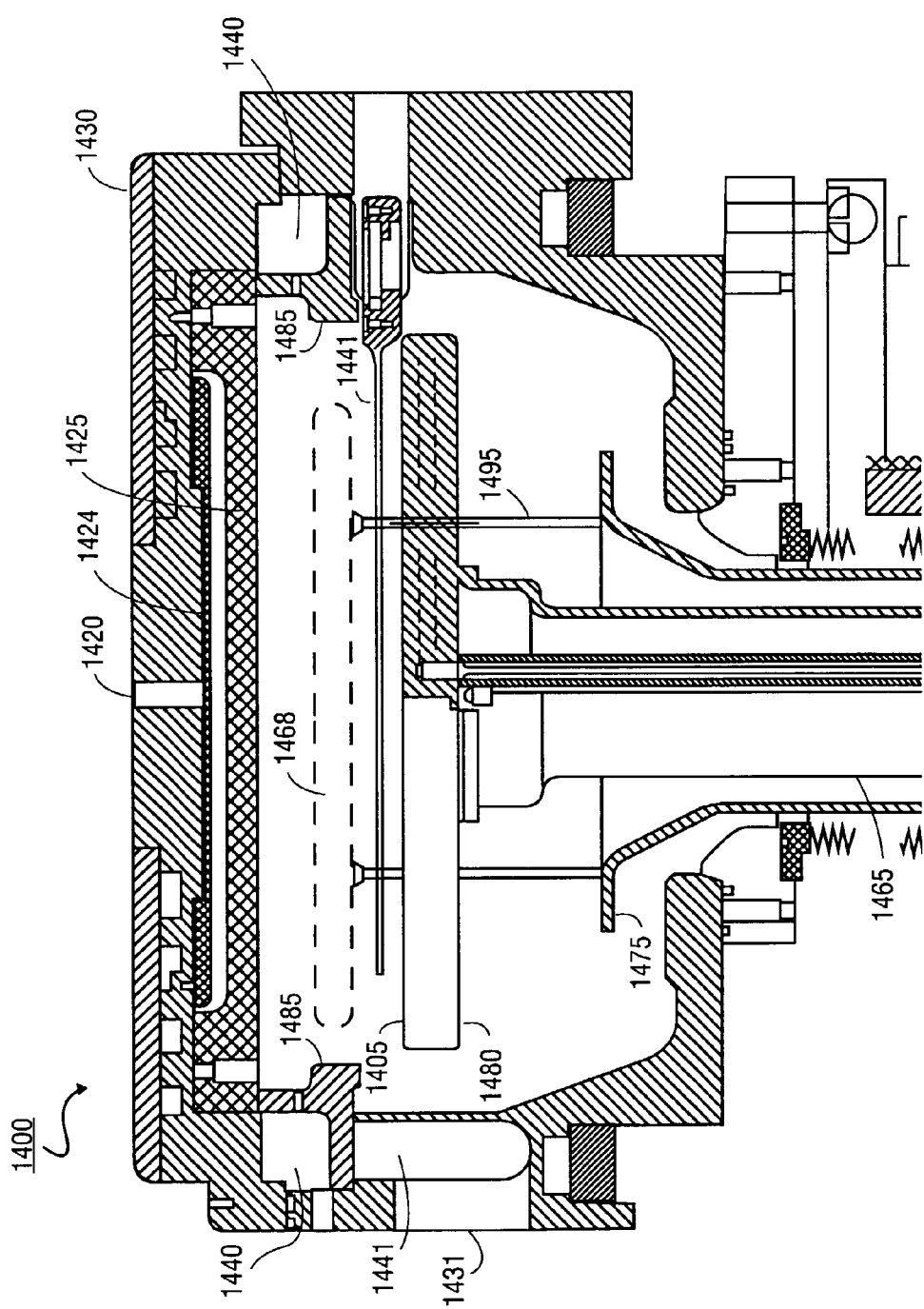
FIG. 14B shows an illustration of a similar cross-sectional side view as in FIG. 14A in a wafer separate position.
Figure 14C:
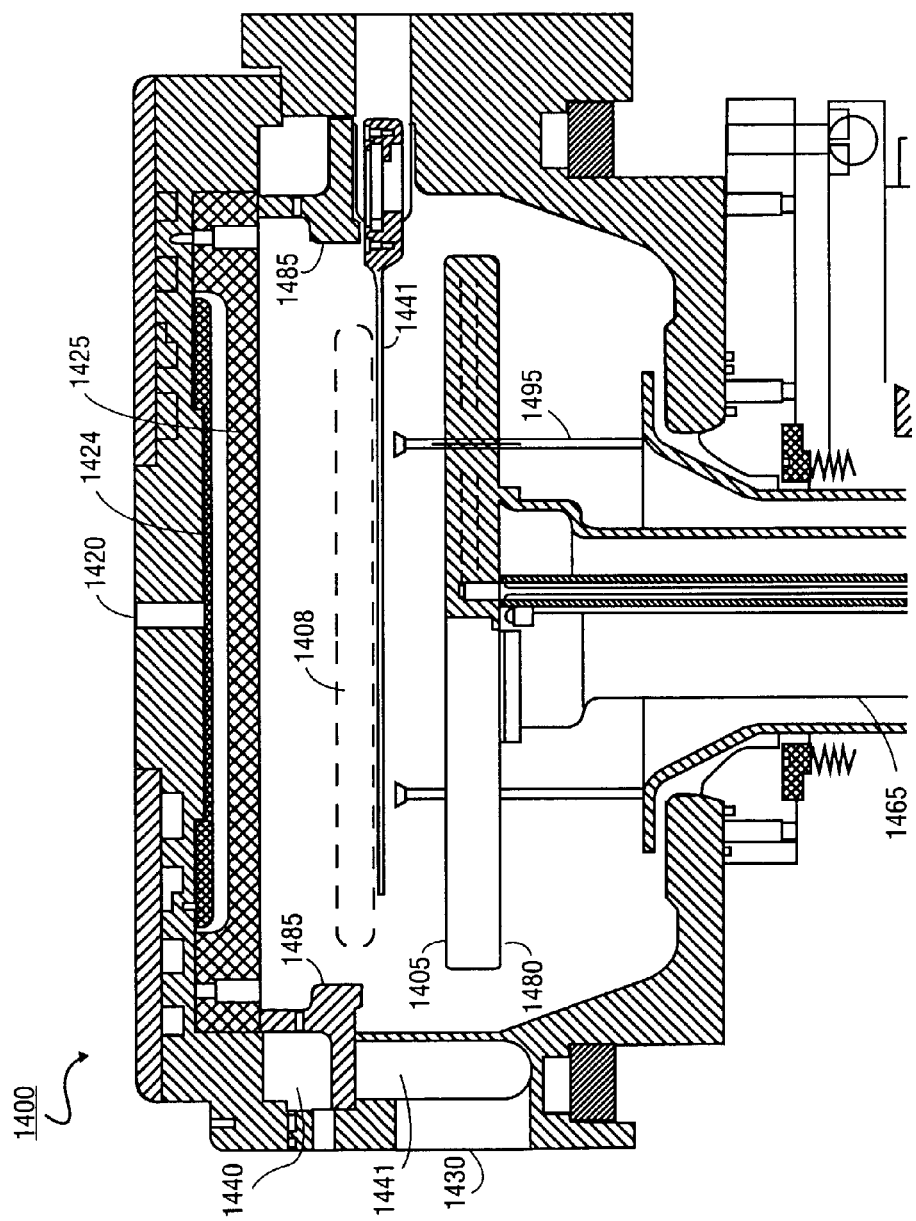
FIG. 14C shows an illustration of a similar cross-sectional side view as in FIG. 14A in a wafer load position.

FIGS. 14A–14C illustrates a low pressure chemical vapor deposition (LPCVD) chamber 1400 which can be used as silicon deposition module 1400 to deposit a doped or undoped polycrystalline silicon film. The LPCVD chamber 1400 illustrated in FIGS. 14A–14C is constructed of materials such that, in this embodiment, a pressure of greater than or equal to 100 Torr can be maintained. For the purpose of illustration, a chamber of approximately in the range of 5–6 liters is described. FIG. 14A illustrates the inside of process chamber body 1445 in a "wafer-process" position. FIG. 14B shows the same view of the chamber in a "wafer-separate" position. FIG. 14C shows the same cross-sectional side view of the chamber in a "wafer-load" position. In each case, a wafer 500 is indicated in dashed lines to indicate its location in the chamber.

FIG. 14A-14C show chamber body 1445 that defines reaction chamber 1490 in which the thermal decomposition of a process gas or gases takes place to form a film on a wafer (e.g., a CVD reaction). Chamber body 1445 is constructed, in one embodiment, of aluminum and has passages 1455 for water to be pumped therethrough to cool chamber 1445 (e.g., a "cold-wall" reaction chamber). Resident in chamber 1490 is resistive heater 1480 including, in this view, susceptor 1405 supported by shaft 1465. Susceptor 1405 has a surface area sufficient to support a substrate such as a semiconductor wafer 1400 (shown in dashed lines).

Process gas enters otherwise sealed chamber 1490 through gas distribution port 1420 in a top surface of chamber lid 1430 of chamber body 1445. The process gas then goes through blocker plate 1424 to distribute the gas about an area consistent with the surface area of a wafer. Thereafter, the process gas is distributed through perforated face plate 1425 located, in this view, above resistive heater 1480 and coupled to chamber lid 1430 inside chamber 1490. One objective of the combination of blocker plate 1424 with face plate 1425 in this embodiment is to create a uniform distribution of process gas at the substrate, e.g., wafer.

A substrate 1408, such as a wafer, is placed in chamber 1490 on susceptor 1405 of heater 1480 through entry port 1440 in a side portion of chamber body 1445. To accommodate a wafer for processing, heater 1480 is lowered so that the surface of susceptor 1405 is below entry port 1440 as shown in FIG. 14C. By a robotic transfer mechanism 1226, a wafer 1408 is loaded by way of, for example, a transfer blade 1441 into chamber 1490 onto the superior surface of susceptor. Once loaded, entry 1440 is sealed and heater 1480 is advanced in a superior (e.g., upward) direction toward face plate 1425 by lifter assembly 1460 that is, for example, a stepper motor. The advancement stops when the wafer 500 is a short distance (e.g., 400–700 mils) from face plate 1425 (see FIG. 14A). In the wafer-process position, chamber 1490 is effectively divided into two zones, a first zone above the superior surface of susceptor 1405 and a second zone below the inferior surface of susceptor 1405. It is generally desirable to confine polysilicon film formation to the first zone.

At this point, process gas controlled by a gas panel flows into chamber 1490 through gas distribution port 1420, through blocker plate 1424 and perforated face plate 1425. Process gas thermally decomposes to form a film on the wafer. At the same time, an inert bottom-purge gas, e.g., nitrogen, is introduced into the second chamber zone to inhibit film formation in that zone. In a pressure controlled system, the pressure in chamber 1490 is established and maintained by a pressure regulator or regulators coupled to chamber 1490. In one embodiment, for example, the pressure is established and maintained by baretone pressure regulator(s) coupled to chamber body 1445 as known in the art. In this embodiment, the baretone pressure regulator(s) maintains pressure at a level of equal to or greater than 150 Torr.

Residual process gas is pumped from chamber 1490 through pumping plate 1485 to a collection vessel at a side of chamber body 1445 (vacuum pumpout 1431). Pumping plate 1485 creates two flow regions resulting in a gas flow pattern that creates a uniform silicon layer on a substrate.

Pump 1432 disposed exterior to apparatus provides vacuum pressure within pumping channel 1440 (below channel 1440 in FIGS. 14A–14C) to draw both the process and purge gases out of the chamber 1490 through vacuum pump-out 1431. The gas is discharged from chamber 1490 along a discharge conduit 1433. The flow rate of the discharge gas through channel 1440 is preferably controlled by a throttle valve 1434 disposed along conduit 1433. The pressure within processing chamber 1490 is monitored with sensors (not shown) and controlled by varying the cross-sectional area of conduit 1433 with throttle valve 1434. Preferably, a controller 124 receives signals from the sensors that indicate the chamber pressure and adjusts throttle valve 1434 accordingly to maintain the desired pressure within chamber 1490. A suitable throttle valve for use with the present invention is described in U.S. Pat. No. 5,000,225 issued to Murdoch and assigned to Applied Materials, Inc., the complete disclosure by which is incorporated herein by reference.

Once wafer processing is complete, chamber 1390 may be purged, for example, with an inert gas, such as nitrogen. After processing and purging, heater 1480 is advanced in an inferior direction (e.g., lowered) by lifter assembly 1460 to the position shown in FIG. 14B. As heater 1480 is moved, lift pins 1495, having an end extending through openings or throughbores in a surface of susceptor 1405 and a second end extending in a cantilevered fashion from an inferior (e.g., lower) surface of susceptor 1405, contact lift plate 1475 positioned at the base of chamber 1490. As is illustrated in FIG. 14B, in one embodiment, at the point, lift plate 1475 remains at a wafer-process position (i.e., the same position the plate was in FIG. 14A). As heater 1480 continues to move in an inferior direction through the action of assembly 1460, lift pins 1495 remain stationary and ultimately extend above the susceptor or top surface of susceptor 1405 to separate a processed wafer from the surface of susceptor 1405. The surface of susceptor 1405 is moved to a position below opening 1440.

Once a processed wafer is separated from the surface of susceptor 1405, transfer blade 1441 of a robotic mechanism is inserted through opening 1440 beneath the heads of lift pins 1495 and a wafer supported by the lift pins. Next, lifter assembly 1460 inferiorly moves (e.g., lowers) heater 1480 and lifts plate 1475 to a "wafer load" position. By moving lift plates 1475 in an inferior direction, lift pins 1495 are also moved in an inferior direction, until the surface of the processed wafer contacts the transfer blade. The processed wafer is then removed through entry port 1440 by, for example, a robotic transfer mechanism 1226 that removes the wafer and transfers the wafer to the next processing step. A second wafer may then be loaded into chamber 1490. The steps described above are generally reversed to bring the wafer into a process position. A detailed description of one suitable lifter assembly 1460 is described in U.S. Pat. No. 5,772,773, assigned to Applied Materials, Inc. of Santa Clara, Calif.

In a high temperature operation, such as LPCVD processing to form a polycrystalline silicon film, the heater temperature inside chamber 1490 can be as high as 750° C. or more. Accordingly, the exposed components in chamber 1490 must be compatible with such high temperature processing. Such materials should also be compatible with the process gases and other chemicals, such as cleaning chemicals (e.g., $NF_3$) that may be introduced into chamber 1490. Exposed surfaces of heater 1480 may be comprised of a variety of materials provided that the materials are compatible with the process. For example, susceptor 1405 and shaft 1465 of heater 1480 may be comprised of similar aluminum nitride material. Alternatively, the surface of susceptor 1405 may be comprised of high thermally conductive aluminum nitride materials (on the order of 95% purity with a thermal conductivity from 140 W/mK while shaft 1465 is comprised of a lower thermally conductive aluminum nitride. Susceptor 1405 of heater 1480 is typically bonded to shaft 65 through diffusion bonding or brazing as such coupling will similarly withstand the environment of chamber 1490.

FIG. 14A also shows a cross-section of a portion of heater 1480, including a cross-section of the body of susceptor 1405 and a cross-section of shaft 1465. In this illustration, FIG. 14A shows the body of susceptor 1405 having two heating elements formed therein, first heating element 1450 and second heating element 1457. Each heating element (e.g., heating element 1450 and heating element 1457) is made of a material with thermal expansion properties similar to the material of the susceptor. A suitable material includes molybdenum (Mo). Each heating element includes a thin layer of molybdenum material in a coiled configuration.

In FIG. 14A, second heating element 1457 is formed in a plane of the body of susceptor 1405 that is located inferior (relative to the surface of susceptor in the figure) to first heating element 1450. First heating element 1450 and second heating element 1457 are separately coupled to power terminals. The power terminals extend in an inferior direction as conductive leads through a longitudinally extending opening through shaft 1465 to a power source that supplies the requisite energy to heat the surface of susceptor 1405. Extending through openings in chamber lid are two pyrometers, first pyrometer 1410 and second pyrometer 1415. Each pyrometer provides data about the temperature at the surface of susceptor 1405 (or at the surface of a wafer on susceptor 1405). Also of note in the cross-section of heater 1480 as shown in FIG. 14A is the presence of thermocouple 1470. Thermocouple 1470 extends through the longitudinally extending opening through shaft 1465 to a point just below the superior or top surface of susceptor 1405.

High K Dielectric Deposition Module

Figure 17A:
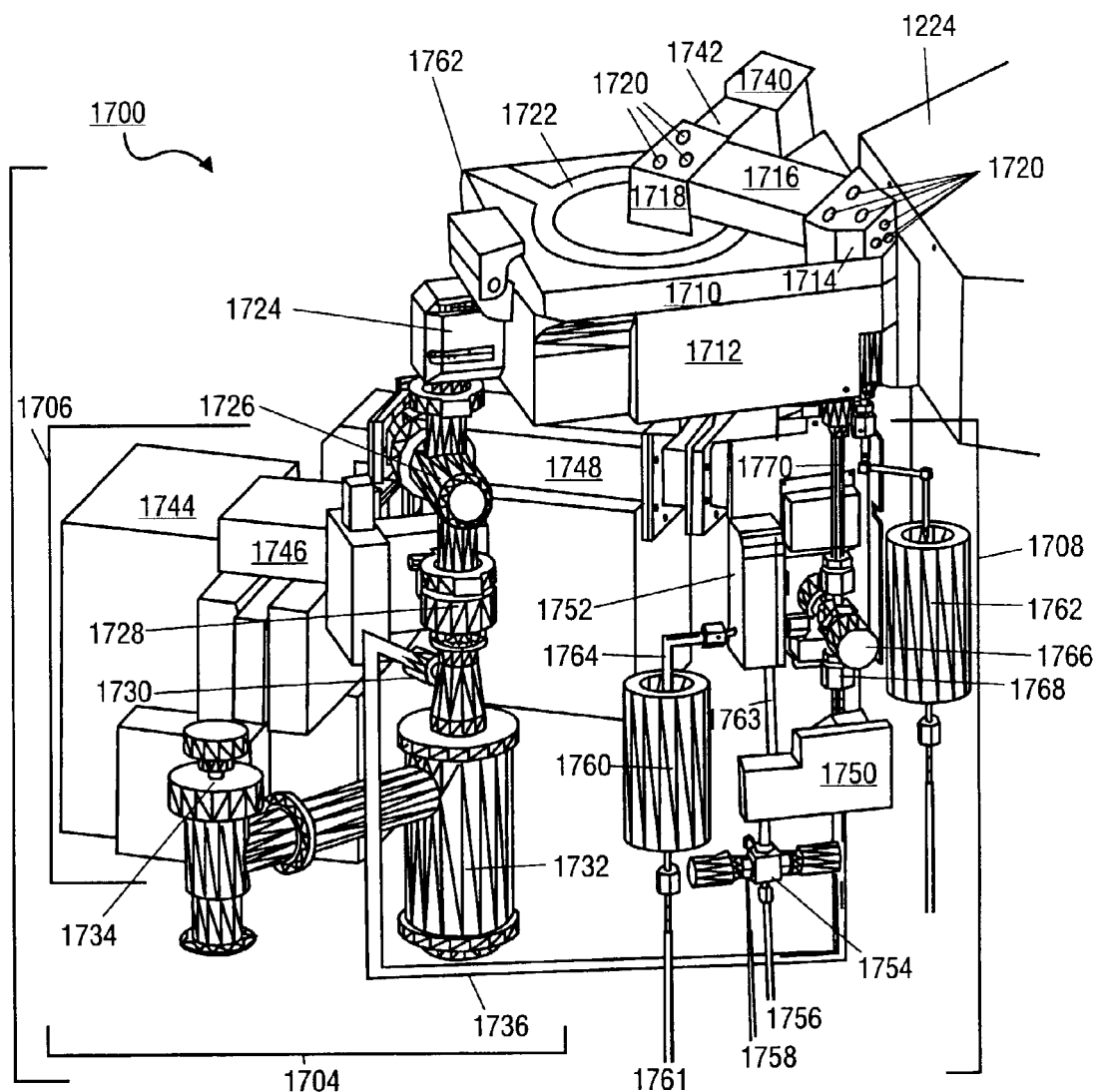
FIG. 17A is a perspective view of high k dielectric deposition module of the present invention.

A high k dielectric deposition module 1700 which can be used in the present invention is shown in FIG. 17A and includes a liquid delivery system, chemical vapor deposition (CVD) chamber, exhaust system and remote plasma generator which together comprises a unique system especially useful in depositing thin metal-oxide films as well as other films requiring vaporization of low volatility precursor liquids. The system also provides for an in-situ cleaning process for the removal of metal-oxide films deposited on interior surfaces of a deposition chamber. The system also has application in the use of fabricating metal-oxide dielectrics useful in making ultra large scale integration (ULSI) DRAM and other advanced feature electronic devices which require the deposition of high dielectric constant materials. In general, devices that can be made with the system of the present invention are those devices characterized by having one or more layers of insulating, dielectric or electrode material on a suitable substrate such as silicon. One skilled in the art will appreciate the ability to use alternative configuration and process details to the disclosed specifics without departing from the scope of the present invention. In other instances, well known semiconductor processing equipment and methodology have not been described in order not to unnecessarily obscure the present invention.

FIG. 17A is a perspective view of the high k deposition module 1700 showing the relative positions of the main components of the present invention. High k deposition module 1700 contains a processing chamber 1702, a heat exhaust system 1704, a remote plasma generator 1706 and a vapor delivery system 1708. Also shown in FIG. 17A is a sub-atmospheric transfer chamber 1224. Processing chamber 1702 is comprised of lid 1710 and chamber body 1712 and is attached to central transfer chamber 1224. Gases supplied via liquid delivery system 1708 are provided into a processing region (not shown) within chamber 1708 via temperature controlled conduits formed within inlet block 1714, mixing block 1716 and central block 1718. Cartridge style heaters 1720 are integrally formed into each block and, in conjunction with individual thermocouples and controllers, maintain temperature set points within the conduits. For clarity, individual thermocouples and controllers have been omitted. Not visible in FIG. 17A but an aspect of the module is embedded lid heater located intregal to lid 1710 beneath heater backing plate 1722.

Chamber 1702 processing by-products are exhausted via heated exhaust system 1704 which is coupled to chamber 1702 via exhaust port 1724. Also shown are isolation valve 1726, throttle valve 1728, chamber by-pass 1730, cold trap 1732 and cold trap isolation valve 1734. For clarity, specific embodiments of vacuum pump and wafer fabrication plant exhaust treatment systems are not shown. In order to provide a clearer representation of the interrelationship between and relative placement of each of the components of heated exhaust system 1704, the jacket type heaters, thermocouples and controllers used to maintain setpoint temperatures in exhaust port 1724, isolation valve 1726, throttle valve 1728, chamber by-pass 1730, and by-pass line 1736 have been omitted.

Activated species are generated by remote plasma generator 1706 and provided to a processing region within chamber 1702 via conduits within activated species inlet block 1740, activated species block 1742 and central block 1718. Other components of remote plasma generator 1706 such as magnetron, auto tuner controller 1746, and auto tuner 1748 are visible in FIG. 17A.

One of the main components of liquid delivery system 1708 is liquid flow meter 1750 and vaporizer 1752. Three-way inlet valve 1754 allows either precursor 1756 or solvent 1758 into vapor delivery system 1708. Heat exchangers 1760 and 1762 preheat carrier gases and process gases respectively. Heated carrier gases travel via a carrier gas supply line 1764 to vaporizer 1752 in order to facilitate more complete vaporization within vaporizer 1752 as well as carry vaporized liquids to chamber 1702. After vaporization in vaporizer 1752, chamber by-pass valve 1766 allows vapor to be ported either to processing region in chamber 1702 via outlet 1762 or to exhaust system 1704 via outlet 1768 which is coupled to heated by-pass line 1736. A jacket style heater, thermocouple and controller which maintain the temperature of chamber by-pass valve 1766 and vaporizer precursor line 1770 as well as the jacket style heater, thermocouple and controller which maintain the temperature of by-pass line 1736 have been omitted so as not to obscure the components of liquid delivery system 1708 and their relationship to chamber 1702 and heated exhaust system 1704.

The size and dimensions of the various components and the placement of these components in relation to each other are determined by the size of the substrate on which the processes of the present invention are being formed. A preferred embodiment of the invention will be described herein with reference to a high k deposition module 1700 adapted to process circular substrate, such as a silicon wafer, having a 200 mm diameter. Although described in reference to a single substrate, one of ordinary skill in the art of semiconductor processing will appreciate that the methods and various embodiments of the present invention are adaptable to the processing of multiple substrates within a single chamber 1702.

Figure 17B:
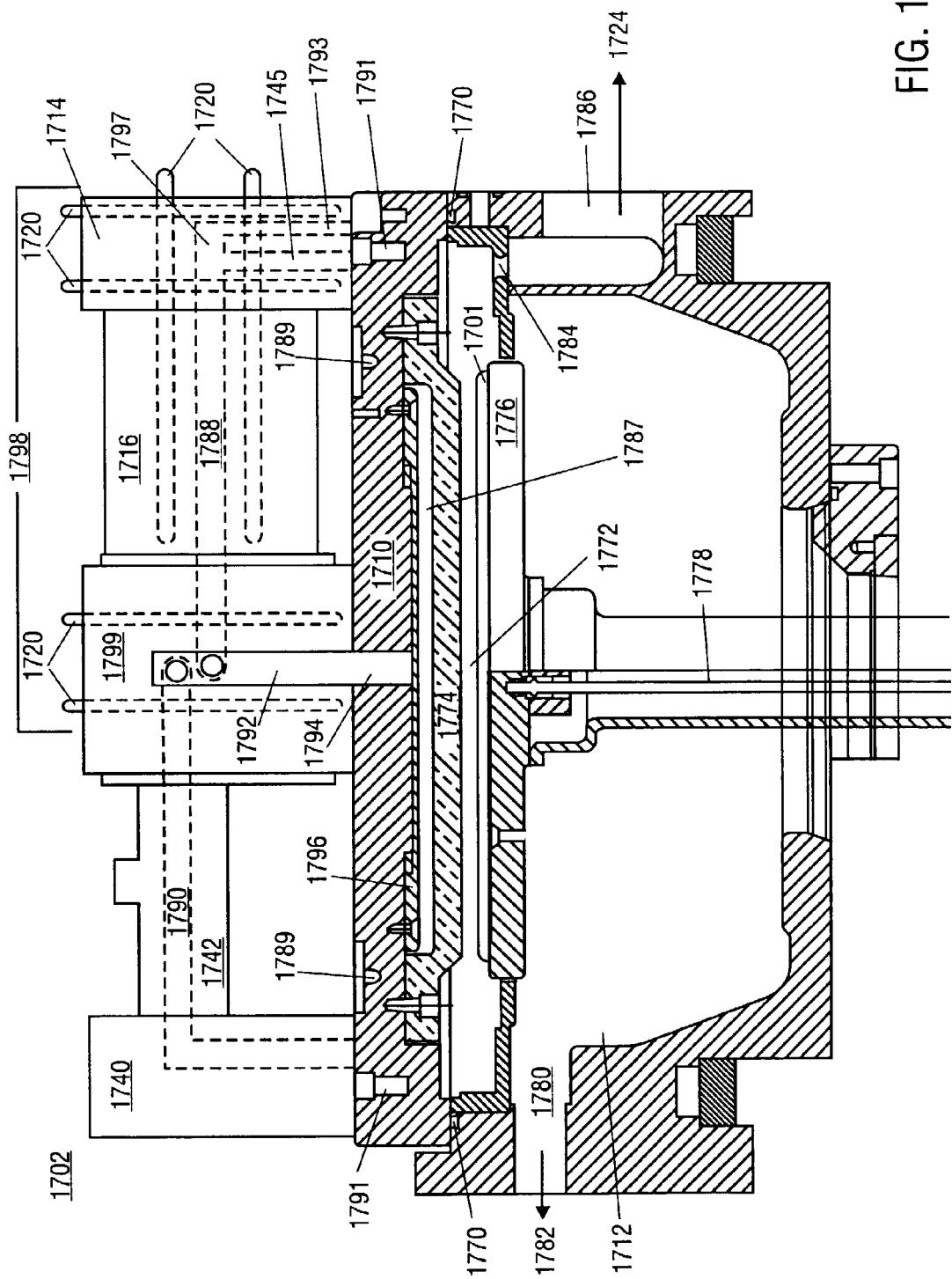
FIG. 17B is a cross sectional view of the chamber of high k dielectric deposition module.

FIG. 17B is a cross sectional view of chamber assembly 1702 of processing system 1700 of FIG. 17A. Chamber body 1712 and heated chamber lid 1710, which is hingedly connected to chamber body 1712, together with O-ring 1770 form a temperature and pressure controlled environment or processing region 1772 which enables deposition processes and other operations to be performed within processing region 1772. Chamber body 1712 and lid 1710 are preferably made of a rigid material such as aluminum, various nickel alloys or other materials having good thermal conductivity. O-ring 1770 could be formed from Chemraz, Kalrez, Viton or other suitable sealing material.

When lid 1710 is closed as shown in FIG. 17B, an annular processing region 1772 is formed which is bounded by showerhead 1774, substrate support 1776 and the walls of chamber body 1712. Substrate support 1776 (shown in the raised position for processing) extends through the bottom of chamber body 1712. Embedded within substrate support 1776 is a resistive heater which receives power via resistive heating element electrical connector 1778. A thermocouple in thermal contact with substrate support 1776 senses the temperature of substrate support 1776 and is part of a closed loop control circuit which allows precise temperature control of heated substrate support 1776. Substrate support 1776 and substrate 1701 are parallel to showerhead 1774. Substrate 1701 is supported by the upper surface of support 1776 and is heated by the resistive heaters within substrate support 1776 to processing temperatures of, for example, between about 400° C. and 500° C. for Tantalum films formed using the methods and apparatus of the present invention.

Processing chamber 1702 is coupled to sub-atmospheric transfer chamber 1224 via opening 1780. A slit valve 1782 seals processing region 1772 from sub-atmospheric transfer chamber 1224. Substrate support 1776 may also move vertically into alignment with opening 1780 which, when slit valve 1782 is open, allows substrates to move between the processing region 1772 and sub-atmospheric transfer chamber 1224. Substrate 1701 can be a substrate used in the manufacture of semiconductor products such as silicon substrates and gallium arsenide substrates and can be other substrates used for other purposes such as substrates used in the production of flat panel displays.

Pumping passage 1784 and outlet port 1786 formed within chamber body 1712 for removing by products of processing operations conducted within processing region 1772. Outlet port 1786 provides fluid communication between components of heated exhaust system 1704 and processing region 1772.

Turning now to gas delivery features of chamber 1702, both process gas/precursor mixture from liquid delivery system 1708, via conduit 1788, and activated species from remote plasma generator system 1706, via conduit 1790, flow through central conduit 1792 to bore through 1794 formed in lid 1710. From there, gases and activated species flow through blocker plate 1796 and showerhead 1774 into processing region 1772. A feature of showerhead 1774 of the present invention is the plurality of apertures.

Process gas and vaporized precursors and mixtures thereof are provided to central bore through 1794 via temperature controlled conduits formed integral to heated feed through assembly 1798. Heated feed through assembly 1798 is comprised of central block 1799, mixed deposition gas feed through block 1716 and inlet and mixing block 1714. Although the embodiment represented in chamber 1702 of FIG. 17B indicates a heated feed through assembly 1798 comprising three separate blocks 1718, 1716, and 1714, one of ordinary skill will appreciate that the blocks can be combined such as replacing inlet and mixing block 1714 and feed through block 1716 with a single block without departing from the spirit of the present invention. Additionally, a plurality of cartridge heaters 1720 are disposed internal to each of the aforementioned blocks and proximate to the conduits 1792, 1788, 1797, 1795, and 1793 which maintain a setpoint in each conduit utilizing separate controllers and thermocouples for the heater of a particular conduit. For clarity, the separate thermocouples and controllers have been omitted.

Lid 1710 is also provided with a cooling channel 1791 which circulates cooling water within that of lid 1710 in proximity to o-ring 1770. Cooling channel 1791 allows lid 1710 to maintain the temperatures preferred for advantageous heating of showerhead 1774 while protecting o-ring 1770 from the high temperatures which degrade the sealing qualities of o-ring 1770 thereby making o-ring 1770 more susceptible to attack by the reactive species generated and supplied to processing region 1772 by remote plasma generator 1706.

Another feature of processing chamber 1702 of the present invention also shown in FIG. 17B is embedded resistive heater 1789 within lid 1710. This feature of chamber assembly 1702 provides elevated temperatures in lid 1710 in proximity to central bore through 1794 and the area between the lower surface of the lid 1710 and showerhead upper surface 1787. The region between lid 1710 and showerhead upper surface 1787 is referred to as the "gas box". Formed within the top surface of lid 1710 is an annular groove shaped according to the size and shape of embedded heater 1789 in order to increase surface contact and heat transfer between resistive heater 1789 and lid 1710. Without heater 1789, cooling channel 1791 could continuously remove heat from lid 1710. As a result, cooling channel 1791 also affects the temperature of portions of lid 1710 in contact with precursor vapor, such as the area surrounding central bore through 1794 and the gas box. While cooler lid 1710 temperatures improve conditions for o-ring 1770, cooler lid 1710 temperatures could result in undesired condensation of precursor vapor. Thus, it is to be appreciated that resistive heater 1789 is positioned to heat those portions of lid 1710 in contact with the vaporized precursor flow such as the gas box and the area surrounding central bore through 1794. As shown in FIG. 17B, for example, heater 1789 is located between cooling channel 1719 and central bore through 1794 while also positioned to provide heating to the lid surface adjacent to blocker plate 1796.

Vapor Delivery System

Vapor delivery system 1708 provides a method and an apparatus for supplying controlled, repeatable, vaporization of low vapor pressure precursors for film deposition on a substrate 1701 located within processing region 1772. One method provides for the direct injection of vaporized TAETO and TAT-DMAE. One of ordinary skill will appreciate the specific features detailed below which separately and when combined allow vapor delivery system 1708 to vaporize and precisely control the delivery of liquid precursors including those precursors having vapor pressures significantly lower than precursors utilized in prior art vapor delivery system or, specifically, precursors having vapor pressures below about 10 Torr at 1 atm and 100° C. (FIG. 1).

The various components of vapor delivery system 1708 are placed in close proximity to chamber 1702 in order to minimize the length of temperature controlled vapor passageways between the outlet of vaporizer 1752 and processing region 1772. Even though practice in the semiconductor processing arts is to place vapor systems remotely from processing chambers to either ensure serviceability or reduce the amount of cleanroom space occupied by a processing system, vapor delivery system 1708 of the present invention utilizes an innovative compact design which allows all system components—less bulk liquid precursor, carrier gas and process gas supplies—to be located directly adjacent to chamber 1702 in close proximity to precursor and process gas chamber feed throughs.

A low vapor pressure liquid precursor, such as TAT-DMAE or TAETO, can be stored in bulk storage container 1756 located remotely or on mainframe support in proximity to processing chamber 1702. Liquid precursor stored in tank 1756 is maintained under pressure of an inert gas such as Helium at about 15 to 70 psig. The gas pressure within tank 1756 provides sufficient pressure on the liquid precursor such that liquid precursor flows to other vapor delivery system components thus removing the need for a pump to deliver the liquid precursor. The outlet of delivery tank 1756 is provided with a shut-off valve (not shown) to isolate bulk tank 1756 for maintenance or replenishment of the liquid precursor. As a result of the pressure head on tank 1756, liquid precursor from tank 1756 is provided to liquid supply line and the precursor inlet of precursor/solvent inlet valve 1754. When aligned for liquid precursor, precursor/solvent valve 1754 provides liquid precursor to precursor/solvent outlet and into precursor/solvent supply line to liquid flow meter inlet. Liquid flow meter 1750 measures precursor flow rate and provides via liquid flow meter outlet 511 liquid precursor to vaporize supply line 1763 and then to vaporized inlet. Vaporizer 1752 in conjunction with a heated carrier gas (described below) converts the liquid precursor into precursor vapor. A carrier gas, such as nitrogen or helium, is supplied into carrier gas heat exchanger inlet 1761 at a pressure of about 15 psi. Carrier gas heat exchanger 1760 is a gas to resistive heater type heat exchanger like Model HX-01 commercially available from Lintec. Carrier gas heat exchanger 1760 preheats the carrier gas to a temperature such that the heated carrier gas stream entering vaporizer 1752 does not interfere with the efficient vaporization of the precursor liquid undergoing vaporization within vaporizer 1752. Heated carrier gas is provided to vaporizer 1752 via carrier gas supply line 1764 and carrier gas inlet to vaporizer. The heated carrier gas should not be heated uncontrollably since a carrier gas heated above the decomposition temperature of the precursor undergoing vaporization could result in precursor decomposition within vaporizer 1752. Thus, carrier gas heat exchanger 1760 should heat the carrier gas into a temperature range bounded by, at the lower limit, the condensation temperature of the precursor and, at the upper limit, the decomposition temperature of the precursor. For a tantalum precursor such as TAT-DMAE for example, a representative vaporization temperature is about 130° C. and a decomposition temperature is about 190° C. A typical carrier gas such as nitrogen could be provided to a vaporizer 1752, which is vaporizing a tantalum precursor such as TAT-DMAE, at about between 200 and 2000 standard cubic centimeters per minute (sccm) and a temperature of about between 130° C. and 160° C. These conditions result in a vaporized precursor flow rate in the range of about 10–50 milligrams per minute. Carrier gas temperature can also be such that the temperature of the carrier gas entering vaporizer 1752 is at least as high if not higher than the vaporization temperature of the precursor being vaporized in vaporizer 1752. Of particular concern is the prevention of precursor vapor condensation within the small diameter conduits which exist within vaporizer 1752. As such, carrier gas temperatures below vaporization conditions within vaporizer 1752 could sufficiently cool the vaporized precursor, result in condensation and should therefore be avoided.

The Remote Plasma Generator

Figure 17C:
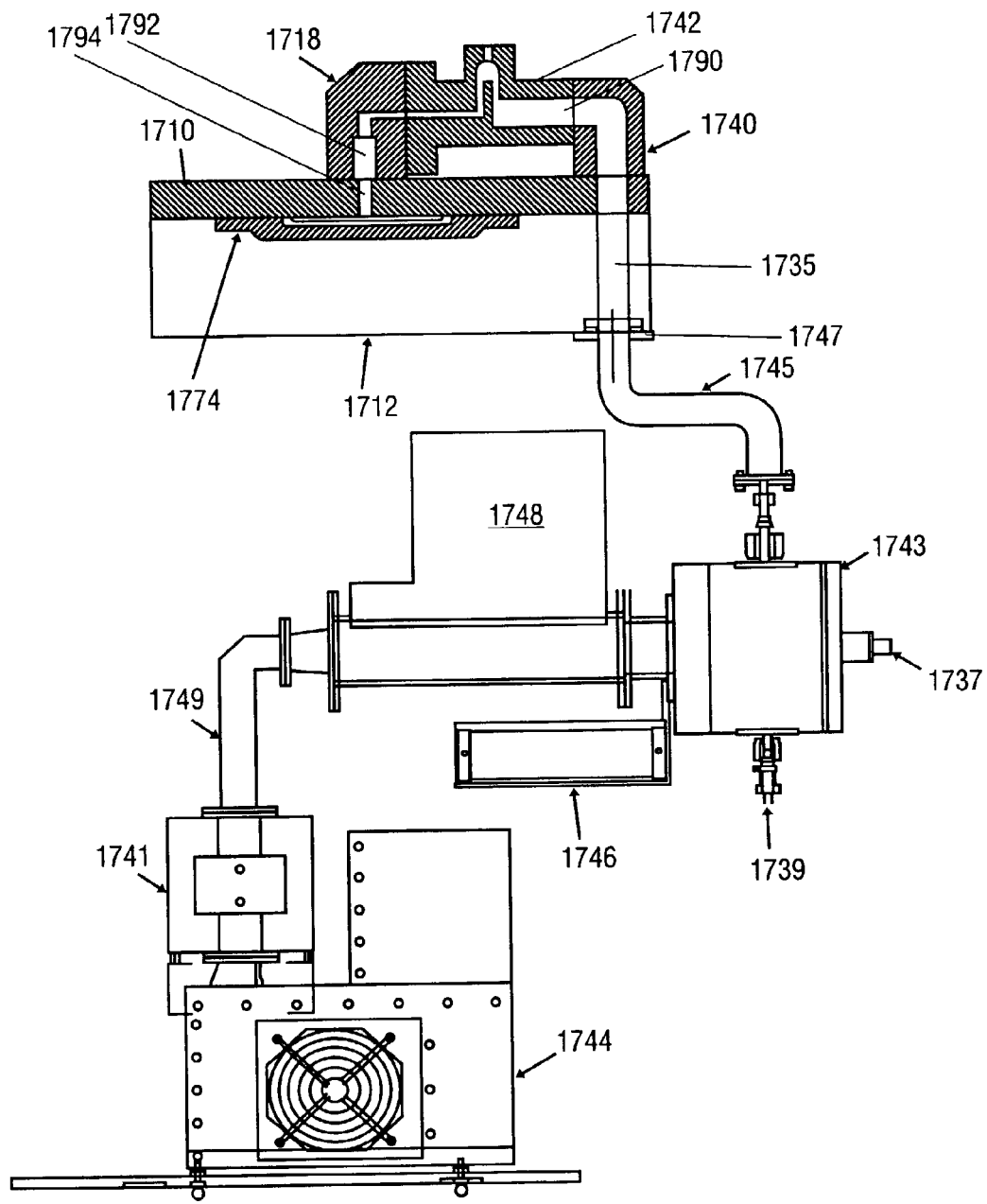
FIG. 17C is a schematic view of a typical remote plasma generator.

Another aspect of the processing apparatus 1760 of the present invention is remote plasma apparatus 1706 shown FIG. 17C in relation to central substrate transfer chamber 1224 and chamber 1702 and components of heated exhaust system 1705. Remote plasma apparatus 1706 creates a plasma outside of or remote to processing region 1772 for cleaning, deposition, annealing or other processes within processing region 1772. One advantage of a remote plasma generator 1706 is that the generated plasma or activated species created by remote plasma generator 1706 may be used for cleaning or process applications within the processing region without subjecting internal chamber components such as substrate support 1776 or showerhead 1774 to plasma attack which usually results when conventional RF energy is applied within process region 1772 to create a plasma. Several components of remote plasma apparatus 1706 are visible in FIG. 17C such as magnetron 1744, auto tuner controller 1746, isolator 1741, auto tuner 1748, adapter tube 1745 and adapter tube heat insulation disc 1747.

Magnetron assembly 1744 houses the magnetron tube, which produces the microwave energy. The magnetron tube consists of a hot filament cylindrical cathode surrounded by an anode with a van array. This anode/cathode assembly produces a strong magnetic field when it is supplied with DC power from a power supply. Electrons coming into contact with this magnetic field follow a circular path as they travel between the anode and the cathode. This circular motion induces voltage resonance, or microwaves, between the anode vanes. An antenna channels the microwaves from magnetron 1744 to isolator 1741 and wave guide 1749. Isolator 1741 absorbs and dissipates reflected power to prevent damage to magnetron 1744. Wave guide 1749 channels microwave from isolator 1741 into auto tuner 1748.

Auto tuner 1748 matches the impedance of magnetron 1744 and microwave cavity 1743 to achieve the maximum degree of reflected power by adjusting the vertical position of three tuning stubs located inside wave guide 1749. Auto tuner 1748 also supplies a feedback signal to the magnetron power supply in order to continuously match the actual forward power to the setpoint. Auto tuner controller 1746 controls the position of the tuning stubs within wave guide 1749 to minimize reflected power. Auto tuner controller 1746 also displays the position of the stubs as well as forward and reflect power readings.

Microwave applicator cavity 1743 is where gas or gases supplied via gas supply inlet 1739 are ionized. Gas supplied via gas supply inlet 1739 enters a water cooled quartz or sapphire tube within microwave applicator 1743, is subjected to microwaves and ionizes producing activated species which can then be used in cleaning and processing operations within processing region 1772. One such cleaning gas is NF3 which can be used to supply activated flourine for cleaning processing region 1772 when a substrate 1701 is not present in processing region 202. Activated species can also be used to anneal or otherwise process semiconductor or other materials present on a substrate 1701 positioned within processing region 1772. An optical plasma sensor 1737 detects the existence of plasma within cavity 1743. Activated species generated within microwaves applicator cavity 1743 are supplied to activate species chamber feed through 1735 via adapter tub 1745. Adapter tube 1745 is insulated from the elevated temperature of chamber body 1712 by adapter tube isolation disc 1747.

From activated species chamber feed through 1739, the activated species pass through lid bore-through and enter activated species inlet block 1740 which, together with activated species block 1742, provide an o-ring sealed, air tight conduit i.e., activated species conduit 1790, between lid bore-through and central gas feed-through 1792 within central mixing block 1718.

Method of Using Clean/Gate Tool 1200

Clean/Gate Tool 1200 can be used to form a dielectric film and electrode on a substrate. For example, as illustrated in FIGS. 15A–15D, the clean/gate tool 1200 can wet clean a substrate, monitor the quality of the wet clean, grow a high quality gate dielectric on the substrate, and then deposit a polysilicon gate film on the dielectric and then measure the thickness of the deposited gate film. A similar process can be used in Clean/Gate Tool 1200 to form a capacitor dielectric and capacitor electrode on a substrate.

Figure 15A:
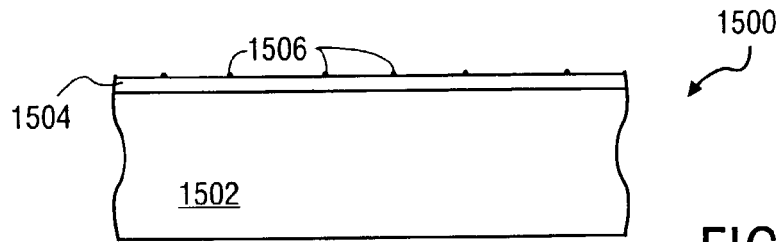
FIG. 15A-15E illustrate a method of depositing and forming a dielectric film and a gate electrode in accordance with an embodiment of the present invention.

According to an embodiment of the present invention, a substrate or wafer, such as wafer 1500, shown in FIG. 15A is brought to clean/gate tool 1200 in a FOUP 1220 which is loaded onto Clean/Gate Tool 1200. Wafer 1500 will typically include a thin sacrificial oxide or native oxide 1504 formed on a doped monocrystalline silicon substrate 1502 (or a silicon epitaxial film). Generally, contaminants, such as particles 1506, will be present in and/or on sacrificial oxide 1504. First, access door 1121 is opened (as is the adjacent door on FOUP 1220). Robot 1212 then removes wafer 1500 from FOUP 1220 and brings it into atmospheric transfer chamber 1210, and then inserts wafer 1500 into clean module 200 where it is held by support 210.

Next, wafer 1500 is exposed to a wet etchant for a sufficient period of time to etch or strip away all or a portion of sacrificial oxide 1504. A sacrificial oxide film can be etched away by exposing it to a dilute HF solution, such as a 500:1 to 10:1 DI $H_2O$:HF solution. The concentration and/or etch time will typically depend upon the thickness of the sacrificial film and the amount of the film to be removed.

Directly after etching sacrificial oxide 1504, wafer 1500 is wet cleaned in module 200. Wafer 1500 can be cleaned in module 200 as described above. In an embodiment of the present invention, wafer 1500 is cleaned with a single solution containing $NH_4OH$, $H_2O_2$, a chelating agent, and a surfactant. In another embodiment of the present invention, wafer 1500 is cleaned by standard RCA cleaning solutions (SC1 and SC2). After sufficient cleaning, as shown in FIG. 15B, wafer 1500 is dried in module 200.

Wafer 1500 is then removed by robot 1212 from clean module 200 and brought into atmospheric transfer chamber 1210. The wafer is then, if desired, transferred into either i) integrated particle monitoring tool 300 or ii) into integrated thickness measuring module 1290. Wafer 1500 can be brought into integrated thickness monitoring module 1290 in order to measure the remaining thickness of the sacrificial oxide 1504 to determine if either to much, to little or the correct amount of film has been removed. If too little film 1504 has been removed, wafer 1500 can be removed from module 1600 and placed back into wet clean module 200 in order to further etch the sacrificial film 1506. The amount of additional etching required, as determined in thickness measuring module 1290, can be used to determine or control the process parameters, such as HF concentration, etch time and rotation rate, of the second etching of sacrificial film 1506 to ensure that the required amount of sacrificial oxide 1506 is removed. If too much film 1506 has been removed, then wafer 1500 can be removed from module 1600 and transferred out of Clean/Gate Tool 1200 through atmospheric transfer chamber 1210 for further rework. If the correct amount of film has been removed, then wafer 1500 can be removed from integrated thickness module 1290 by robot 1212 and transferred into integrated particle monitoring module 300, if desired.

Figure 15B:
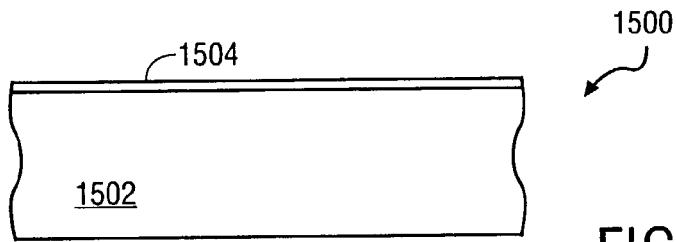

In integrated particle monitoring tool 300, the surface of wafer 1500, as shown in FIG. 15B, can be scanned and mapped to determine if the surface has been sufficiently cleaned of contaminants 1506. If the surface has not been sufficiently cleaned, wafer 1500 can be removed from the integrated particle monitoring module 300 and sent back to clean module 200 for further cleaning. The amount and type of a second cleaning of wafer 1500 can be determined by the information received during the integrated particle monitoring of wafer 1500.

If wafer 1500 has been sufficiently cleaned, then wafer 1500 is removed from the integrated particle monitoring tool 300 and brought into the atmospheric transfer chamber 1210 to begin further processing in the sub-atmospheric portion 1204 of Clean/Gate Tool 1200.

It is to be appreciated that a wafer can be brought into either only integrated particle monitoring tool 300 and not thickness monitoring tool 1700 or can be brought into only thickness monitoring tool 1600 and not integrated particle monitoring tool 300, if desired. Additionally, if desired, a wafer can be brought into integrated particle monitoring 300 for process prior to bringing it into integrated thickness monitoring tool 1600 for processing. Additionally, it is to be appreciated that every wafer need not necessarily be measured for thickness and/or particles. If desired, one can utilize spot checks, of for example every ten wafers, to determine whether or not proper etching has occurred and/or particles have been removed. In this case the information from the integrated particle monitor tool and/or the integrated thickness monitor tool 1700 can be used to adjust the strip and cleaning recipe for the next 10 wafers.

Figure 15C:
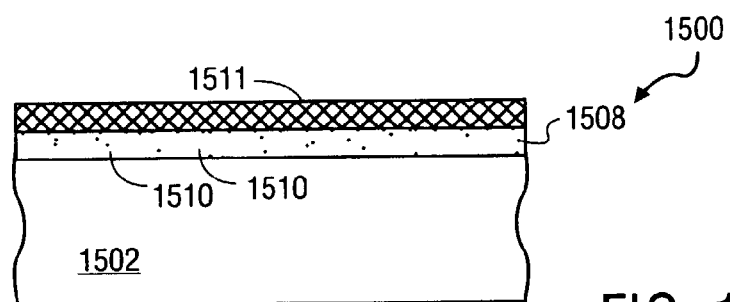

After wafer 1500 has been sufficiently etched and cleaned, as shown in FIG. 15B, door 1205 is opened and wafer 1500 transferred from atmospheric transfer chamber 1210 into load lock 1206 by robot 1212. Door 1205 is then sealed and load lock 1206 evacuated to the pressure within sub-atmospheric transfer chamber 1224. Next, door 1207 is opened and wafer handling device 1226 removes wafer 1500 from load lock 1206 and brings it into sub-atmospheric transfer chamber 1224. Next, wafer 1500 is brought into thermal oxidation chamber 1300 and placed on support 1362 by wafer handling device 1226. Next, a silicon dioxide dielectric film 1508 is grown on monocrystalline silicon substrate 1502 as shown in FIG. 15C. If desired, a nitrogen containing gas or a remotely generated nitrogen plasma can be inserted into chamber 1313 during film growth to form a silicon oxide containing nitrogen 1510 or a silicon oxynitride film. It is to be appreciated that a silicon oxynitride film has a higher dielectric constant than does a silicon dioxide film.

In order to grow a dielectric film on wafer 1500, chamber 1313 is sealed and the pressure reduced to less than the sub-atmospheric transfer chamber pressure of approximately 20 Torr. Chamber 1313 is evacuated to a pressure to sufficiently remove the nitrogen ambient, typically nitrogen, in chamber 1313. Chamber 13 is pumped down to a prereaction pressure less than the pressure at which the insitu moisture generation is to occur, and is preferably pumped down to a pressure of less than 1 torr.

Simultaneous with the prereaction pump down, power is applied to lamps 1319 which in turn irradiate wafer 1500 and silicon carbide support ring 1362 and thereby heat wafer 1500 and support ring 1362 to a stabilization temperature. The stabilization temperature of wafer 1500 is less than the temperature (reaction temperature) required to initiate the reaction of the hydrogen containing gas and oxygen containing gas to be utilized for the insitu moisture generation. The stabilization temperature in the preferred embodiment of the present invention is approximately 500° C.

Once the stabilization temperature and the prereaction pressure are reached, chamber 1313 is backfilled with the desired mixture of process gas. The process gas includes a reactant gas mixture comprising two reactant gasses: a hydrogen containing gas and an oxygen containing gas, which can be reacted together to form water vapor ($H_2O$) at temperatures between 400–1250° C. The hydrogen containing gas, is preferably hydrogen gas ($H_2$), but may be other hydrogen containing gasses such as, but not limited to, ammonia ($NH_3$), deuterium (heavy hydrogen) and hydrocarbons such as methane ($CH_4$). The oxygen containing gas is preferably oxygen gas ($O_2$) but may be other types of oxygen containing gases such as but not limited to nitrous oxide ($N_2O$). Other gasses, such as but not limited to nitrogen ($N_2$), may be included in the process gas mix if desired. The oxygen containing gas and the hydrogen containing gas are preferably mixed together in chamber 1313 to form the reactant gas mixture.

In the present invention the partial pressure of the reactant gas mixture (i.e., the combined partial pressure of the hydrogen containing gas and the oxygen containing gas) is controlled to ensure safe reaction conditions. According to the present invention, chamber 1313 is backfilled with process gas such that the partial pressure of the reactant gas mixture is less than the partial pressure at which spontaneous combustion of the entire volume of the desired concentration ratio of reactant gas will not produce a detonation pressure wave of a predetermined amount. The predetermined amount is the amount of pressure that chamber 1313 can reliably handle without failing.

According to the present invention, insitu moisture generation is preferably carried out in a reaction chamber that can reliably handle a detonation pressure wave of four atmospheres or more without affecting its integrity. In such a case, reactant gas concentrations and operating partial pressure preferably do not provide a detonation wave greater than two atmospheres for the spontaneous combustion of the entire volume of the chamber.

By controlling the chamber partial pressure of the reactant gas mixture in the present invention any concentration ratio of hydrogen containing gas and oxygen containing gas can be used including hydrogen rich mixtures utilizing $H_2/O_2$ ratios greater than 2:1, respectively, and oxygen rich mixtures using $H_2/O_2$ ratios less than 0.5:1, respectively. For example, any concentration ratio of $O_2$ and $H_2$ can be safely used as long as the chamber partial pressure of the reactant gasses is maintained at less than 150 Torr at process temperature. The ability to use any concentration ratio of oxygen containing gas and hydrogen containing gas enables one to produce an ambient with any desired concentration ratio of $H_2/H_2O$ or any concentration ratio of $O_2/H_2O$ desired. Whether the ambient is oxygen rich or dilute steam or hydrogen rich or dilute steam can greatly affect device electrical characteristics of the deposited film 1510. The present invention enables a wide variety of different steam ambients to be produced and therefore a wide variety of different oxidation processes to be implemented.

In some oxidation processes, an ambient having a low steam concentration with the balance $O_2$ may be desired. Such an ambient can be formed by utilizing a reactant gas mixture comprising 10% $H_2$ and 90% $O_2$. In other processes, an ambient of hydrogen rich steam (70–80% $H_2$/30–20% $H_2O$) may be desired. A hydrogen rich, low steam concentration ambient can be produced according to the present invention by utilizing a reactive gas mix comprising between 5–20% $O_2$ with the remainder $H_2$ (95–80%). It is to be appreciated that in the present invention any ratio of hydrogen containing gas and oxygen containing gas may be utilized because the heated wafer provides a continual ignition source to drive the reaction. Unlike pyrogenic torch methods, the present invention is not restricted to specific gas ratios necessary to keep a stable flame burning.

Next, power to lamps 1319 is increased so as to ramp up the temperature of wafer 61 to process temperature. Wafer 61 is preferably ramped from the stabilization temperature to process temperature at a rate of between 10–100° C./sec with 50° C./sec being preferred. The preferred process temperature of the present invention is between 600–1150° C. with 950° C. being preferred. The process temperature must be at least the reaction temperature (i.e., must be at least the temperature at which the reaction between the oxygen containing gas and the hydrogen containing gas can be initiated by wafer 1500) which is typically at least 600° C. It is to be noted that the actual reaction temperature depends upon the partial pressure of the reactant gas mixture as well as on the concentration ratio of the reactant gas mixture, and can be between 400° C. to 1250° C.

As the temperature of wafer 1500 is ramped up to process temperature, it passes through the reaction temperature and causes the reaction of the hydrogen containing gas and the oxygen containing gas to form moisture or steam ($H_2O$). Since rapid thermal heating apparatus 1300 is a "cold wall" reactor, the only sufficiently hot surfaces in chamber 1313 to initiate the reaction is the wafer 1500 and support ring 1362. As such, in the present invention the moisture generating reaction occurs near, about 1 cm from, the surface of wafer 1500. In the present invention the moisture generating reaction is confined to within about two inches of the wafer or about the amount at which support ring 1362 extends past the outside edge of wafer 1500. Since it is the temperature of the wafer (and support ring) which initiates or turns "on" the moisture generation reaction, the reaction is said to be thermally controlled by the temperature of wafer 1500 (and support ring 1362). Additionally, the vapor generation reaction of the present invention is said to be "surface catalyzed" because the heated surface of the wafer is necessary for the reaction to occur, however, it is not consumed in the reaction which forms the water vapor.

Next, once the desired process temperature has been reached, the temperature of wafer 1500 is held constant for a sufficient period of time to enable the water vapor generated from the reaction of the hydrogen containing gas and the oxygen containing gas to oxidize silicon surfaces or films to form $SiO_2$. Wafer 1500 will typically be held at process temperature for between 30–120 seconds. Process time and temperature are generally dictated by the thickness of the oxide film desired, the purpose of the oxidation, and the type and concentrations of the process gasses. FIG. 15C illustrates an oxide 1508 formed on wafer 1500 by oxidation of silicon surfaces 1502 by water vapor ($H_2O$) generated by the insitu moisture generation process. It is to be appreciated that the process temperature must be sufficient to enable the reaction of the generated water vapor or steam with silicon surfaces to form silicon dioxide.

Next, power to lamps 1319 is reduced or turned off to reduce the temperature of wafer 1500. The temperature of wafer 1500 decreases (ramps down) as fast as it is able to cool down (at about 50° C./sec.). Simultaneously, N2 purge gas is fed into the chamber 1313. The moisture generation reaction ceases when wafer 1500 and support ring 1362 drop below the reaction temperature. Again it is the wafer temperature (and support ring) which dictates when the moisture reaction is turned "on" or "off".

Next, chamber 1313 is pumped down, preferably below 1 torr, to ensure that no residual oxygen containing gas and hydrogen containing gas are present in chamber 1313. The chamber is then backfilled with $N_2$ gas to the transfer pressure in sub-atmospheric transfer chamber 1224, of approximately 20 torr and wafer 1500 transferred out of chamber 1313 to complete the process.

At times it may be desirable to utilize concentration ratios of hydrogen containing gas and oxygen containing gas which will produce an ambient with a large concentration of water vapor (e.g., >40% $H_2O$). Such an ambient can be formed with a reactant gas mixture, for example, comprising 40–80% $H_2$/60–20% $O_2$. A gas mixture near the stoichiometric ratio may yield too much combustible material to enable safe reaction conditions. In such a situation, a low concentration gas mixture (e.g., less than 15% $O_2$ in $H_2$) can be provided into the reaction chamber during step 306, the wafer temperature raised to the reaction temperature in step 308, and the reaction initiated with the lower concentration ratio. Once the reaction has been initiated and the existing reactant gas volume begins to deplete, the concentration ratio can be increased to the desired level. In this way, the amount of fuel available at the start of the reaction is kept small and safe operating conditions assured.

In an embodiment of the present invention a relatively low, reactive gas partial pressure is used for insitu steam generation in order to obtain enhanced oxidation rates. It has been found that providing a partial pressure of between 1 Torr to 50 Torr of hydrogen gas ($H_2$) and oxygen gas ($O_2$) that an enhanced oxide growth rate of silicon can be achieved. That is, for a given set of process conditions (i.e., $H_2/O_2$ concentration ratio, temperature, and flow rate) the oxidation rate of silicon is actually higher for lower partial pressures (1–50 Torr) of $H_2$ and $O_2$ than for higher partial pressures (i.e., from 50 Torr to 100 Torr).

After a sufficient dielectric film 1508 has been grown on monocrystalline silicon substrate 1502, as shown in FIG. 15C, wafer 1500 is removed from thermal oxidation chamber 1300 by robot 1226. In an embodiment of the present invention, wafer 1500 is transferred by robot 1226 through sub-atmospheric transfer chamber 1224 and placed into high k dielectric module 1700 to deposit a high k metal oxide dielectric film 1511 on silicon oxide film 1508 or a silicon oxide film containing nitrogen 1510. In an embodiment of the present invention the dielectric film 1511 is a transition metal dielectric film such as, but not limited to, tantalum pentaoxide ($Ta_2O_5$) and titanium oxide ($TiO_2$). In another embodiment dielectric layer 1511 is a tantalum pentaoxide film doped with titanium. Additionally dielectric layer 1511 can be a composite dielectric film comprising a stack of different dielectric films such as a $Ta_2O_5/TiO_2/Ta_2O_5$ stacked dielectric film. Additionally, dielectric layer 208 can be a piezoelectric dielectric such as Barium Strontium Titanate (BST) and Lead Zirconium Titanate (PZT) or a ferroelectric.

In order to form a dielectric layer 1511 onto wafer 1500, the substrate can be placed onto support 1776 in chamber 1702 of high k module 1700. The wafer 1500 is then heated to a desired deposition temperature while the pressure within the chamber is pumped down (reduced) to a desired deposition pressure. Deposition gases are then fed into the chamber and a dielectric layer formed therefrom.

To blanket deposit a tantalum pentaoxide ($Ta_2O_5$) dielectric film by thermal chemical vapor deposition a deposition gas mix comprising, a source of tantalum, such as but not limited to, TAETO [Ta $(OC_2H_5)_5$] and TAT-DMAE [Ta $(OC_2H_5)_4$ $(OCHCH_2N(CH_3)_2)$], and source of oxygen such as $O_2$ or $N_2O$ can be fed into a deposition chamber while the substrate is heated to a deposition temperature of between 300–500° C. and the chamber maintained at a deposition pressure of between 0.5–10 Torr. The flow of deposition gas over the heated substrate results in thermal decomposition of the metal organic Ta-containing precursor and subsequent deposition of a tantalum pentaoxide film. In one embodiment TAETO or TAT-DMAE is fed into the chamber at a rate of between 10–50 milligrams per minute while $O_2$ or $N_2O$ is fed into the chamber at a rate of 0.3–1.0 SLM. TAETO and TAT-DMAE can be provided by direct liquid injection or vaporized with a bubbler prior to entering the deposition chamber. A carrier gas, such as $N_2$, $H_2$ and He, at a rate of between 0.5–2.0 SLM can be used to transport the vaporized TAETO or TAT-DMAE liquid into the deposition chamber 1702. Deposition is continued until a dielectric film 1511 of a desired thickness is formed. A tantalum pentaoxide ($Ta_2O_5$) dielectric film having a thickness between 50–200 Å provides a suitable dielectric film.

It has been found that the use of nitrous oxide ($N_2O$) as the oxidizer (source of oxygen), as opposed to oxygen gas $O_2$ improves the electrical properties of the deposited tantalum pentaoxide ($Ta_2O_5$) dielectric film during deposition. The use of $N_2O$, as opposed to $O_2$, has been found to reduce the leakage current and enhance the capacitance of fabricated capacitors. The inclusion of $N_2O$ as an oxidizer aids in the removal of carbon from the film during growth which helps to improve the quality of the film.

In an embodiment of the present invention dielectric layer 1511 is a tantalum pentaoxide ($Ta_2O_5$) film doped with titanium (Ti). A tantalum pentaoxide film doped with titanium can be formed by thermal chemical vapor deposition by providing a source of titanium, such as but not limited to TIPT ($C_{12}H_{26}O_4Ti$), into the process chamber while forming a tantalum pentaoxide film as described above. TIPT diluted by approximately 50% with a suitable solvent such as isopropyl alcohol (IPA) can be fed into the process chamber by direct liquid injection or through the use of a bubbler and carrier gas such as $N_2$. A TIPT diluted flow rate of between 5–20 mg/minute can be used to produce a tantalum pentaoxide film having a titanium doping density of between 5–20 atomic percent and a dielectric constant between 20–40. The precise Ti doping density can be controlled by varying the tantalum source flow rate relative to the titanium source flow rate. It is to be appreciated that a tantalum pentaoxide film doped with titanium atoms exhibits a higher dielectric constant than an undoped tantalum pentaoxide film.

In another embodiment of the present invention dielectric layer 1511 is a composite dielectric layer comprising a stack of different dielectric materials such as a $Ta_2O_5/TiO_2/Ta_2O_5$ stack. A $Ta_2O_5/TiO_2/Ta_2O_5$ composite film can be formed by first depositing a tantalum pentaoxide film as described above. After depositing a tantalum pentaoxide film having a thickness between 20–50 Å the flow of the tantalum source is stopped and replaced with a flow of a source of titanium, such as TIPT, at a diluted flow rate of between 5–20 mg/min. After depositing a titanium oxide film having a thickness of between 20–50 Å, the titanium source is replaced with the tantalum source and the deposition continued to form a second tantalum pentaoxide film having a thickness of between 20–50 Å. By sandwiching a higher dielectric constant titanium oxide ($TiO_2$) film between two tantalum pentaoxide ($Ta_2O_5$) films, the dielectric constant of a composite stack is increased over that of a homogeneous layer of tantalum pentaoxide ($Ta_2O_5$).

Next, dielectric film 1511 is annealed with remotely generated active atomic species to form an annealed dielectric layer 1511. Dielectric film 1511 can be annealed in chamber 1702 coupled to remote plasma generator 1706. Substrate 1500 is then heated to an anneal temperature and exposed to active atomic species generated by disassociating an anneal gas in application cavity 1743. By generating the active atomic species in an application cavity 1743 chamber remote from chamber 1702 (the chamber in which the substrate is situated) a low temperature anneal can be accomplished without exposing the substrate to the harmful plasma used to form the active atomic species. With the process and apparatus of the present invention anneal temperatures of less than 400° C. can be used. The use of remotely generated active atomic species to anneal dielectric film 1511 enables anneal temperatures of less than or equal to the deposition temperature of the dielectric film to be used.

In one embodiment of the present invention dielectric film 1511 is a transition metal dielectric and is annealed with reactive oxygen atoms formed by remotely disassociating $O_2$ gas. Dielectric layer 1511 can be annealed in chamber 1702 with a reactive oxygen atoms created by providing an anneal gas comprising two SLM of $O_2$ and one SLM of N2 into chamber application cavity 1743, and applying a power between 500–1500 Watts to magnetron 302 to generate microwaves which cause a plasma to ignite from the anneal gas. Alternatively, reactive oxygen atoms can be formed by flowing an anneal gas comprising two SLM of $O_2$ and three SLM of argon (Ar) into cavity 1743. While reactive oxygen atoms are fed into anneal chamber 1702, substrate 200 is heated to a temperature of approximately 300° C. and chamber 1702 maintained at an anneal pressure of approximately 2 Torr, High K Dielectric layer 1511 can be sufficiently annealed by exposing substrate 200 to reactive oxygen atoms for between 30–120 seconds.

An inert gas, such as $N_2$ or argon (Ar), is preferably included in the anneal gas stream in order to help prevent recombination of the active atomic species. It is to be noted that as the active atomic species (e.g. reactive oxygen atoms) travel from the application cavity 1743 to chamber 1702, they collide with one another and recombine to form $O_2$ molecules. By including an inert gas, in the anneal gas mix, the inert gas does not disassociate and so provides atoms which the active atomic species can collide into without recombining. Additionally, in order to help prevent recombination of the active atomic species, it is advisable to keep the distance between application cavity 1743 and chamber 1702 as short as possible.

Figure 15D:
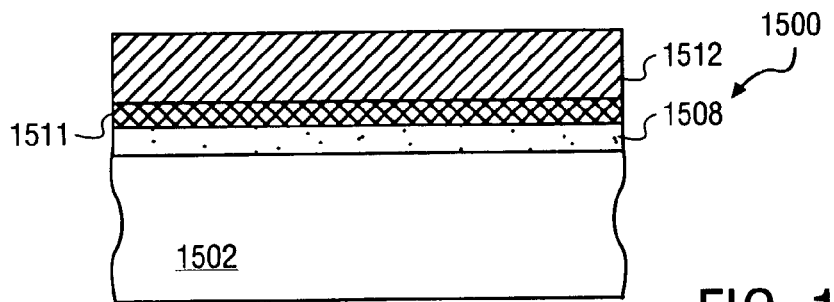

Annealing a transition-metal dielectric film 1511 with reactive oxygen atoms fills oxygen vacancies (satisfies sites) in the dielectric film 1511 which greatly reduces the leakage of the film. Additionally, annealing transition metal dielectric 1511 helps to remove carbon (C) in the film which can contribute to leakage. Carbon can be incorporated into transition metal dielectrics because the tantalum and titanium sources, TAT-DMAE, TAETO, and TIPT are carbon containing compounds. The reactive oxygen atoms remove carbon from the film by reacting with carbon and forming carbon dioxide ($CO_2$) vapor which can then be exhausted out from the chamber. Next, a doped or undoped polycrystalline silicon film or other gate material is deposited onto the gate dielectric layer 1508 (or high k dielectric 1511, if used), as shown in FIG. 15D.

In order to deposit a polysilicon film 1512 the desired deposition pressure and temperature are obtained and stabilized in chamber 1490. While achieving pressure and temperature stabilization, a stabilization gas such as $N_2$, He, Ar, $H_2$ or combinations thereof are fed into chamber 1490. In a preferred embodiment of the present invention the flow and concentration of the dilution gas used in the subsequent polysilicon deposition is used to achieve temperature and pressure stabilization. Using the dilution gas for stabilization enables the dilution gas flow and concentrations to stabilize prior to polysilicon deposition.

In an embodiment of the present invention the chamber is evacuated to a pressure between 150–350 Torr with 200–275 Torr being preferred and the heater temperature raised to between 700–740° C. and preferably between 710–720° C. while the dilution gas is fed into chamber 1490 at a flow rate between 10–30 slm. According to the present invention the dilution gas consist of $H_2$ and an inert gas, such as but not limited to nitrogen ($N_2$), argon (Ar), and helium (He), and combinations thereof. For the purpose of the present invention an inert gas is a gas which is not consumed by or which does not interact with the reaction used to deposit the polysilicon film and does not interact with chamber components during polysilicon film deposition. In a preferred embodiment of the present invention the inert gas consists only of nitrogen ($N_2$). In an embodiment of the present invention $H_2$ comprises more than 8% and less than 20% by volume of the dilution gas mix with the dilution gas mix preferably having between 10–15% $H_2$ by volume.

In the present invention the dilution gas mix has a sufficient $H_2$/inert gas concentration ratio such that a subsequently deposited polysilicon film is dominated by the <111> crystal orientation as compared to the <220> crystal orientation. Additionally, the dilution gas mix has a sufficient $H_2$/inert gas concentration ratio so that the subsequently deposited polycrystalline silicon film has a random grain structure with an average grain size between 50–500 Å.

In an embodiment of the present invention the dilution gas mix is supplied into chamber 1490 in two separate components. A first component of the dilution gas mix is fed through distribution port 1420 in chamber lid 1430. The first component consist of all the $H_2$ used in the dilution gas mix and a portion (typically about ⅔) of the inert gas used in the dilution gas mix. The second component of the dilution gas mix is fed into the lower portion of chamber 1490 beneath heater 1480 and consists of the remaining portion (typically about ⅓) of the inert gas used in the dilution gas mix. The purpose of providing some of the inert gas through the bottom chamber portion is to help prevent the polycrystalline silicon film from depositing on components in the lower portion of the chamber. In the embodiment of the present invention between 8–18 slm with about 9 slm being preferred of an inert gas (preferably $N_2$) is fed through the top distribution plate 1420 while between 3–10 slm, with 4–6 slm being preferred, of the inert gas (preferably $N_2$) is fed into the bottom or lower portion of chamber 1490. The desired percentage of $H_2$ in the dilution gas mix is mixed with the inert gas prior to entering distribution port 1420.

Next, once the temperature, pressure, and gas flows have been stabilized a process gas mix comprising a silicon source gas and a dilution gas mix comprising $H_2$ and an inert gas is fed into chamber 1490 to deposit a polycrystalline silicon film 1512 on substrate 1500 as shown in FIG. 15D. In the preferred embodiment of the present invention the silicon source gas is silane ($SiH_4$) but can be other silicon source gases such as disilane ($Si_2H_6$). According to the preferred embodiment of the present invention between 50–150 sccm, with between 70–100 sccm being preferred, of silane ($SiH_4$) is added to the dilution gas mix already flowing and stabilized during the temperature and pressure stabilization step. In this way during the deposition of polysilicon, a process gas mix comprising between 50–150 sccm of silane ($SiH_4$) and between 10–30 slm of dilution gas mix comprising $H_2$ and an inert gas is fed into the chamber while the pressure in chamber 1490 is maintained between 150–350 Torr and the temperature of susceptor 1405 is maintained between 700–740° C. (It is to be appreciated that in the LPCVD reactor 1400 the temperature of the substrate or wafer 1500 is typically about 50° (cooler than the measured temperature of susceptor 1405). In the preferred embodiment of the present invention the silicon source gas is added to the first component (upper component) of the dilution gas mix and flows into chamber 1490 through inlet port 1420. If desired, a dopant gas source, such as but not limited to diborane and phosphine can be included in the process gas mix to insitu dope the polysilicon film.

The thermal energy from susceptor 1405 and wafer 1500 causes the silicon source gas to thermally decompose and deposit a polysilicon film on gate dielectric 1508 on silicon substrate 1502 as shown in FIG. 15D. In an embodiment of the present invention only thermal energy is used to decompose the silicon source gas without the aid of additional energy sources such as plasma or photon enhancement.

As process gas mix is fed into chamber 1490, the silicon source gas decomposes to provide silicon atoms which in turn form a polycrystalline silicon film on insulating layer 1508. It is to be appreciated that $H_2$ is a reaction product of the decomposition of silane ($SiH_4$). By adding a suitable amount of $H_2$ in the process gas mix the decomposition of silane ($SiH_4$) is slowed which enables a polycrystalline silicon film 1512 to be formed with small and random grains. In the present invention $H_2$ is used to manipulate the silicon resource reaction across the wafer. By having $H_2$ comprise between 8–20% of the dilution gas mix random grains having an average grain size between 50–500 Å can be formed. Additionally, by including a sufficient amount of $H_2$ in the dilution gas mix a polycrystalline silicon film 506 which is dominated by the <111> crystal orientation, as opposed to the <220> crystal orientation is formed.

According to the present invention the deposition pressure, temperature, and process gas flow rates and concentration are chosen so that a polysilicon film is deposited at a rate between 1500–5000 Å per minute with between 2000–300 Å per minute being preferred. The process gas mix is continually fed into chamber 1490 until a polysilicon film 1512 of a desired thickness is formed. For gate electrode applications a polysilicon film 1512 having a thickness between 500–2000 Å has been found suitable.

After completing the deposition polysilicon film 1512, heater 1480 is lowered from the process position to the load position and wafer 500 removed from chamber 1490 by robot 1226.

Figure 15E:
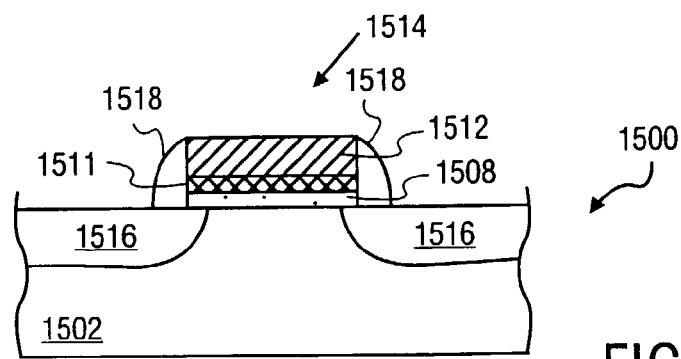

Door 1211 is then opened and then wafer 1500 placed into load lock 1208 and door 1211 sealed. Next, the pressure within load lock 1208 is raised to the pressure within atmospheric transfer chamber 1210. The door 1209 is then opened and robot 1212 removes wafer 1500 from load lock 1208. At this point, wafer 1500 can be i) placed into integrated thickness monitoring tool 1700 to measure the thickness of silicon film 1512; or ii) can be placed into wet clean module 200 where it is exposed to a cleaning solution comprising, for example, hydrofluoric acid in order to remove contaminants from wafer 1500, or iii) can be removed from atmospheric transfer chamber 1210 by robot 1212 and placed into FOUP 1222. At this time a method of forming a gate dielectric film 1508 and a gate electrode film 1512 in Clean/Gate tool 1200 has been described. Further processing can be used to etch a gate electrode 1514 from film 1512 and to form source/drain regions 1516 as well as spacers 1518 in order to complete fabrication of a metal oxide semiconductor device as shown in FIG. 15E.

Photolithograhy Process Tool

Figure 18A:
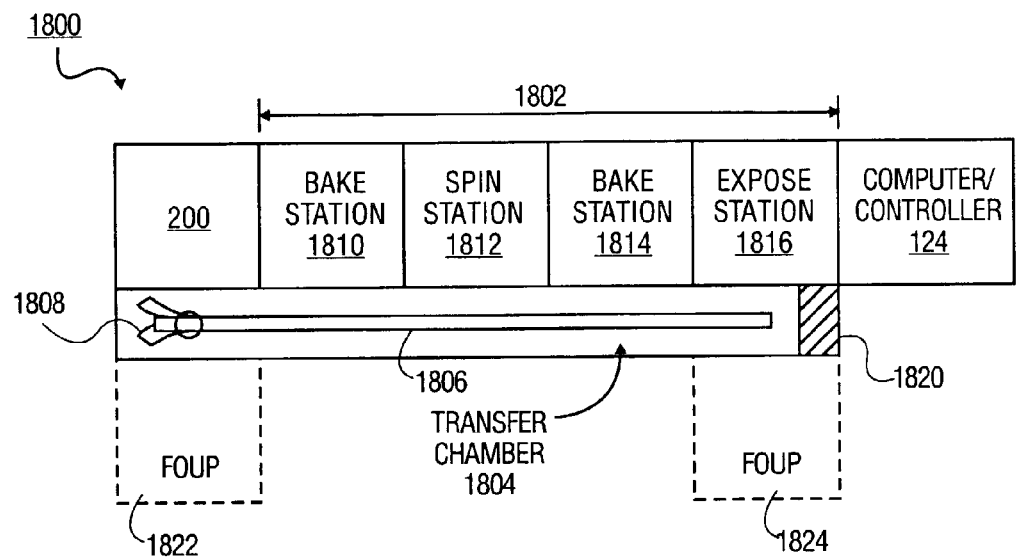
FIG. 18A is an overhead illustration of a photolithographic tool in accordance with the present invention.

FIG. 18A illustrates a photolithography processing tool 1800 which can be used to clean a wafer, form a photoresist on the wafer and then expose the wafer in a closed and controlled environment. Photolithography process tool 1800 includes a single wafer wet clean module, such as module 200 shown in FIG. 2A, a photoresist track 1802 for applying, and exposing photoresist and a transfer chamber 1804 having a wafer handling robot 1808 on a single linear track 1806 contained therein. Wet clean station 200 and photoresist track 1802 are each directly coupled to transfer chamber 1804 and are each accessible by robot 1808. In an embodiment of the present invention the photoresist track 1802 includes a bake station 1810 for removing water from a wafer to be photoresist coated, a photoresist application station 1812, such as a spin station, whereby a desired amount of photoresist is spun on a wafer, a soft bake station 1814 which removes solvent from the deposited photoresist material, and an exposure tool, such as a stepper, where the deposited photoresist is exposed to radiation, such as deep ultraviolet (DUV) radiation or extreme ultraviolet (EUV) radiation through a mask used to define a pattern within the photoresist layer.

Tool 1800 includes a filter 1820 coupled to transfer chamber 1804 for removing amine and ammonia vapor from tool 1800. In an embodiment of the present invention, the ambient within tool 1800 is sufficiently void of amine and ammonia vapor so that they do not affect the photoresist processing in tool 1800. Additionally, tool 1800 includes a computer/controller 124 which controls the operation of robot 1808 as well as the various operations which occur in clean module 200 and photoresist track 1802. Additionally, photoresist tool 1800 can include a first FOUP 1822 coupled to a first side of transfer chamber 1804 for providing wafers to tool 1800 through transfer chamber 1804. A second FOUP 1824 can be included on the opposite end of transfer chamber 1806 the FOUP 1822 for removing completed wafers from photolithography process tool 1800.

Figure 18B:
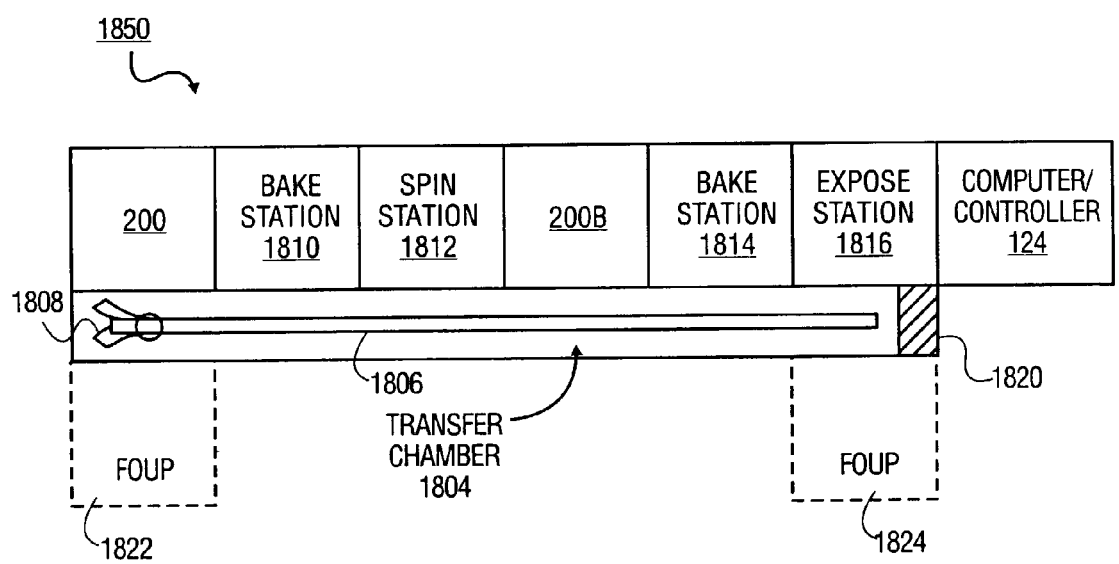
FIG. 18B is an overhead illustration of a photolithographic tool in accordance with an embodiment of the present invention.

In an embodiment of the present invention, as shown in FIG. 18B, a photolithography process tool 1850 optionally includes a second wet clean chamber 200B positioned down stream of or after the photoresist deposition module 1812 and positioned upstream or before the exposure module 1816. In this way, the backside of the wafer can be cleaned of particles after the photoresist has been deposited (or spun) and before the photoresist has been exposed.

Method of Operating Photolithography Process Tool

An example of the method of use of photolithography process tool 1800 is illustrated in FIGS. 19A–19G. In an embodiment of the present invention, a wafer 1900 is provided to photolithography process tool 1800 in a FOUP 1822. Wafer 2000 has a frontside 1902 and a wafer backside 1904 opposite the wafer frontside. Generally formed on the wafer frontside 1902 are plurality of small (less then 0.25 um) device features 1906, such as thin film lines used to form interconnects or electrodes. Wafer 1900 typically include a plurality of particles 1908 undesirably formed on the frontside and backside of the wafer 1900. In order to photolithograpically process wafer 1900, the door between transfer chamber 1804 and FOUP 1822 is opened and wafer handling device 1808 removes wafer 1900 from FOUP 1822 and brings it into transfer chamber 1804. Robot 1808 then transfers the wafer into wet clean module 200 where it is horizontally positioned by wafer support 210 parallel to and over a horizontally positioned plate 202 having a plurality of megasonic transducers 204 formed on the backside of the plate. The wafer is positioned so that the wafer backside 1904 is parallel to and adjacent to and spaced-apart from megasonic plate 202. At this time, the backside of the wafer is cleaned of particles 1908 by flowing a fluid, such as DI water or a cleaning solution comprising, for example, ammonia/peroxide/water. The cleaning solution can include a chelating agent and/or sufactants. While the liquid is flowing between the backside of the wafer 1904 and plate 202, megasonic energy is applied by transducers 204 to produce sonic waves in a direction perpendicular to the backside of the wafer 1900. The wafer can be rotated by support 210 while cleaning the wafer. In one embodiment of the present invention, no fluid is provided onto the frontside 1902 of wafer 1900 while cleaning the backside so that a liquid film 222 (shown in FIG. 2A) is not formed on the wafer frontside. In this way, megasonic energy is not able to transfer into a fluid on the frontside and fragile device features 2006 formed on the wafer frontside are not damaged.

However, in an alternative embodiment of the present invention while cleaning the wafer backside, cleaning solution and/or DI water can be provided onto the wafer frontside 1902 to form a thin coat 222 (as shown in FIG. 2A) in order to clean the wafer frontside. Once the wafer backside has been sufficiently cleaned of particles 1908 as shown in FIG. 19B, the cleaning is stopped and the wafer spun dry.

Next, robot 1808 removes the cleaned wafer 1900 from wet clean module 200 and brings it into transfer chamber 1804 and then slides down track 1806 to bake station 1810 where it places wafer 1902 into bake station 1810. While in bake station 1810 wafer 1900 is heated to a temperature of approximately 200° C. in a nitrogen ambient and at a reducedpressure in order to remove all water vapor from wafer 1900 as shown in FIG. 19C. Bake station 1810 can include a horizontally positioned hot plate on which the backside 1904 of wafer 1900 is situated. Next, after wafer 1902 has been sufficiently baked to remove water residue, robot 1808 removes the baked wafer 1902 from bake station 1810 and brings it into transfer chamber 1804, slides down track 1806 to spin station 1812 and places wafer 1902 into spin station 1812. Spin station 1812 will typically include a rotatable plate on which the wafer is situated and the nozzle placed above for depositing a photoresist film thereon. Once in spin station 1812, a photoresist film 1910 is formed on the wafer frontside 1902 as shown in FIG. 19D. Photoresist material is an organic photo-sensitive material which is sensitive to radiation at a certain frequency. Typically today, photoresist films which are sensitive to deep UV (ultraviolet) light are utilized. Additionally, if desired, adhesion promoter, such as HMDS maybe deposited onto wafer frontside 1902 prior to applying photoresist film 1910.

Next, after sufficient amount of photoresist 1910 has been applied to the wafer frontside 1902, the wafer can optionally be placed into a second wet clean chamber 200B in order to remove particles 1908 which may have formed on the wafer backside during the wafer coating process. In such a case, the wafer 1900 having a photoresist film 1910 formed on the wafer frontside, is then held by wafer support 210 horizontally above and parallel to a plate 206 as shown in FIG. 2A.

The wafer backside 1904 is adjacent to the plate 202. A fluid is then transported between the plate 1902 and the wafer backside 1904 in order to remove particles 1908 which develop during the photoresist deposition process. The cleaning solution can include a chelating agent and/or sufactants. While the liquid is flowing between the backside of the wafer 1904 and plate 202, megasonic energy can be applied by transducers 204 to produce sonic waves in a direction perpendicular to the backside of the wafer 1900. The wafer can be rotated by support 210 while cleaning the backside. During the backside cleaning of the wafer with the photoresist materials 1910 on the frontside, no solution is provided through nozzle 214 to the wafer frontside 1902. That is, during the backside clean with a photoresist film on the frontside the frontside is kept completely dry. It is to be appreciated, that the photoresist film 1908 formed on the wafer frontside is not to be exposed to cleaning solutions or DI water during the wafer backside cleaning. In an embodiment of the present invention, clean air or an inert gas, such as $N_2$, can be blown onto the top surface of wafer 1900 while the backside 1904 is cleaned of particles to ensure that no backside cleaning solutions travel around the edges of the wafer and wet or attack photoresist film 1910 on the wafer frontside 1902. After all of the particles 1912 have been removed from the wafer backside 1904 as shown in FIG. 19E, this optional cleaning step can be stopped. Next, the robot 1808 removes wafer 1900 from wet clean station 1900B and brings it into transfer chamber 1804. Robot 1808 then moves down track 1806 to soft bake station 1814 and places wafer 1900 with photoresist film 1910 into the soft bake station. (If backside cleaning with photoresist film 1910 is not to be used, then the wafer would be directly brought from the spin station into the soft bake station 1814.) Once in soft bake station 1814 wafer 1900 is heated to remove some of the solvents contained within photoresist film 1910 as shown in FIG. 19F.

After the wafer 1900 has been sufficiently soft baked in soft bake station 1814, wafer 1900 is removed from soft bake station 1814 by robot 1808 and robot 1808 travels down track 1806 to exposure station 1816 and places wafer 1900 in exposure station 1816. In exposure station 1816 the photoresist film 1910 is exposed to radiation, such as DUV radiation from a light source 1914 which shines through a mask 1916 having a pattern formed therein as shown in FIG. 19G. The mask 1916 blocks light from exposing some portions of photoresist film 1910 and allows light to expose other portions 1920 of photoresist mask 1910. The light radiation alters the chemical structure of the photoresist film to form light exposed regions 1920 which can be selectively developed away with developer from photoresist film 1910 which has not been exposed to light (1918). In this way, a photoresist mask can be formed on substrate 1900. An excellent exposure can take place because backside particles have been removed which could otherwise cause the image to be out of focus. Once sufficiently exposed, the robot 1808 removes exposed wafer 1900 from exposure station 1816 and places it in FOUP 1824.

Figure 18C:
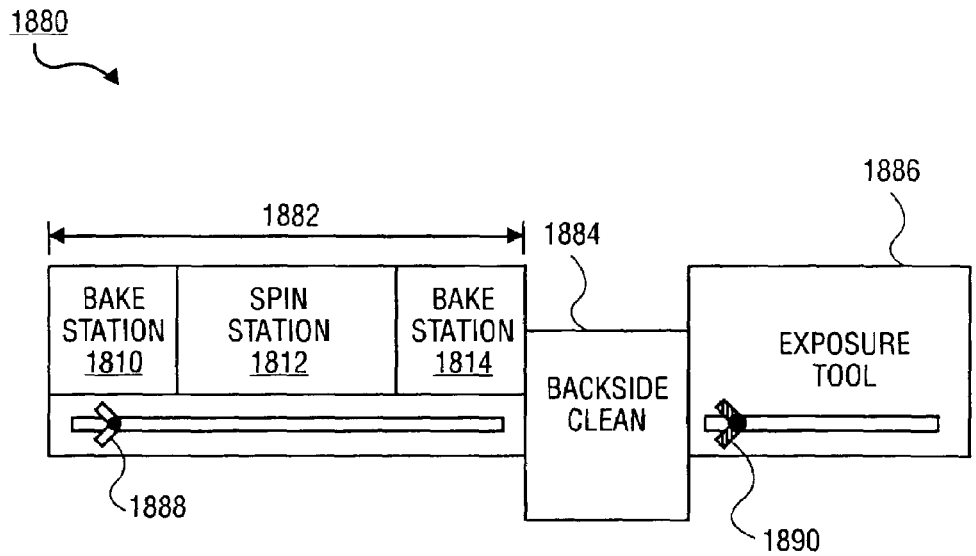
FIG. 18C is an overhead illustration of a photolithographic process in accordance with an embodiment of the present invention.

Shown in FIG. 18C is a photolithography processing apparatus in accordance with an embodiment of the present invention. Photolithography processing apparatus 1880 includes a photoresist application tool 1882, a single wafer backside cleaning tool 1884 and an exposure tool 1886. Single wafer backside cleaning tool 1884 is coupled between photoresist application tool 1882 and exposure tool 1886. Single wafer backside cleaning tool 1884 can be said to be a buffer station in that it is directly coupled between photoresist application tool 1882 and exposure tool 1886.

That is backside cleaning tool 1884 is directly coupled, by for example bolts, to the output of photoresist application tool 1882 and is directly coupled, by for example bolts, to the input of exposure tool 1886. In an embodiment photoresist application tool 1882, backside clean tool 1884, and exposure tool 1886 each have their own computer/controller for separately controlling each of their operations.

The function of photoresist application tool 1882 is to form a photoresist film (to subsequently be imaged) onto a wafer. Photoresist application tool 1882 can be any well-known photoresist application tool or track and in an embodiment it includes all stations necessary for preparing a photoresist film for exposure in exposure tool 1886 In an embodiment of the present invention, photoresist application tool 1882 includes a bake station 1810, a spin station 1812 and a soft bake station 1814 as described above. Photoresist application tool 1882 has a wafer handling robot 1888 for transferring wafers between the various stations (e.g., between bake station 1810, spin station 1812, and soft bake station 1814) of photoresist application tool 1882. A wafer handling robot 1888 can be included within the photoresist application tool 1882 or can be included in a separate transfer chamber which can access each of the individual stations of the photoresist application tool 1882. In an embodiment of the present invention, the wafer handler 1888 is a single wafer handling robot on a single linear track. In an embodiment of the present invention, robot 1888 can take a wafer from photoresist application module 1882 and insert it directly into backside cleaning tool 1884.

Backside cleaning tool 1884 can be any suitable apparatus which can clean and remove particles from the backside of a wafer without exposing the frontside of the wafer, on which a photoresist film is formed, to cleaning or wetting solutions. In an embodiment of the present invention, the backside cleaning tool 1884 can be a single wafer wet clean module, such as module 200, shown in FIG. 2A-2C. Other types of cleaning apparatuses, however, can be used as long as they can clean the backside of the wafer without affecting the frontside and a photoresist film formed thereon. For example, backside cleaning tool can include a wafer support for holding or rotating a wafer above a rotatible brush which is used for dislodged particles from the wafer backside. In another embodiment of the present invention, the backside cleaning tool can include an air knife which utilizes air flow to create an air shear to remove particles from the wafer backside while the wafer is rotated.

Exposure tool 1886 can be any well-known exposure tool, such as a stepper, where photoresist material is exposed to radiation, such as deep ultraviolet (DUV) radiation or extreme ultraviolet (EUV) radiation through a mask used to define a pattern within the photoresist film. Exposure tool 1886 contains a wafer handling device 1890, such as a robot, which is able to receive a wafer from backside cleaning tool 1884 and position the wafer within exposure tool 1886. Robot 1890 can also remove the wafers from exposure tool 1886.

Figure 19A:
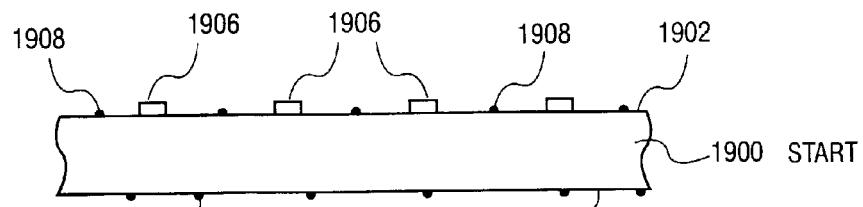
FIG. 19-A-19G illustrates a method of cleaning a wafer, forming a photoresist film on the wafer and exposing the photoresist film in accordance with an embodiment of the present invention.
Figure 19B:
Figure 19C:
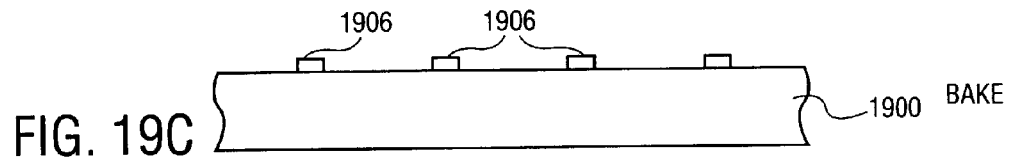
Figure 19D:
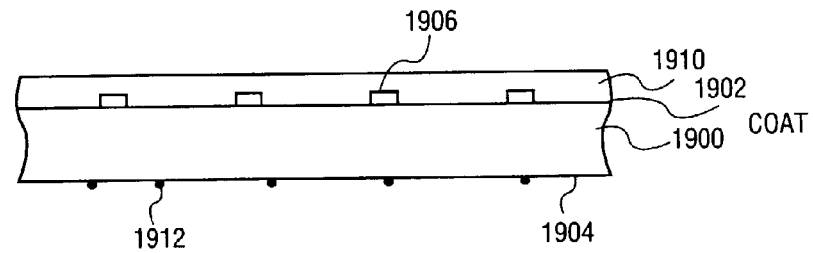
Figure 19E:
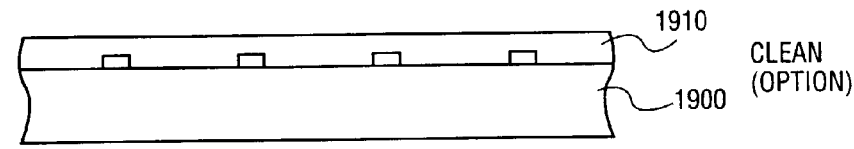
Figure 19F:
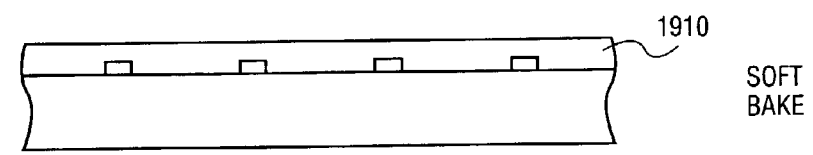
Figure 19G:
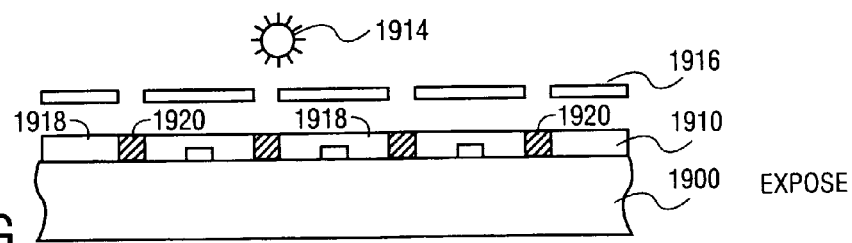

In a method of use of apparatus 1880, a wafer, such as wafer 1900 as shown in FIG. 19A is placed into photoresist application tool 1882 where a photoresist film 1910 is formed on the wafer frontside 1902. Ideally, wafer 1900 has been sufficiently cleaned prior to placing into photoresist application tool 1882. Photoresist film 1910 can be formed by any well-known technique or series of steps, such as illustrated above. In an embodiment of the present invention, photoresist film 1900 is formed utilizing a pre-bake step such as set forth in FIG. 19C and accompanying description, a photoresist spin step such as set forth in FIG. 19D and accompanying description, and a soft bake step as set forth in FIG. 19F and accompanying description. Robot 1888 moves a wafer 1900 between the various stations of the photoresist application tool 1882.

Once a suitable photoresist film 1910 has been formed on the frontside 1902 of wafer 1900, robot 1888 transfers wafer 1900 from the photoresist application tool 1882 to the backside clean module 1884 where the backside 1904 of wafer 1900 is cleaned of particles. In an embodiment of the present invention, the backside clean occurs after the photoresist film 1910 has been formed and after all necessary processes have occured which are necessary prior to the exposure of the photoresist 1910. In an embodiment of the present invention, the backside clean occurs directly after a soft bake step such as shown in FIG. 19F. In an embodiment of the present invention, the backside cleaning occurs directly before or immediately before placement in exposure tool 1886 and exposure therein. In an embodiment of the present invention, the backside cleaning occurs in a single wafer wet cleaning module 200 shown in FIG. 2A-2C. In such a case, the wafer 1900 having a photoresist film 1910 formed on the wafer frontside 1902 is then held by wafer support 210 horizontally above and parallel to plate 202 as shown in FIG. 2A. Wafer backside 1904 is adjacent to plate 202. A fluid such as DI water or a cleaning solution comprising, for example ammonia/peroxide/water, is then transported between plate 202 and wafer backside 1904 in order to remove particles 1908 which develop during the photoresist formation process. The cleaning solution can include a chelating agent and/or surfactants. While the liquid is flowing between the backside of the wafer 1904 and plate 202, megasonic energy is applied by transducers 204 to produce sonic waves in a direction perpendicular to the backside of the wafer 1900. The wafer can be rotated by support 210 while cleaning the backside. During backside cleaning of the wafer with photoresist materials 1910 on the frontside, no solution is provided through nozzle 214 to the wafer frontside 1902. That is, during the backside clean the photoresist film on the frontside is kept completely dry. It is to be appreciated that the photoresist film 1910 formed on the wafer frontside is not to be exposed to cleaning solution or DI water during the wafer backside cleaning. In an embodiment of the present invention clean air or an inert gas, such as $N_2$, can be blown onto a top surface of wafer 1900 while the backside 1904 is cleaned to insure that no backside cleaning solution travels around the edges of the wafer and wets or attacks the photoresist film 1910 on the wafer frontside 1902. The inert gas can be blown onto the wafer frontside through nozzle 214 or a separate nozzle can be provided.

After the backside of wafer 1900 has been sufficiently cleaned, the wafer 1900 is removed from the backside cleaning chamber 1884 by robot 1890 and is placed into exposure tool 1886. In exposure tool 1886, the photoresist film 1910 is exposed to radiation, such as DUV radiation from a light source 1940 which shines through a mask 1916 having a pattern formed therein as shown in FIG. 19G. The light radiation alters the chemical structure of the photoresist film to form light exposed regions 1920 which can be selectively developed away with a developer from photoresist film 1910 which has not been exposed to light (1918). A high quality exposure can take place because backside particles have been removed which could otherwise cause the image to be out of focus. Thus, a high quality photolithography processing apparatus and method have been described.

Figure 18D:
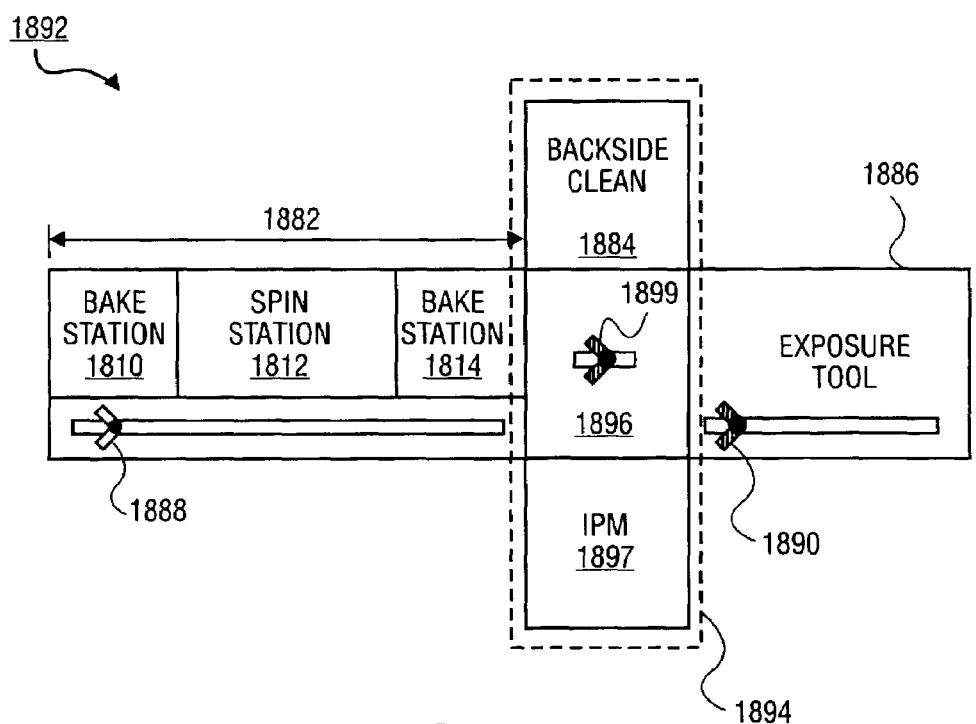
FIG. 18D is an overhead illustration of a photolithographic apparatus in accordance with an embodiment of the present invention.

FIG. 18D illustrates another embodiment of a photolithography processing apparatus. Photolithography processing apparatus 1892 includes a photoresist application tool or track 1882 as described above, a buffer station 1894 and an exposure tool 1886 as described above. Buffer station 1894 is located between photoresist application tool 1882 and exposure tool 1886. Buffer station 1894 includes a transfer chamber 1896 which has one side directly coupled to the output of a photoresist application tool 1886 and a second side which is directly coupled to the input of exposure tool 1886. Buffer station 1894 also includes a backside cleaning tool 1884, as described above, which is directly coupled to transfer chamber 1896 on a third side. In an embodiment of the present invention, buffer tool 1894 includes a backside integrated particle monitoring tool 1894 for inspecting the wafer backside for particles. In an embodiment of the present invention, backside integrated particle monitoring tool can include a light emitter for shining light onto the backside of the wafer and collectors or detectors for collecting the light scattered from the wafer backside to inspect the wafer backside for particles. An example of suitable backside particle monitoring tool is IPM tool 300 shown in FIG. 3. IMP Tool 300, however, would be configured to scan the wafer backside as opposed to the frontside as shown in FIG. 3. Transfer chamber 1896 has a wafer handling robot 1899 contained therein for handling a single wafer. Wafer handling robot 1899 can receive a wafer from robot 1888, of photoresist application tool 1882 and robot 1899 can provide a wafer to robot 1890 of exposure tool 1886. Additionally, robot 1899 can transfer a wafer into backside cleaning tool 1884 and into backside particle monitoring tool 1897, if used.

In a method of use, of photolithography apparatus 1892 shown in FIG. 18D, a wafer is placed into photoresist application tool 1882 where it travels down the track and enters the various process stations used to form a photoresist film on the wafer and to prepare the photoresist film for exposure in tool 1886. Once a suitable photoresist film has been formed on the wafer frontside, the wafer is transferred by robot 1888 to robot 1899 where it is brought into transfer chamber 1896. In an embodiment of the present invention, robot 1899 transfers the wafer into backside cleaning tool 1884 where the wafer backside is cleaned of particles as discussed above. After a sufficient backside cleaning, the wafer is removed from backside cleaning chamber 1884 by robot 1899 and brought back into transfer chamber 1896. In an embodiment of the present invention, where a backside particle monitoring tool 1897 is provided, after backside cleaning the wafer, the wafer can be transferred by robot 1899 into backside integrated particle monitoring tool 1897 where its backside is inspected for particles. If the backside is suitably clean, the wafer can be removed by robot 1899 from backside particle monitoring tool 1897 and brought into transfer chamber 1896. Robot 1899 then transfers the wafer to the robot 1890 of exposure tool 1886 which positions the wafer for exposure as described above. In an embodiment of the present invention, if the backside particle monitoring tool determines that the backside is not sufficiently cleaned, the wafer can be transferred back into backside cleaning module 1884 for additional backside cleaning. After additional backside cleaning, the wafer can be transferred back into backside particle monitoring tool 1897 and reinspected for particles.

In yet another embodiment of the present invention, after the photoresist film has been formed and prepared in photoresist application tool 1882, the wafer can be first transferred into backside inspection tool 1894 to inspect for particles and then the wafer transferred into backside cleaning tool 1884. In this way, information regarding the backside particles can be used to determine the type and amount of backside cleaning in backside cleaning chamber 1884. After a sufficient backside cleaning in backside cleaning apparatus 1884 the wafer can be transferred back into backside particle monitoring tool 1897 and the wafer reinspected prior to transferring the wafer into exposure tool 1886. Thus, a high quality photolithographic processing apparatus has been described as well as its method of operation.

Computer/Controller

Figure 20A:
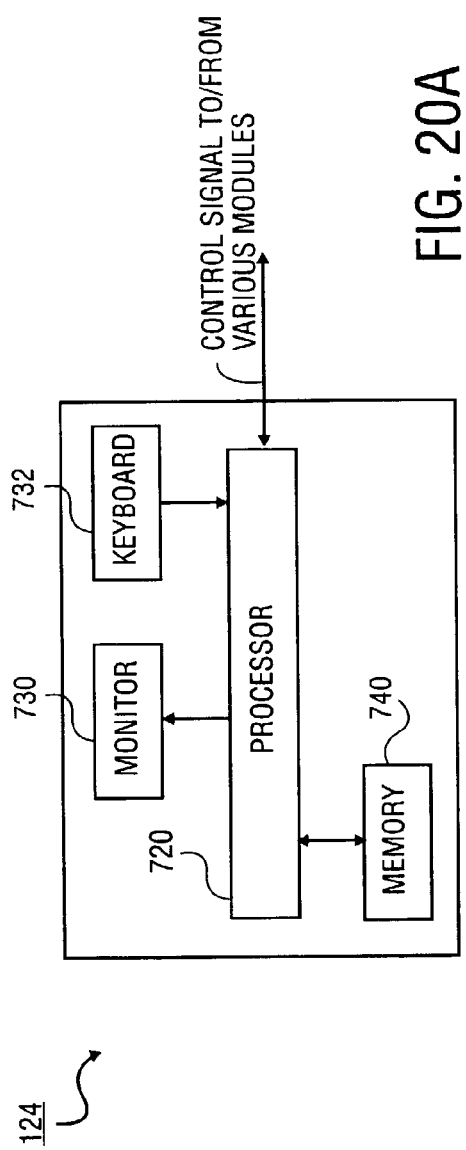
FIG. 20A is an illustration of a computer/controller which can be used in the tools of the present invention.

FIG. 20A illustrates a computer/controller 124 which can be used to control the movement and processing of a wafer in a tool, such as tool 100, 600, 1200 and 1800 in accordance with the present invention. Computer/controller 124 includes a memory 740, such as a hard drive or other type of memory, a processor 720 and an input/output device, such as a CRT Monitor 730 and a keyboard 732. The input/output device is used to interface between a user and computer/controller 124. Processor 720 executes a system control software program stored in computer readable medium, such as memory 740. Processor 720 executes the system control software and provides and receives control signals for the tool which controls the transfer of wafers through the tool and which provides the specific control signals necessary to achieve the specific processing parameters for each of the modules coupled to the tool, such as process temperature, process gas/fluid flows and process pressure, etc.

The process for processing a wafer in accordance with the embodiment of the present invention can be implemented using a computer program product which is stored in memory 740 and is executed by processor 720. The computer program code can be written in any conventional computer readable program language, such as 68000 Assembly Language, C, C++, Pascal, Fortran, or others. Suitable program code is entered into a single file or multiple files using conventional text editor and stored or embodied in a computer usable medium, such as a memory system of the computer. If the entered code text is in the high level language, a code is compiled and the resultant compiler code is then linked with an object code of precompiled windows library routines. To execute the link compiled object code, the system user invokes the object code causing the computer system to load the code in memory from which the processor reads and executes the code to perform the task identified in the program. Also stored in memory 740 are process parameters, such as process gas/fluid flow rates and composition, temperatures, pressures, and times necessary to carry out the deposition of films, the etching of films, the wet cleaning of wafers, the ashing of wafers, as well as the monitoring and recording of metrology of the wafer, such as film thickness uniformity and defects.

Figure 20B:
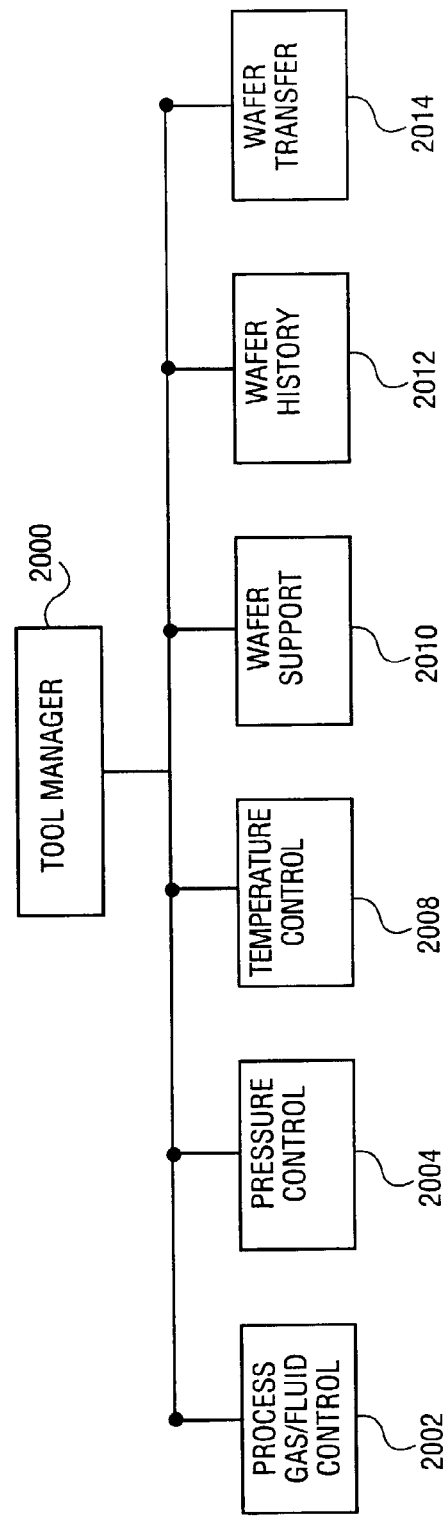
FIG. 20B is an illustration of a software program which can be used to control the tools of the present invention.

FIG. 20B illustrates an example of the hierarchy of the system control computer program stored in memory 740. The system control program includes a tool manager subroutine 2000. The tool manager subroutine 2000 also controls the execution of various chamber component subroutines which control the operation of the chamber components necessary to carry out the selected process set in the various chambers or modules of the tool. Examples of chamber component subroutines are process gas/fluid control subroutine 2002, pressure control subroutine 2004, temperature control subroutine 2008, and a wafer support subroutine 2010. Additionally, the tool manager subroutine includes a wafer history subroutine 2012 and a wafer transfer subroutine 2014. Those having ordinary skill in the art would readily recognize that other chamber control subroutines can be included depending on what processes are desired to be performed in the tool and process modules. In operation, the tool manager subroutine 2000 selectively schedules or calls a process component subroutines in accordance with the particular process set being executed. Typically, the tool manager subroutine 2000 includes steps of monitoring the various chamber components, determining which components need to be operated based on the process parameters of the process set to be executed and causing execution of a chamber component subroutine responsive to the monitoring and determining step.

The process gas/fluid control subroutine 2002 has a program code for controlling the reactive gas/fluid composition and flow rates. The process gas/fluid control subroutine 2002 controls the open/close position of the safety shut off valves, and also ramps up and down the mass flow controllers to obtain the desired gas/fluid flow rates. The process gas/fluid control subroutine 2002 is invoked by the tool manager subroutine 2000 as are all chamber component subroutines and receives from the tool manager subroutine process parameters related to the desired gas/fluid flow rates. Typically, the process gas/fluid control subroutine 2002 operates by opening the gas supply lines and repeatedly (i) reading the necessary mass flow controllers, (ii) comparing the readings to the desired flow rates received from the tool manager subroutine 2000 and (iii) adjusting the flow rates of the gas/fluid supply lines as necessary. Furthermore, the process gas/fluid control subroutines 2002 includes steps for monitoring the gas/fluid flow rates for unsafe rates, activating safety shut off valves when unsafe conditions is detected.

The process control subroutine 2004 comprises program code for controlling the pressure in the chamber of the various modules, as well as the pressure within the sub-atmospheric transfer chamber and load locks by regulating the size of the opening of the throttle valves which are set to control the chamber pressure to the desired level in relation to the total process gas flow, size of the process chamber, and pumping set point pressure for the exhaust system. When the pressure controls subroutine 2004 operates to measure the pressure in a chamber by reading one or more conventional pressure manometers connected to the chamber, compared to measure values to the target pressure and adjust the throttle valve according to the PID values obtained from the pressure table. Alternatively, the pressure control subroutine 2004 can be written to open or close the throttle valve to a particular opening size to regulate the chamber to a desired pressure.

The temperature control subroutine 2008 comprises program code for controlling the power provided to heaters or lamps which are used to heat the substrate or wafer. The temperature control subroutine 2008 is also invoked by the chamber manager subroutine 2000 and receives a target or set point temperature parameter. The temperature control subroutine 2008 measures the temperature by measuring voltage output of a temperature measurement device directed at the susceptor or wafer and compares the measured temperature to the set point temperature, and increases or decreases power applied to the heater or lamps to obtain the set point temperature.

The wafer support subroutine 2010 has a program code for controlling the positioning and rotation rates of a wafer support members, such as susceptors, during the processing of wafers and during the loading and unloading of wafers into the module or chamber. The wafer support subroutine controls the motors which control the height position of the wafer support and the motors which control the rotation rates of the wafer support.

The wafer history subroutine 2012 has program code for storing and retrieving as well as analyzing the process history of a wafer in the tool. Wafer history subroutine 2012 store data detailing the processes that have occurred to a wafer processing in the tool as well as metrology information on each wafer, such as film thickness and uniformity maps as well as defect maps.

The wafer transfer subroutine 2014 comprises program code for controlling the transfer of a wafer throughout the tool. Wafer transfer subroutine 2014 determines which chamber or modules of the tool a wafer is to be processed in as well as the order of the processing. Wafer transfer subroutine 2014 can utilize information from the wafer history subroutine to determine which processes a wafer is to experience. For example, after a metrology scan to determine the number or type of particles on a wafer, the wafer transfer subroutine can be invoked to determine whether or not the wafer should be further wet cleaned or ashed or be sent to the next module in the process. The wafer subroutine can utilize wafer metrology information to determine the subsequent processing of the wafer.

Thus, novel atmospheric/sub-atmospheric process tools and their methods of use have been described.

We claim:

1. An apparatus for atmospheric and sub-atmospheric processing of a wafer comprising:
    an atmospheric transfer chamber having first a wafer handler contained therein;
    a sub-atmospheric transfer chamber having a second wafer handler contained therein;
    a first load lock coupled to said sub-atmospheric transfer chamber and to said atmospheric transfer chamber;
    a first sub-atmospheric processing module coupled to said sub-atmospheric transfer chamber;
    a wet cleaning module coupled to said atmospheric transfer chamber; and
    an integrated particle monitoring tool coupled to said atmospheric transfer chamber; and
    a controller for controlling the operation of said integrated particle monitoring tool and the operation of said wet cleaning module wherein said controller includes stored information for controlling the clean of a subsequent wafer in said wet cleaning module based upon results taken in said integrated particle monitoring tool of a wafer previously cleaned in said wet cleaning module.

2. The apparatus of claim 1 wherein further comprising an ashing module coupled to said atmospheric transfer.

3. The apparatus of claim 1 wherein said first sub-atmospheric chamber is selected from the group consisting of:
    an etch module, a CVD deposition module, an ashing module, a sputter module, an oxidation module, and an anneal module.

4. The apparatus of claim 1 further comprising a second load lock coupled between said atmospheric transfer chamber and said sub-atmospheric transfer chamber.

5. The apparatus of claim 1 wherein said first and said second load locks are single wafer load locks.

6. The apparatus of claim 1 further comprising, a wafer cassette coupled to said atmospheric transfer chamber for providing wafers to be loaded into said atmospheric transfer chamber.

7. An apparatus for etching and cleaning a wafer comprising:
- an atmospheric transfer chamber having a first wafer handler contained therein;
- a sub-atmospheric transfer chamber having a second wafer handler contained therein;
- a first load lock coupled to said sub-atmospheric transfer chamber and to said atmospheric transfer chamber;
- a single wafer wet cleaning module directly coupled to said atmospheric transfer chamber;
- an etch module couple to said sub-atmospheric transfer chamber; and
- a critical dimension (CD) measurement tool coupled to said atmospheric transfer chamber.

8. The apparatus of claim 7 further comprising an integrated particle monitoring tool coupled to said atmospheric transfer chamber.

9. The apparatus of claim 8 further comprising a controller for controlling said wet cleaning module wherein said controller includes stored instructions for determining the operation of said wet cleaning module for a subsequent wafer depending upon results in said integrated particle monitoring tool of a wafer previously cleaned in said single wafer wet cleaning module.

10. The apparatus of claim 7 further comprising an ashing module coupled to said atmospheric transfer chamber.

11. The apparatus of claim 10 further comprising a second ashing module coupled to said sub-atmospheric transfer chamber.

12. The apparatus of claim 10 further comprising a controller for controlling the operation of said critical dimension monitoring tool and for controlling the operation of said etch module and wherein said computer includes stored information for controlling the operation of said etch module depending upon measurement taken by said critical dimension monitoring tool.

13. The apparatus of claim 7 further comprising a second etch module coupled to said sub-atmospheric transfer chamber.

14. An apparatus for the formation of an electrode comprising:
- an atmospheric transfer chamber having a first wafer handler contained therein;
- a sub-atmospheric transfer chamber having a second wafer handler contained therein;
- a first load lock coupled to said sub-atmospheric transfer chamber and to said atmospheric transfer chamber;
- a wet cleaning module coupled to said atmospheric transfer chamber;
- an integrated thickness measurement tool coupled to said atmospheric transfer chamber;
- a deposition module coupled to said sub-atmospheric transfer chamber; and
- an controller for controlling the operation of said deposition module and said integrated thickness measurement tool wherein said controller stores information for determining process parameters for deposition of a film onto a subsequent wafer in said deposition chamber based upon results taken in said integrated thickness measurement tool of a wafer having a film previously deposited in said deposition chamber.

15. The apparatus of claim 14 further comprising an integrated particle monitoring tool coupled to said atmospheric transfer chamber.

16. The method of claim 15 further comprising an integrated thickness measurement tool coupled to said atmospheric transfer chamber.

17. The apparatus of claim 15 wherein said controller controls the operation of said integrated particle monitoring tool and said wet cleaning module and wherein said controller includes information for controlling the cleaning of a subsequent wafer in said wet clean module based upon results taken in said integrated particle monitoring tool of a wafer previously cleaned in said wet cleaning module.

18. The apparatus of claim 14 further comprising an integrated thickness measurement tool couple to said atmospheric transfer chamber.

19. The apparatus of claim 18 further comprising a single wafer thermal process module coupled to said sub-atmospheric transfer chamber.

20. The apparatus of claim 14 further comprising a second single wafer thermal process tool coupled to said sub-atmospheric transfer chamber.

21. The apparatus of claim 14 further comprising a second load lock coupled to said atmospheric transfer chamber and to said sub-atmospheric transfer chamber.

22. An apparatus for the photolithography processing of a wafer comprising:
- a single wafer wet cleaning module;
- a photolithography module; and
- a transfer chamber having a wafer handling device contained therein, said wafer transfer chamber directly coupled to said single wafer wet cleaning module and to said photolithography module.

23. The apparatus of claim 22 wherein said single wet cleaning module comprises:
- a plate having an acoustic energy generating device coupled to a first side;
- means for positioning a wafer horizontally above a second side of said plate opposite said first side; and
- means for applying a cleaning solution onto said plate second side.

24. The apparatus of claim 23 wherein said means for providing fluid to said plate second side comprises an aperture formed through said plate and a conduit coupled to said aperture for providing said cleaning solution through said aperture to said plate second side.

25. The apparatus of claim 22 wherein said photolithography module comprises:
- a photoresist application station for applying a photoresist film on a wafer;
- a soft bake station for heating said photoresist film; and
- a exposure station for exposing said photoresist to radiation.

26. The apparatus of claim 25 wherein said wafer handling device is connected to a linear track in said transfer chamber and wherein said wafer handling device can access said wet clean module, said spin station, said soft bake station, and said exposure station.

27. The method of claim 26 wherein said single wafer cleaning module is adjacent to said spin station, wherein said spin station is adjacent to said soft bake station, wherein said soft bake station is adjacent to said stepper station.

28. The apparatus of claim 26 wherein said single wafer clean module is adjacent to said spin station on a first side and is adjacent to said soft bake station on a second side opposite said first side.

29. The apparatus of claim 26 wherein said single wafer clean module is adjacent to said soft bake station on a first side and is adjacent to said exposure station on said second side opposite said first side.

30. The apparatus of claim 25 wherein said transfer chamber includes a filter for filtering amine and ammonia vapors from the ambient in said transfer chamber.

31. A photoresist processing apparatus comprising:
a photoresist application tool for forming a photoresist film on a wafer frontside opposite a wafer backside;
a backside cleaning tool for cleaning the backside of a wafer while said photoresist film is on said wafer front side, wherein said backside cleaning tool is coupled directly to said photoresist application tool; and
an exposure tool for exposing a photoresist film formed on a frontside of a wafer to radiation after cleaning the backside of said wafer, wherein said exposure tool is directly coupled to said backside cleaning tool.

32. The photolithography processing apparatus of claim 31 further comprising a first wafer handling robot for moving a wafer between stations of said photoresist application tool and for transferring a wafer from said photoresist application tool to said backside cleaning tool.

33. The photolithography processing apparatus of claim 32 further comprising a second wafer handling robot located in said exposure tool for transferring a wafer from said backside cleaning tool into said exposure tool.

34. The photolithography processing apparatus of claim 31 wherein said photoresist application tool includes a bake station to remove a water vapor from a wafer, and a spin station for forming a photoresist film on a wafer, and a soft bake station for removing solvents from a photoresist film formed on a wafer.

35. An apparatus for processing a wafer comprising:
a single wafer backside cleaning tool;
a photoresist application tool;
an exposure tool for exposing a photoresist film formed on a frontside of a wafer to radiation; and
a transfer chamber having a wafer handling device contained therein, said wafer transfer chamber directly coupled to said photoresist application tool, said transfer chamber directly coupled to said exposure tool, and said transfer chamber directly coupled to said single wafer backside cleaning tool.

36. The apparatus of claim 35 further comprising a backside particle monitoring tool for inspecting the backside of a wafer for particles, wherein said backside particle monitoring tool is directly coupled to said transfer chamber.

37. The apparatus of claim 35 wherein said single wafer backside cleaning tool comprises a plate having acoustic energy generating devices coupled to a first side;
means for positioning the wafer horizontally above a second side of said plate opposite said first side; and
means for applying a cleaning solution onto said plate second side.

38. The apparatus of claim 35 wherein said single wafer backside cleaning tool comprises a brush for removing particles from the backside of a wafer.

39. The apparatus of claim 35 wherein said single wafer backside cleaning tool comprises an air knife for providing an air flow to create an air shear to remove particles from a wafer backside.

40. A single wafer wet/dry cleaning apparatus comprising:
a transfer chamber having a wafer handler contained therein;
a first single wafer wet cleaning module directly coupled to said wafer transfer chamber;
a first single wafer ashing module directly coupled to said transfer chamber;
a integrated particle monitoring tool coupled to said transfer chamber; and
a controller for controlling the operation of said integrated particle monitoring tool and said wet cleaning module wherein said controller includes information on how to clean a subsequent wafer in said wet cleaning module based upon results taken in said integrated particle monitoring tool of a wafer previously cleaned in said wet clean module.

41. The apparatus of claim 35 further comprising a second single wet wafer wet cleaning module directly coupled to said transfer chamber; and
a second single wafer ashing module directly coupled to said transfer chamber.

* * * * *